US010205457B1

United States Patent
Josefsberg et al.

(10) Patent No.: US 10,205,457 B1
(45) Date of Patent: Feb. 12, 2019

(54) RADAR TARGET DETECTION SYSTEM FOR AUTONOMOUS VEHICLES WITH ULTRA LOWPHASE NOISE FREQUENCY SYNTHESIZER

(71) Applicants: Yekutiel Josefsberg, Netanya (IL); Tal Lavian, Sunnyvale, CA (US)

(72) Inventors: Yekutiel Josefsberg, Netanya (IL); Tal Lavian, Sunnyvale, CA (US)

(73) Assignees: Yekutiel Josefsberg, Netanya (IL); Tal Lavian, Sunnyvale, CA (US)

( * ) Notice: Subject to any disclaimer, the term of this patent is extended or adjusted under 35 U.S.C. 154(b) by 0 days.

(21) Appl. No.: 15/995,557

(22) Filed: Jun. 1, 2018

(51) Int. Cl.
  *G01S 7/02* (2006.01)
  *G01S 13/93* (2006.01)
  *H03L 7/085* (2006.01)
  *H03L 7/185* (2006.01)

(52) U.S. Cl.
  CPC ............ *H03L 7/085* (2013.01); *G01S 7/023* (2013.01); *G01S 13/931* (2013.01); *H03L 7/185* (2013.01)

(58) Field of Classification Search
  CPC ..... H03L 7/00; H03L 7/06; H03L 7/07; H03L 7/08; H03L 7/083; H03L 7/085; H03L 7/087; H03L 7/091; H03L 7/185; G01S 7/023; G01S 13/931
  See application file for complete search history.

(56) References Cited

U.S. PATENT DOCUMENTS

| | | | | |
|---|---|---|---|---|
| 5,146,186 A | * | 9/1992 | Vella | H03L 7/185 331/11 |
| 5,150,078 A | * | 9/1992 | Yang | H03L 7/185 331/2 |
| 5,343,168 A | * | 8/1994 | Guthrie | H03L 7/185 331/16 |
| 6,085,151 A | | 7/2000 | Farmer et al. | |
| 6,122,326 A | | 9/2000 | Jackson et al. | |
| 6,239,660 B1 | * | 5/2001 | Dekker | H03L 7/18 331/18 |
| 6,366,620 B1 | | 4/2002 | Jackson et al. | |
| 6,657,464 B1 | | 12/2003 | Balardeta et al. | |
| 7,102,446 B1 | | 9/2006 | Lee et al. | |
| 7,391,839 B2 | | 6/2008 | Thompson | |
| 7,545,224 B2 | | 6/2009 | Chow et al. | |
| 7,656,236 B2 | | 2/2010 | Williams | |
| 7,737,880 B2 | * | 6/2010 | Vacanti | G01S 7/023 342/100 |

(Continued)

*Primary Examiner* — Peter M Bythrow

(57) ABSTRACT

A target detection and imaging system, comprising a RADAR unit and at least one ultra-low phase-noise frequency synthesizer, is provided. RADAR unit configured for detecting the presence and characteristics of one or more objects in various directions. The RADAR unit may include a transmitter for transmitting at least one radio signal, and a receiver for receiving the at least one radio signal returned from the one or more objects. signals. The ultra-low phase-noise frequency synthesizer may utilize dual loop design comprising one main PLL and one sampling PLL, where the main PLL might include a DDS or Fractional-N PLL plus a variable divider, or the synthesizer may utilize a sampling PLL only, to reduce phase-noise from the returned radio signal. This system helps in detecting and classifying human beings present on the road clearly and in time so as to provide a corrective input to the autonomous vehicle timely.

20 Claims, 22 Drawing Sheets

(56) References Cited

U.S. PATENT DOCUMENTS

| | | | |
|---|---|---|---|
| 8,049,656 B2 | 11/2011 | Shani et al. | |
| 8,378,751 B2 | 2/2013 | Fagg | |
| 8,704,562 B2 | 4/2014 | Nicholls et al. | |
| 9,470,784 B2 | 10/2016 | Kishigami et al. | |
| 9,689,983 B2 | 6/2017 | Cao et al. | |
| 9,816,777 B2 | 11/2017 | Wilkinson | |
| 9,893,734 B1* | 2/2018 | Chillara | H03L 7/22 |
| 2003/0063701 A1* | 4/2003 | Eubanks | H03L 7/07 375/376 |
| 2005/0104666 A1* | 5/2005 | Rebel | H03L 7/07 331/2 |
| 2006/0220750 A1* | 10/2006 | Akamine | H03C 3/0933 331/16 |
| 2006/0267640 A1* | 11/2006 | Travis | G06F 1/025 327/105 |
| 2009/0309665 A1* | 12/2009 | Chenakin | H03L 7/16 331/25 |
| 2012/0242538 A1* | 9/2012 | Hasch | G01S 7/354 342/194 |
| 2013/0342277 A1* | 12/2013 | Roth | H03L 7/185 331/18 |
| 2014/0266345 A1* | 9/2014 | Matsumura | G01S 7/4056 327/158 |
| 2015/0303929 A1* | 10/2015 | Hamdane | H03L 7/085 327/105 |
| 2015/0372682 A1* | 12/2015 | Alexeyev | H03L 7/085 327/156 |
| 2016/0191232 A1* | 6/2016 | Subburaj | G01S 7/03 342/195 |

* cited by examiner

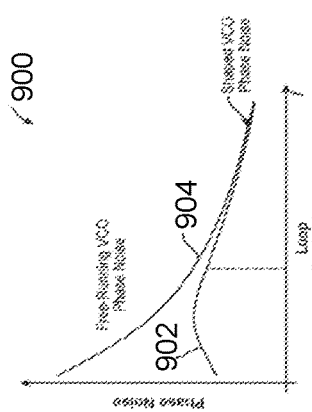
FIG. 9
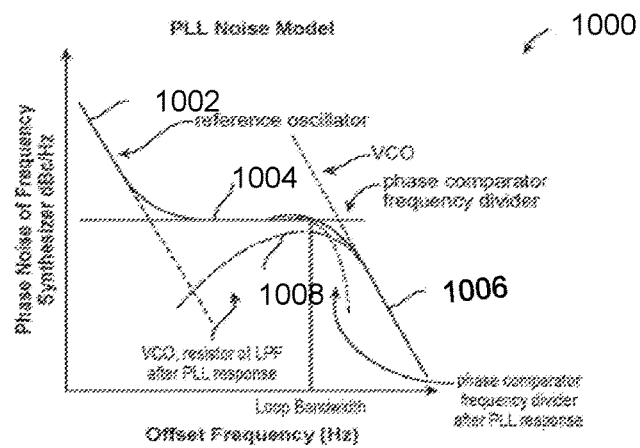
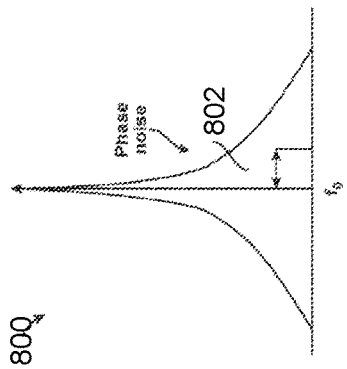
FIG. 8
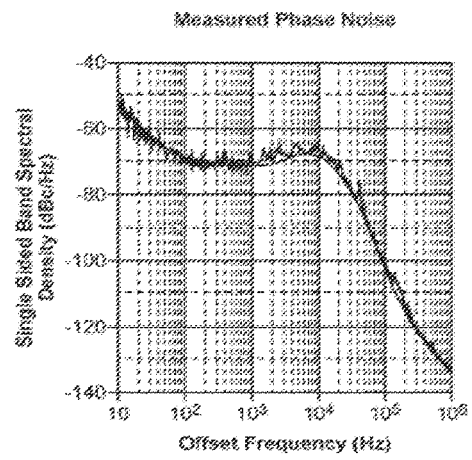
FIG. 10

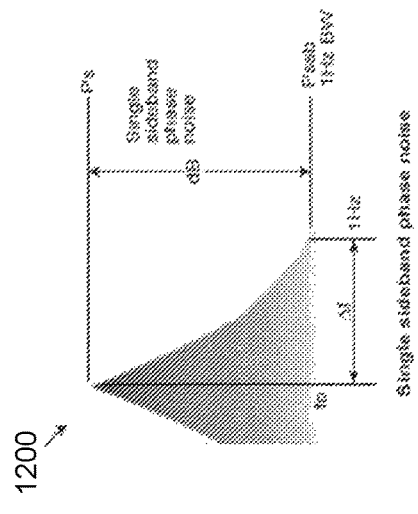
FIG. 12
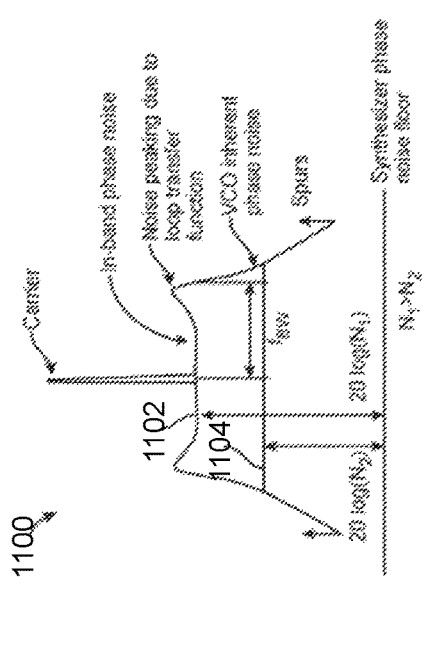
FIG. 11
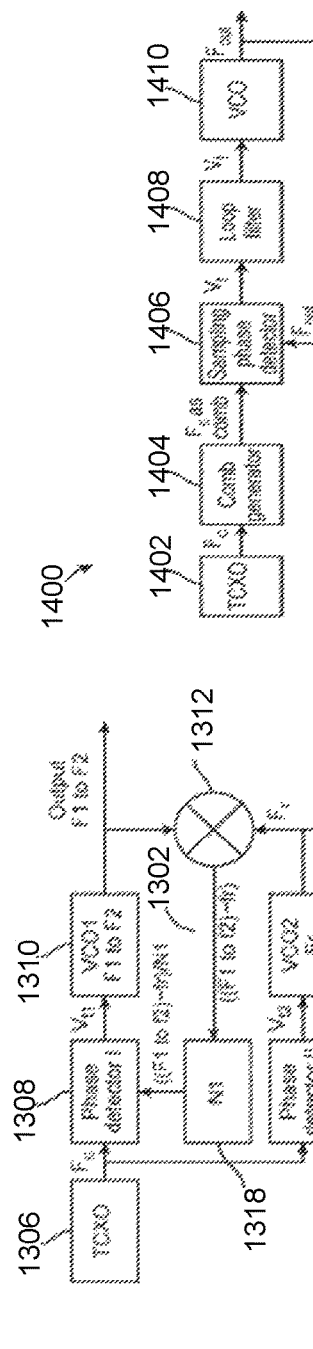
FIG. 14
FIG. 13

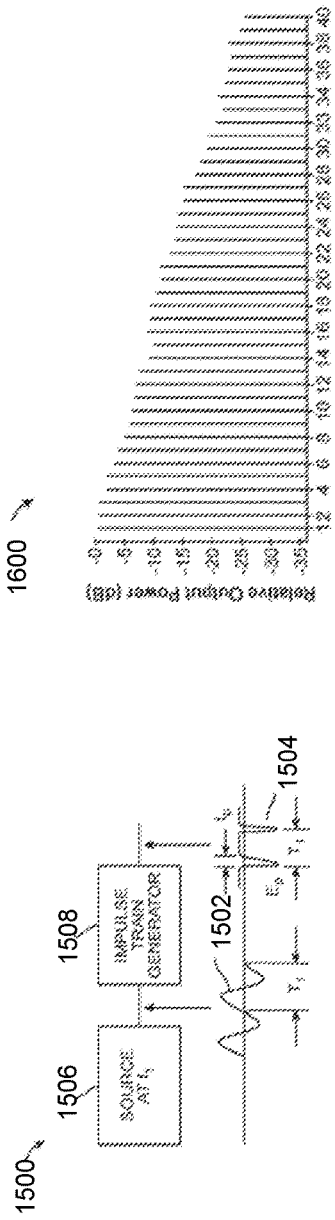
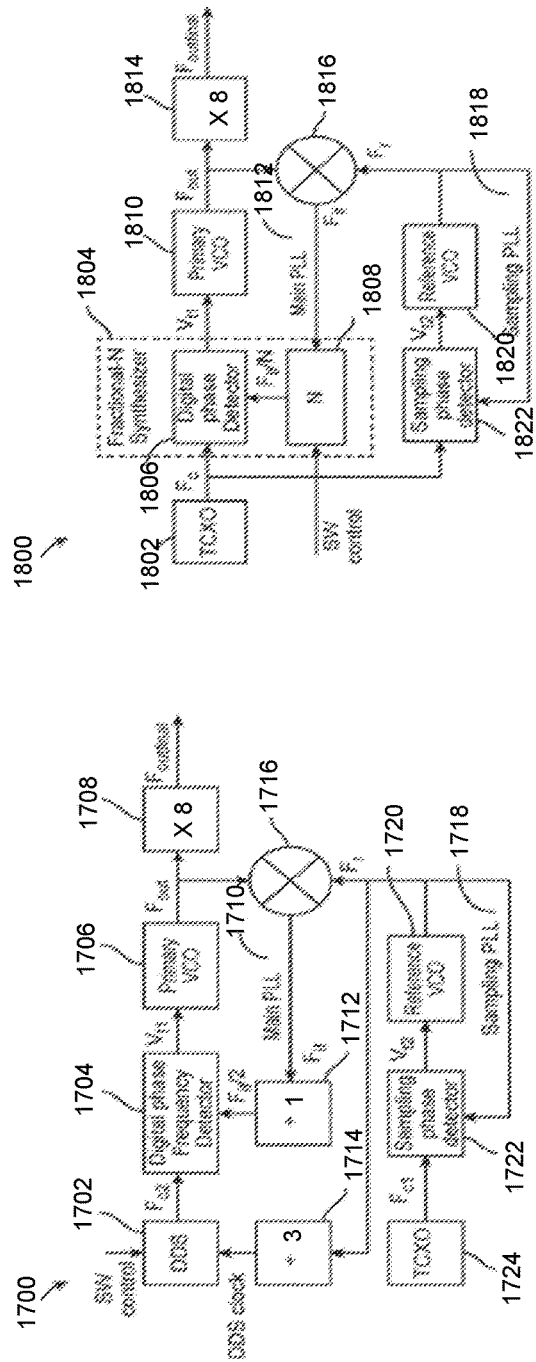

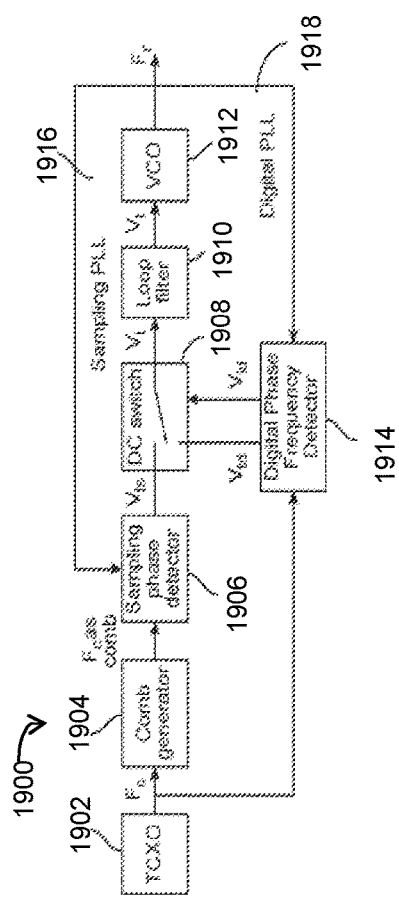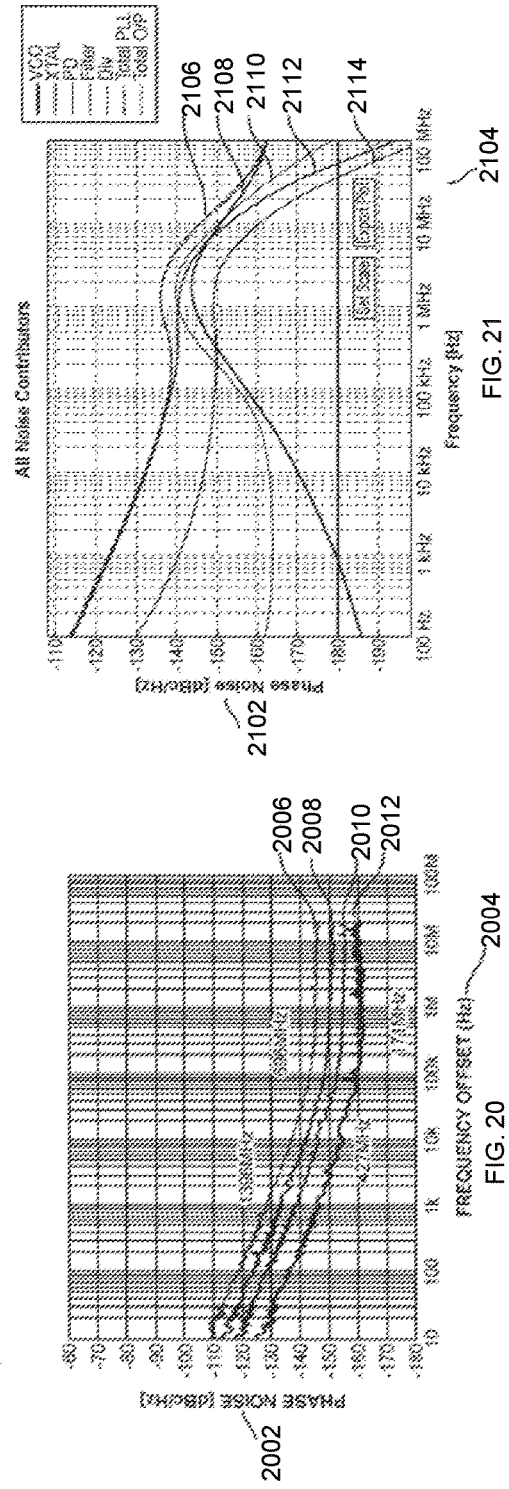

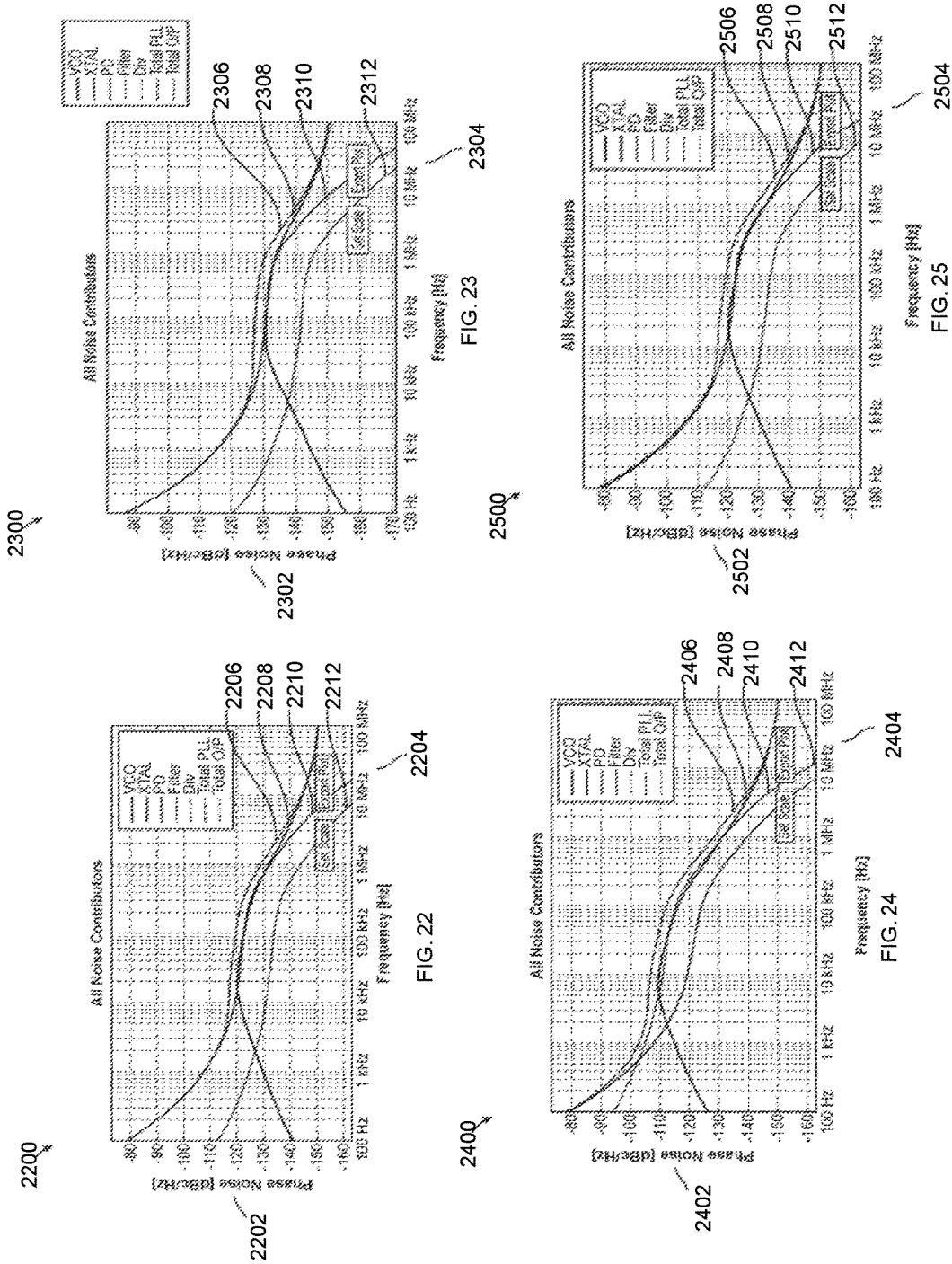

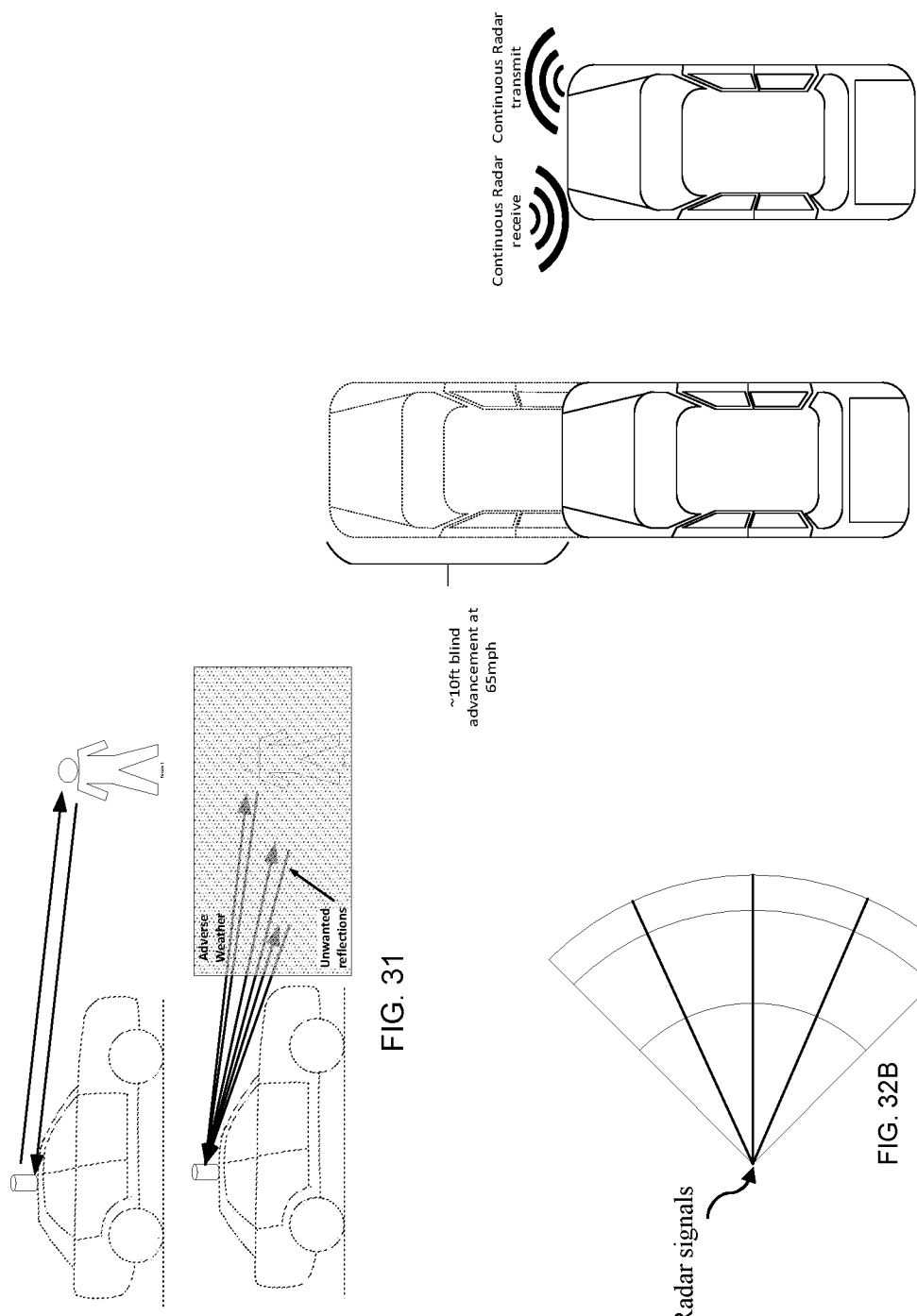
FIG. 31
FIG. 32A
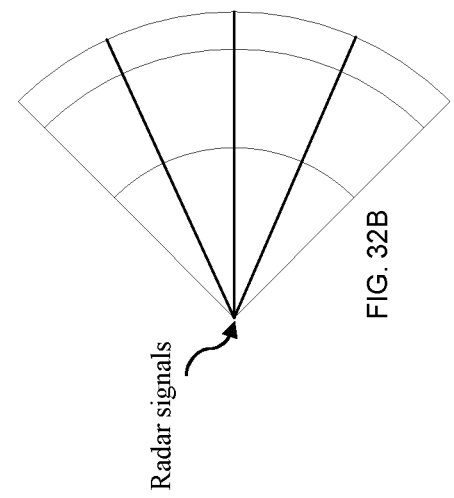
FIG. 32B

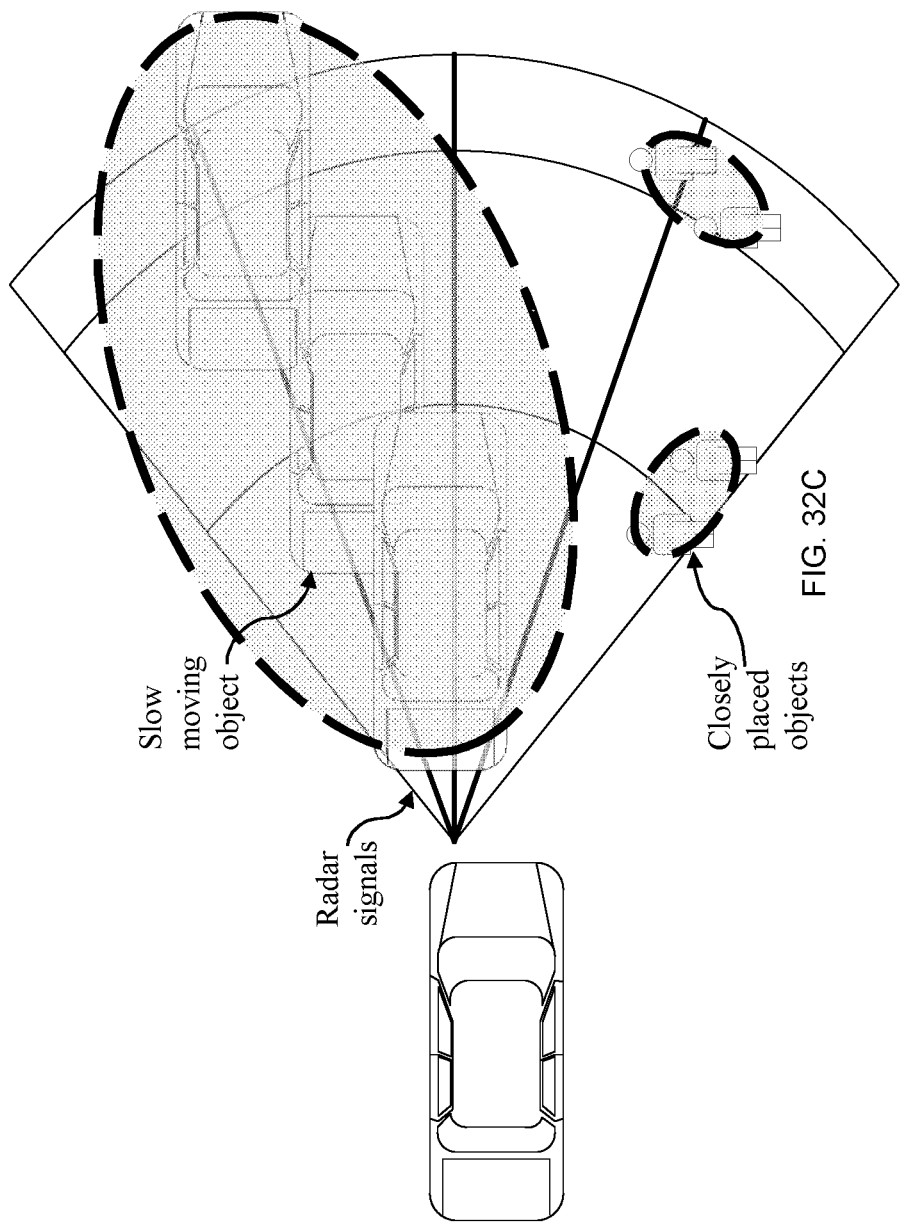

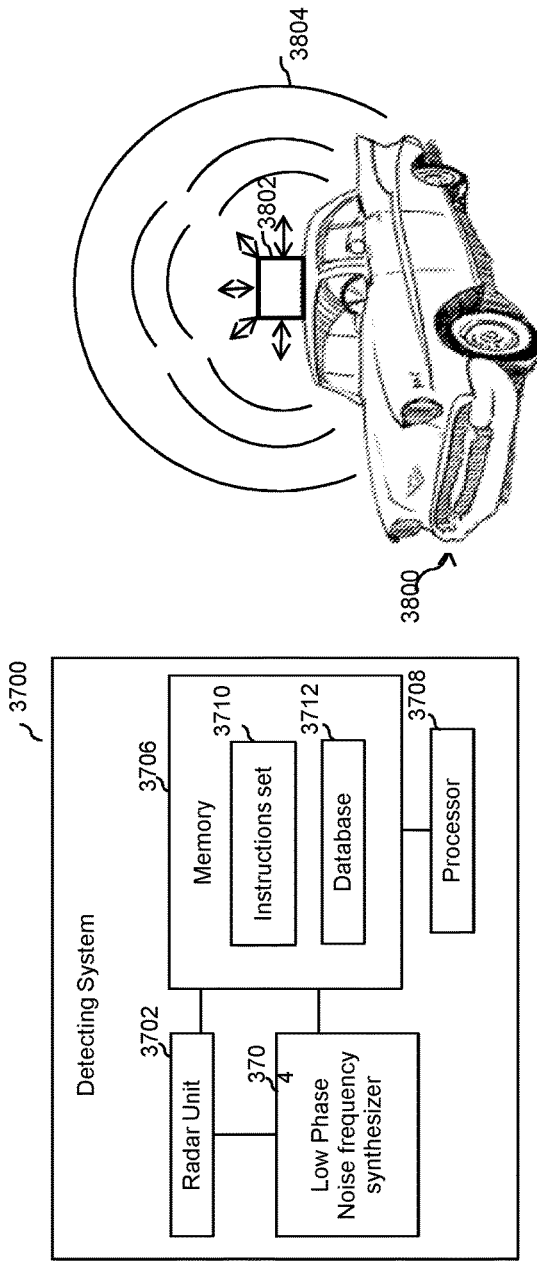
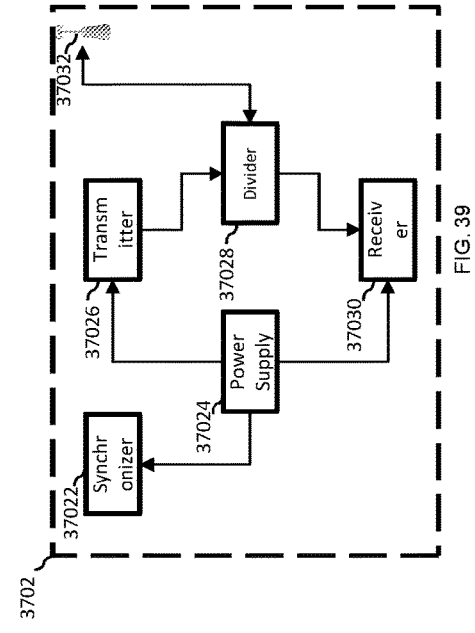

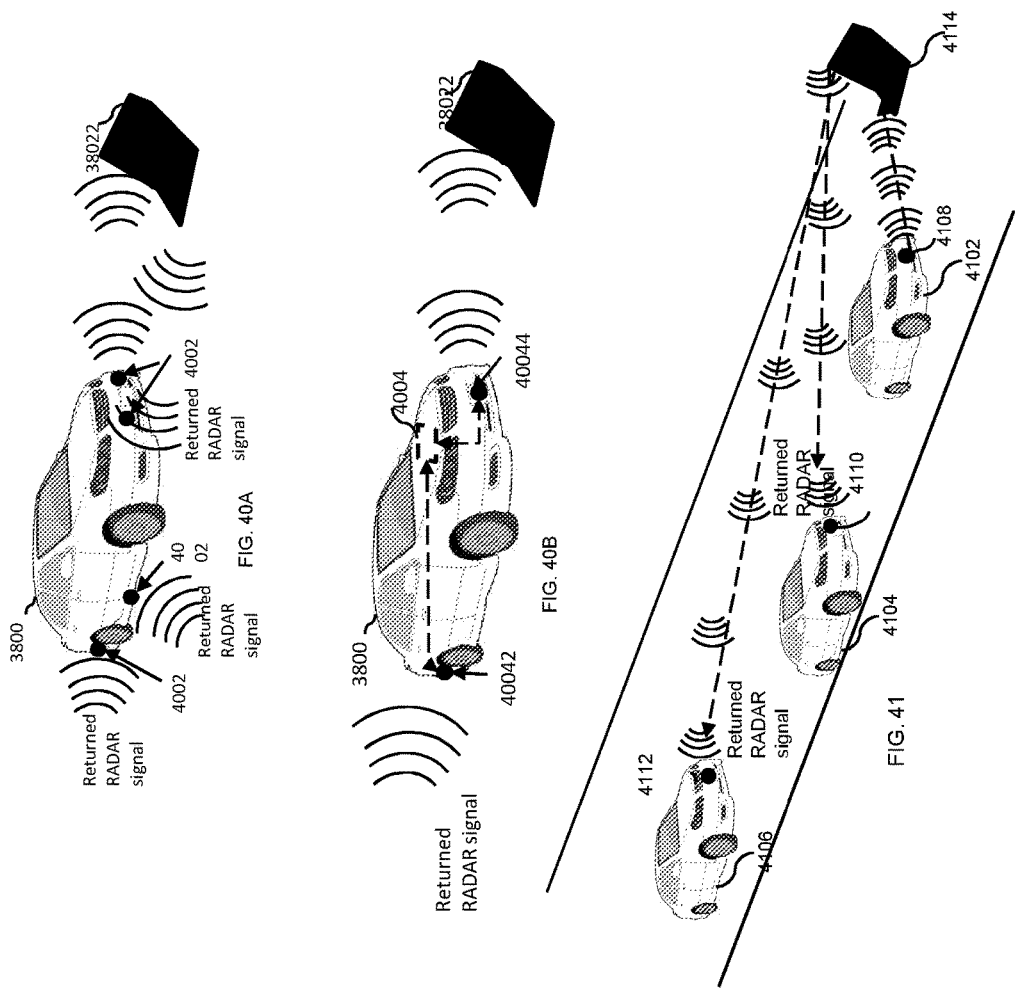

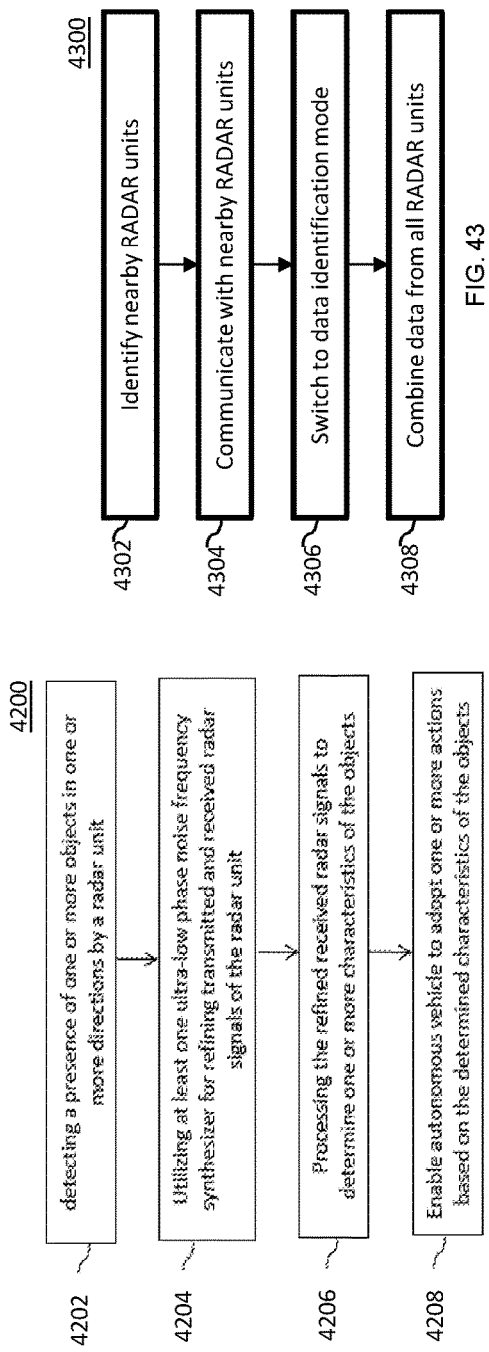
FIG. 43
FIG. 42
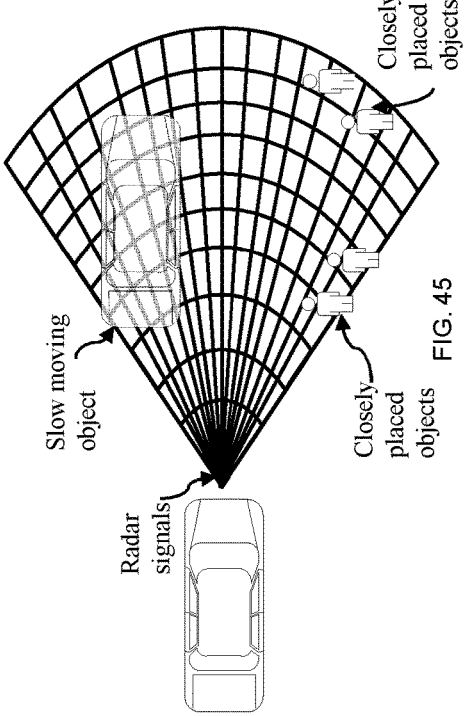
FIG. 45
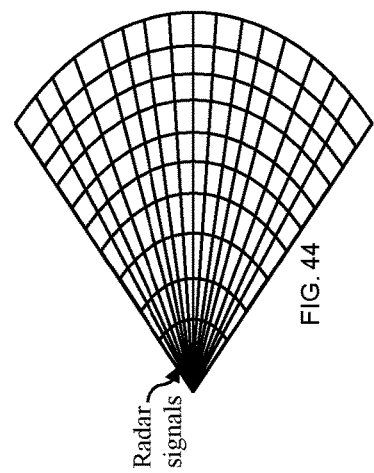
FIG. 44

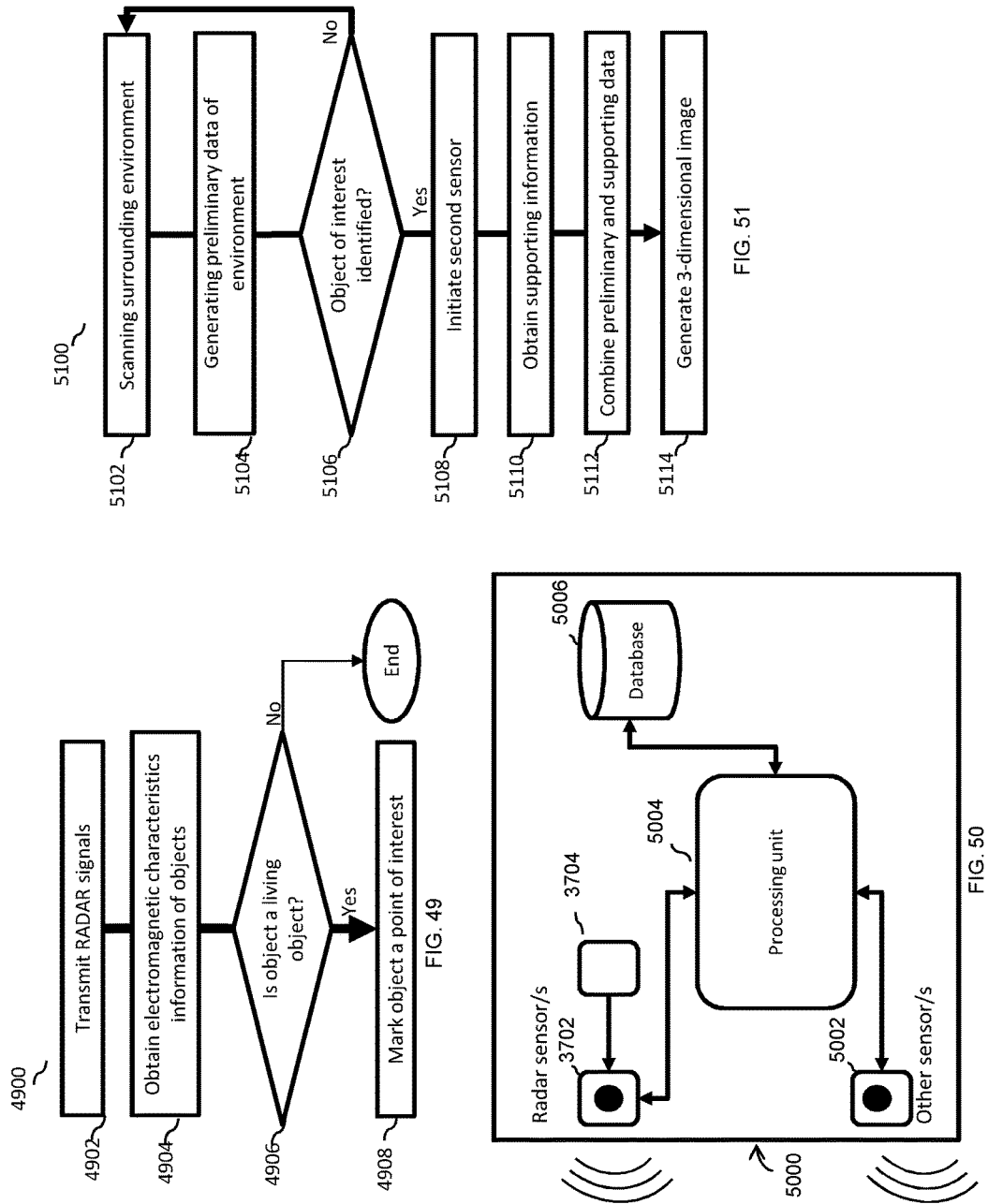

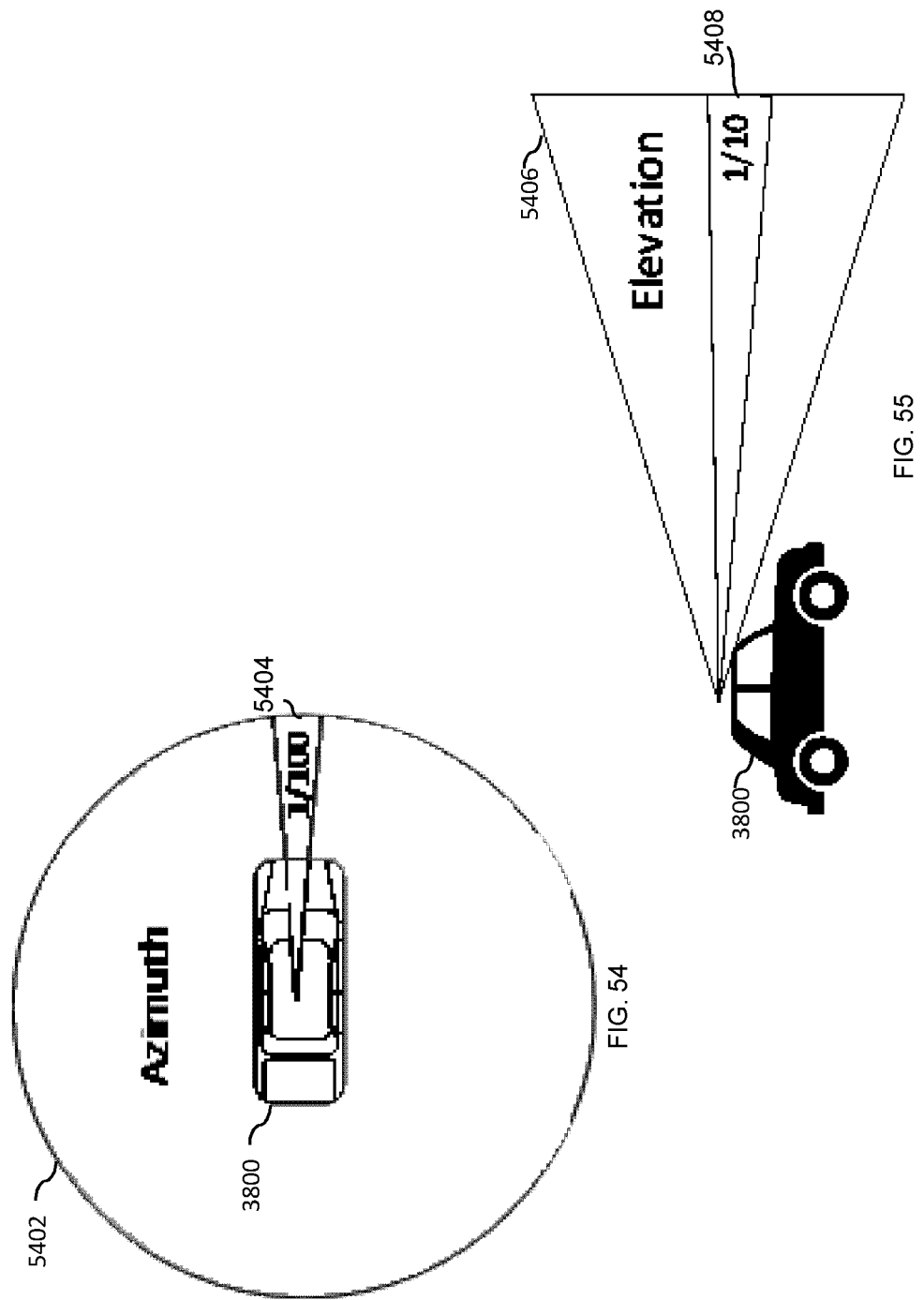

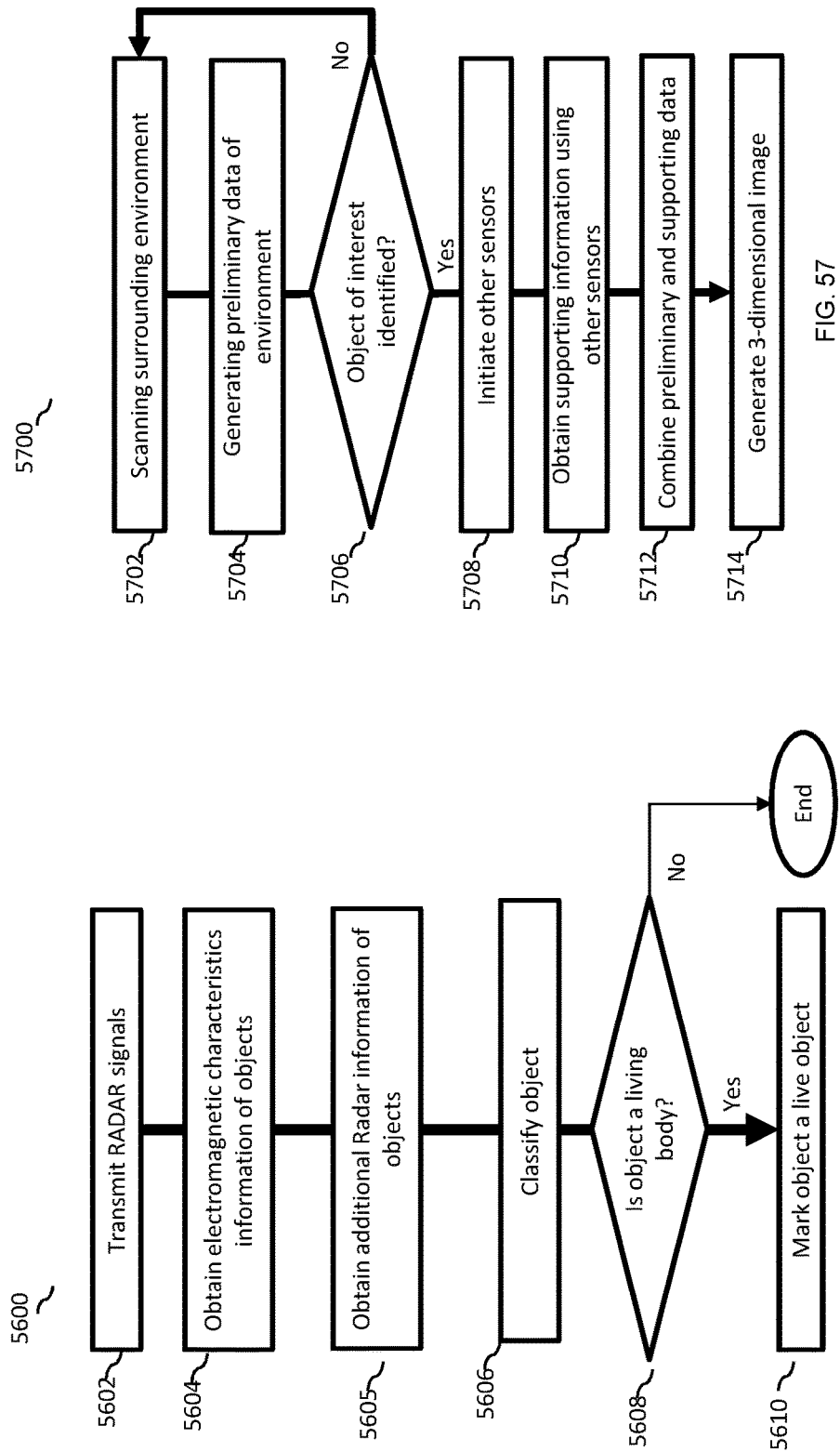

RADAR TARGET DETECTION SYSTEM FOR AUTONOMOUS VEHICLES WITH ULTRA LOWPHASE NOISE FREQUENCY SYNTHESIZER

FIELD

Embodiments of the present disclosure are generally related to sensors for autonomous vehicles (for example, Self-Driving Cars) and in particular to systems that use ultra-low phase-noise frequency synthesizer for RADAR Sensor Applications for autonomous vehicles.

BACKGROUND

Autonomous vehicles are paving way for a new mode of transportation. Autonomous vehicles require minimum or no intervention from vehicle's driver. Generally, some autonomous vehicles need only an initial input from the driver, whereas some other designs of the autonomous vehicles are continuously under control of the driver. There are some autonomous vehicles that can be remotely controlled. For example, automatic parking in vehicles is an example of the autonomous vehicle in operation.

Autonomous vehicles face a dynamic environment that is the environment keeps changing every time. The autonomous vehicles need to keep a track of lane markings, road edges, track road curves, varying surfaces that may include flat surfaces, winding roads, hilly roads etc. Alongside, the autonomous vehicles also need to keep a check on objects that are both stationary or mobile like a tree or a human or an animal. Hence, the autonomous vehicles need to capture a huge amount of information that keeps on changing every time.

Therefore, to overcome and meet these challenges, autonomous vehicles are provided with a various set of sensors. These sensors help the vehicle to gather all around information and help in increasing the degree of autonomy of the vehicle. The various types of sensors currently being used in autonomous vehicles are LiDAR sensors, Ultrasonic sensors, Image sensors, Global Positioning System (GPS) sensors, Inertial Measurement Unit (IMU) sensors, dead reckoning sensors, Microbolo sensors, Speed sensors, Steering-angle sensors, Rotational speed sensors, Real-time Kinematics sensors, and RADAR sensors. Two of the most used sensors are LiDAR and RADAR sensors.

LiDAR sensors: LiDAR is a device that maps objects in 3-dimensional by bouncing laser beams off its real-world surroundings. LiDAR in automotive systems typically uses a 905 nm wavelength that can provide up to 200 m range in restricted FOVs (field of views). These sensors scan the environment, around the vehicle, with a non-visible laser beam. LIDAR sensor continually fires off beams of laser light, and then measures how long it takes for the light to return to the sensor. The laser beam generated in of low intensity and non-harmful. The beam visualizes objects and measures ranges to create a 3D image of the vehicle's surrounding environment. LiDAR sensors are very accurate and can gather information to even up to very close distances around the vehicle. However, LiDAR sensors are generally bulky, complex in design and expensive to use. The costs can be between around $8,000 and even up to $100,000. Smaller and less expensive LiDAR sensors are starting to be in the market. LiDAR may also require complex computing of the data collected that also adds to the costs. Also, in general, LiDARs can capture data up to a distance of around 200 m.

It is to be noted that LiDAR requires optical filters to remove sensitivity to ambient light and to prevent spoofing from other LiDARs. Also, the laser technology used has to be "eye-safe". Recently mechanical scanning LiDAR, that physically rotates the laser and receiver assembly to collect data over an area that spans up to 360° have been replaced with Solid State LiDAR (SSL) that have no moving parts and are therefore more reliable especially in an automotive environment for long-term reliability. However, SSLs currently have lower field-of-view (FOV) coverage. In current LiDAR sensor design coverage is also a problem in terms of sensor gap and overlap, since the LiDAR in autonomous vehicles has very limited redundancy sensors that can provide the level of imaging that a LiDAR provides under optimal conditions. LiDAR is also weather susceptible. It turns blind when it comes to imaging in adverse weather conditions. LiDAR has limitations of creating clear imaging in conditions of fog, rain, snow, direct sunlight, and darkness. Also, LiDAR cannot read letters on a signboard. This is so because the signboard is flat.

RADAR sensors: RADAR sensors basically send out electromagnetic waves. When these waves hit an obstacle, they get reflected. Thus, revealing how far away an object is and how fast is it approaching.

RADAR sensors are very crucial in today's autonomous vehicle applications. They are required to be more accurate.

Automotive RADARs can be categorized into three types: long-range RADARs, medium range RADARs, and short-range RADARs. Long range RADARs are used for measuring the distance to and speed of other vehicles. Medium range RADARs are used for detecting objects within a wider field of view e.g. for cross traffic alert systems. Short range RADARs are used for sensing in the vicinity of the car, e.g. for parking aid or obstacle detection. Depending on the application, RADAR requirements differ. Short range applications require a steerable antenna with a large scanning angle, creating a wide field of view. Long range applications, on the other hand, require more directive antennas that provide a higher resolution within a more limited scanning range. Two different frequency bands are mainly used for automotive RADARs: the 24 GHz band and the 77 GHz band. The 77 GHz band offers higher performance, but it is also more challenging to implement since for example losses are much higher at these frequencies. The 24 GHz RADARs are easier to develop but are larger in size, making it difficult to integrate them in a vehicle. RADARs operating at 24 GHz require around three times larger antennas than RADARs operating at 77 GHz, to achieve the same performance. A 77 GHz RADAR would thus be much smaller resulting in easier integration and lower cost. Moving to higher frequencies enables RADARs with a better resolution. However, a major challenge posed is to develop steerable antennas for 77 GHz RADARs with high enough performance at a reasonable cost. In one embodiment of the inventions different types of antenna and meta-material-based antennas that are less prone to phase noise disturbance will benefit from our invention.

Automotive RADAR systems use a pulse-Doppler approach, where the transmitter operates for a short period, known as the pulse repetition interval (PRI), then the system switches to receive mode until the next transmit pulse. As the RADAR returns, the reflections are processed coherently to extract range and relative motion of detected objects. Another approach is to use continuous wave frequency modulation (CWFM). This approach uses a continuous carrier frequency that varies over time with a receiver on constantly. To prevent the transmit signal from leaking into the receiver, separate transmit and receive antennas are used.

Generally, there are three types of RADARs in use in autonomous vehicles. Short range RADAR, that helps in collision warning, and provide assisted parking support. Medium Range RADAR helps to watch corners of the vehicle, help in blind spot detection, lane detection and avoid side/corner collisions. Further, long-range RADARs help in adaptive cruise control functions and early collision detection functions.

RADAR signal processing also needs to be efficient. It needs to intelligently group the bouncing signals from the same object in the range. Otherwise, the RADAR signal processing will be overwhelmed with the amount of signal processing and may get confused. Grouping is made possible by use of Doppler shift of the signals bouncing off from the surfaces with a. velocity different from the observation domain. Thus, Doppler maps are created, that depict the range to object returns on one axis and extracted velocity of the targets on the other.

RADARs have also been used for identifying and classifying humans. Though, RADARs are not efficient in performing the human identification. However, there have been techniques that are being used for human identification.

One of the techniques uses reflectivity of humans using an ultra-wideband RADAR. In this technique, the polarization of the reflected signal can be analyzed and can be determined that there are some frequencies where, in one polarization, there is maximum reflectivity and a minimum in the other. However, the polarized signal depends mainly on the shape, posture, and position of the person. Thus, making it a highly unreliable technique for classification.

Another technique used for human classification uses a dual-band frequency modulated continuous wave RADAR. In this technique, the difference in reflected signal from an object at different frequencies (commonly 10 Hz to 66 Hz) is compared. Through this comparison, the threshold for the ratio of the received intensity between two frequencies, above which detected objects can be classified as animals was established.

Some techniques utilized and analyzed Doppler spectrum of CW RADAR to obtain a Doppler or micro-Doppler Signature for a walking human. Whereas, some of the techniques used wavelet transform to extract the micro signatures created by human walking.

Other techniques that should be mentioned here include the use of 2 or more different frequencies and multiple chirp types, These and the techniques above support the evaluation and recognition of the electromagnetic characteristics and properties of a human being or other targeted object. These techniques can be used for material detection and human classification. Also, the usage of multiple frequencies and chirp types provides information for micro-Doppler and radar signature evaluation and recognition.

The techniques mentioned are directed towards identification of the human and distinguish them from other walking objects like animals.

RADAR sensors are low priced and provide as excellent sensors. RADARs also cost much less than LIDAR and may be procured within $150. These sensors work extremely accurately in bad weather conditions like fog, snow, dirt, etc. RADAR sensors use extremely simple circuitry and thus are smaller in size that makes them easy to be manufactured, installed and used. However, one of the major drawbacks of the RADAR sensors is that they give confusing results when multiple objects are within the range. They are not able to filter noise in such situations. Existing RADARs do not offer the necessary resolution to distinguish objects with sufficient reliability. One of the main problems faced is the separation of small and large objects that travel at the same distance and velocity in adjacent lanes, e.g. a motorcycle driving in the lane next to a truck.

Major factors affecting RADAR performance are described in the following paragraphs:

Transmitter Power and Antenna:

The maximum range of a RADAR system depends in large part on the average power of its transmitter and the physical size of its antenna. This is also called the power-aperture product. The antenna itself remains a challenge for autonomous vehicles and a lot is invested in various antenna developments. The invention described here can be used with a type of antenna including antennas based and made out of meta-materials. In fact, the synergy between a meta-material antenna and this invention would result in a very high performing radar sensor.

Receiver Noise:

The sensitivity of a RADAR receiver is determined by the unavoidable noise that appears at its input. At microwave RADAR frequencies, the noise that limits detectability is usually generated by the receiver itself (i.e., by the random motion of electrons at the input of the receiver) rather than by external noise that enters the receiver via the antenna.

Target Size:

The size of a target as "seen" by RADAR is not always related to the physical size of the object. The measure of the target size as observed by RADAR is called RADAR cross-section and is determined in units of area (square meters). It is possible for two targets with the same physical cross-sectional area to differ considerably in RADAR size or RADAR cross-section. For example, a flat plate 1 square meter in the area will produce a RADAR cross-section of about 1,000 square meters at a frequency of 3 GHz when viewed perpendicular to the surface. A cone-sphere (an object resembling an ice-cream cone) when viewed in the direction of the cone rather than the sphere could have a RADAR cross-section of about 0.001 square meters even though its projected area is also 1 square meter. Hence, this may cause calculation mistakes and may give the wrong estimation of the objects identified.

Clutter:

Echoes from environmental factors like land, rain, birds and other similar objects may cause a nuisance to detect objects. Clutter makes it difficult to identify objects and their properties to a considerable extent.

Interference:

Signals from nearby RADARs and other transmitters can be strong enough to enter a RADAR receiver and produce spurious responses. Interference is not as easily ignored by automatic detection and tracking systems. Hence, interference may further add to noise to the RADAR signals.

Comparison Between LiDAR and RADAR

As compared to LiDAR sensors, RADAR sensors provide more robust information to the vehicles. LiDAR sensors are generally mounted on top of the vehicle and are mechanically rotated to gather surrounding information. This rotational movement is prone to dysfunction. Whereas in case of RADAR, as they are solid state and have no moving parts hence have a minimal rate of failures.

Also, LiDAR sensors produce pulsed laser beams and hence are able to gather information only when the pulsed beam is generating the laser beams. RADAR sensors can generate continuous beams and hence provide continuous information.

Also, LiDAR sensors generate enormous and complex data for which complex computational modules are required to be used. For example, some types of LIDAR systems generate amounts of 1-Gb/s data that require a substantial amount of computation by strong computers to process such high amount of data. In some cases, these massive computations require additional computation and correlation of information from other sensors and sources of information. These increases cost overheads for vehicle manufacturers. Whereas, RADAR sensors only generate small fractions of data that are easy to compute.

LiDAR sensors are also sensitive to adverse weather conditions such as rain, fog, and snow while RADAR sensors are not prone to weather conditions. Though RADAR is not affected by darkness and it can work well in adverse weather conditions, it drastically lowers its resolution.

RADAR signatures of a walking human being are a big problem. These signatures are not easily recognizable. Detection of human beings is a solution to which most of the computing algorithms do not have good solutions. There are various algorithms known as segmenting algorithms that do provide a certain level of the solution. The processing engine of an autonomous vehicle may take input from RADAR, LiDAR, Camera, Ultrasound and other multiple sensors to build an image of the surroundings of the vehicle.

Further, RADARs are generally used to detect preceding and approaching objects. Use of RADARs helps to decelerate the vehicle in applicable situations and warn the driver.

Stationary RADAR sensors are also in use to monitor a predetermined space for e.g. railway crossings may be monitored using stationary RADARs. The usage includes identification of objects in such railway crossings. In such situations either a warning can be generated, or the train may be decelerated. However, to effectively use the stationary RADARs it is very important to be able to determine the size of the objects identified by the RADAR sensor. These RADARs may include height estimating systems for objects located in the range of such a RADAR. This needs to be accurate as even small amounts of deviations between the plane and vertical sensor axis can result in large errors in estimating the object's size.

However, RADAR sensors are challenged when dealing with slow-moving objects such as cars, bicycles, and pedestrians. Furthermore, these traditional RADAR systems, whether using a modulated or non-modulated signal, have difficulties identifying objects that are very close to each other since one of them will be obscured due to the phase-noise of the system. Also, the drawback of existing RADAR sensors is the impact on their accuracy due to the phase-noise of its frequency source, the synthesizer. RADAR sensors are not able to relay size and shape of objects as accurately as LiDAR. RADAR sensors might not be a stand-alone solution. They can be accompanied by ultrasonic sensors or cameras. Though, RADAR is excellent in finding things that are solid over long distances, but, it may be challenging to identify things that are in a short range.

Therefore, there is a need for an enhanced detection system capable of implementing artificial intelligence using various sensory fusion including a plurality of LiDAR, Camera, Ultrasound, and RADAR sensors for helping in making informed decisions based on surrounding information for semi or autonomous vehicles. Furthermore, the system should be capable to overcome the shortcomings of the existing systems and technologies.

SUMMARY

Some of the Benefits of the Invention:

The present invention emphasizes that by incorporating the ultra-low phase-noise synthesizer in an existing RADAR system, the performance of the RADAR system will be improved substantially in terms of target detection accuracy and resolution and because of this it can become the dominant sensor for the handling of autonomous cars. Herein, the Synthesizer drastically reduces the phase-noise of RADAR signals so that such RADAR sensor will be able to replace current sensor systems at very low cost and with reliability at all lighting and adverse weather conditions.

A system that utilizes an ultra-low phase-noise synthesizer will be able to provide data to a processor that can determine the electromagnetic characteristics of an object with sufficient accuracy so that the system is able to determine if the object is a living object such as a human being or an animal or if it is inanimate. It will also be able to provide data that is accurate enough to differentiate between the material objects are made of such as differentiating between wood and stone for example. As an example, the data generated by the RADAR system could be used to identify and verify the presence of a human on the sidewalk about to cross the street or a bicycle rider at the side of the road.

Further as a derivative of the capability to determine the material an object is made of combined with the electromagnetic waves capability to penetrate through many materials an object detection system utilizing an ultra-low phase-noise synthesizer will provide data that will enable a processing unit (such as a specialized processor of the object detection system) to find objects that are visually obscured by another object and determine the material of the obscured and obscuring object. Thus, the system may be able to find a human behind a billboard/bus station advertisement or wildlife behind a bush or determine that these are only 2 bushes (or non-animated objects) one behind the other.

Additionally, a RADAR system that utilizes an ultra-low phase-noise synthesizer may be used as an imaging RADAR that can discover silhouettes and create a true 3-dimensional map of the surroundings of the vehicle including the mapping of the objects that are not visible with light. Such a RADAR System would also be able to utilize Synthetic Aperture Radar (SAR) technology, Interferometry and Polarimetry (or other SAR related technologies) to define the exact characteristics of an objects backscatter such as, but not limited to, Surface roughness, Geometric structure, Orientation and more. Further, an ultra-low phase-noise RADAR system enables the determination of electrical characteristic such as, but not limited to, Dielectric constant, Moisture content, Conductivity and more. The data creation of electromagnetic characteristics can also be achieved by combining the ultra-low phase noise synthesizer of this invention and using 2 or more different frequencies and multiple chirp types.

According to an embodiment of the present disclosure an object detection system for autonomous vehicles is provided, The object detection system may include a RADAR unit coupled to at least one ultra-low phase-noise frequency synthesizer, configured for detecting the presence of one or more objects in one or more directions, the RADAR unit comprising: a transmitter for transmitting at least one radio signal; and a receiver for receiving at least one radio signal returned from one or more objects/targets. Further, the object detection system may include the at least one ultra-low phase-noise frequency synthesizer that may be utilized in conjunction with the RADAR unit, for refining both the transmitted and the received signals, and thus determining the phase-noise and maintaining the quality of the transmitted and the received radio signals, wherein the at least one ultra-low phase-noise frequency synthesizer comprises: (i) at least one clocking device configured to generate at least one first clock signal of at least one first clock frequency; (ii) at least one sampling Phase Locked Loop (PLL), wherein the at least one sampling PLL comprises: (a) at least one sampling phase detector configured to receive the at least one first clock signal and a single reference frequency to generate at least one first analog control voltage; and (b) at least one reference Voltage Controlled Oscillator (VCO) configured to receive the at least one analog control voltage to generate the single reference frequency; and (c) a Digital Phase/Frequency detector configured to receive the at least one first clock signal and a single reference frequency to generate at least a second analog control voltage; and (d) a two-way DC switch in communication with the Digital Phase/Frequency detector and the sampling phase detector; (iii) at least one first fixed frequency divider configured to receive the at least one reference frequency and to divide the at least one reference frequency by a first predefined factor to generate at least one clock signal for at least one high frequency low phase-noise Direct Digital Synthesizer (DDS) clock signal; (iv) at least one high-frequency low phase-noise DDS configured to receive the at least one DDS clock signal and to generate at least one second clock signal of at least one second clock frequency; and (v) at least one main Phase Locked Loop (PLL).

Hereinabove, the main PLL may include: (a) at least one high-frequency Digital Phase/Frequency detector configured to receive and compare the at least one second clock frequency and at least one feedback frequency to generate at least one second analog control voltage and at least one digital control voltage; (b) at least one main VCO configured to receive the at least one first analog control voltage or the at least one second analog control voltage and generate at least one output signal of at least one output frequency, wherein the at least one digital control voltage controls which of the at least one first analog control voltage or the at least one second analog control voltage is received by the at least one main VCO; (c) at least one down convert mixer configured to mix the at least one output frequency and the reference frequency to generate at least one intermediate frequency; and (d) at least one second fixed frequency divider configured to receive and divide the at least one intermediate frequency by a second predefined factor to generate the at least one feedback frequency.

Herein, the RADAR unit or units create a 3-dimensional RADAR image using one or more RADAR sensors and/or one or more frequencies. The transmitting RADAR may be at one location of the vehicle while the receiving unit is at another location. The RADAR sensors may utilize Synthetic aperture RADAR (SAR) technology to create the 3-dimensional image. The 3-dimensional image may include information about objects that are obscured by visible light. In an embodiment, Bi-static and multi-static may also involve one vehicle transmitting while one or more other vehicles receive the return signals.

Further, the data from the Radar unit comprising an ultra-low phase-noise synthesizer can and should be used for improved compressed sensing, micro-Doppler classification, object classification by electromagnetic characteristics and radar-based mapping of cities, roads and other venues that can or are being mapped with visual sensors Also, in an embodiment of the invention presented here, the system can use a type of antenna including antennas made out of meta-materials or other materials.

Herein, the radar unit determines a distance and a direction of each of one or more objects. Further, the radar unit determines one or more characteristics, of two close objects irrespective of the size of the one or more objects. Again further, the radar unit differentiates between two or more types of the objects when one object is visually obscuring another object. Additionally, the radar unit utilizes a modulated or non-modulated radio signal, to determine the presence of a slow-moving target despite the very small Doppler frequency shift. Also, the radar unit utilizes a modulated or non-modulated radio signal, to determine the presence of a close-range target despite the very short signal travel time.

Additionally, a vehicle with RADAR imaging capabilities may create contact with other vehicles that have that same feature. The group of 2 vehicles or more will have an identification scheme, or will set up one, so that every vehicle will be able to detect return signals from every other vehicle and thus combine a 3-dimensional map of the surroundings for immediate autonomous driving purposes and/or mapping or another purpose. This modus operandi should not be limited only to vehicles transmitting and receiving a Radar signal, the transmitter or receiver can also be stationary, such as a radar on a traffic light that warns vehicles about congestion at a crossing. Actions derived from that information might include slowing down or having the GPS recalculate the route to avoid congestion.

The object detection system may further include at least one additional sensor system, available on the autonomous vehicle, or a database connection in conjunction with the RADAR unit. The combined object detection and/or classification and imaging system may be used as real-time sensors and/or as (real-time) mapping device for single or multiple vehicles use through a direct vehicle-to-vehicle (V2V) or other connectivity solution Further, considering the example of the pedestrian on the sidewalk or the bicycle rider at the side of the road once the RADAR unit has detected something of interest this can be used in conjunction with other sensors, a LiDAR device for instance. In such a case the visible field for the LiDAR could be reduced to $1/100$ of its usual Field of View (FOV) and the elevation angle by another $1/10$ to $1/100$ of its original FOV reducing the computation needed for the LiDAR by $1/1000$ to $1/10000$.

Further, the at least one ultra-low phase-noise frequency synthesizer further comprises at least one fixed frequency multiplier configured to receive and multiply the at least one output signal generated by the at least one main PLL by a predefined factor to generate at least one final output signal of at least one final output frequency. The at least one ultra-low phase-noise frequency synthesizer is implemented on the same electronic circuitry or on a separate electronic circuitry. Further, the ultra-low phase-noise frequency synthesizer may be used to generate the up or down converting the signal of the RADAR unit.

Further, according to another embodiment of the present disclosure, a method for autonomous vehicles is disclosed. The method may include (but is not limited to): detecting a presence of one or more objects in one or more directions by a RADAR unit. Herein, the RADAR unit comprising: a transmitter for transmitting at least one radio signal to the one or more objects; and a receiver for receiving the at least one radio signal returned from the one or more objects. Further, the method may include performing, by at least one ultra-low phase-noise frequency synthesizer for refining the transmitted signal and not adding phase-noise to the received signals, and thereby determining a phase-noise and maintaining the quality of the transmitted and the received radio signals.

Herein, the method may further include various steps such as receiving and multiplying, by the ultra-low phase-noise frequency synthesizer, the at least one output signal by a predefined factor to generate at least one final output signal of at least one final output frequency. Further, the method may generate the up converting or down converting the signal of the RADAR unit. Furthermore, the method may determine the presence of a slow-moving target despite the very small Doppler frequency shift. Again further, the method may include determining the presence of a close-range target despite the very short signal travel time. Additionally, the method may determine a distance and a direction of each of the one or more objects. Furthermore, the method may determine a type of material an object is made up of. Also, the method may include a step of activating one or more additional sensors for operation thereof in conjunction with the RADAR unit. The method may determine characteristics of two close objects irrespective of the size of the objects. Further, the method may differentiate between two or more types of the objects when one object is visually obscuring another object. Further, the method may improve techniques such as compressed sensing, micro-Doppler classification and object classification according to its electro-magnetic characteristics.

According to an embodiment of the present disclosure, a system is a detection system that comprises a RADAR unit, communicably coupled to at least one ultra-low phase-noise frequency synthesizer, is provided. The RADAR unit configured for detecting the presence of one or more objects in one or more directions. Herein, the RADAR unit comprising: a transmitter for transmitting at least one radio signal; and a receiver for receiving at least one radio signal returned from one or more objects/targets. Further, the detection system may include at least one ultra-low phase-noise frequency synthesizer that may be configured for refining the returning the at least one radio signal to reduce phase-noise there from.

Herein, the system includes at least one ultra-low phase-noise frequency synthesizer configured to determine phase-noise and quality of the transmitted and the received at least one radio signal. The ultra-low phase-noise frequency synthesizer is a critical part of a System, regardless of how it is implemented. The ultra-low phase-noise frequency synthesizer comprises one main PLL (Phase Lock Loop) and one reference sampling PLL. The main PLL comprises one high-frequency DDS (Direct Digital Synthesizer), one Digital Phase Frequency Detector, one main VCO (Voltage Controlled Oscillator), one internal frequency divider, one output frequency divider or multiplier and one down convert mixer. The reference sampling PLL comprises one reference clock, one sampling phase detector, one digital phase/frequency detector and one reference VCO. This embodiment provides a vast and critical improvement in the overall system output phase-noise. The synthesizer design is based on the following technical approaches—a) using of dual loop approach to reducing frequency multiplication number, b) using of sampling PLL as the reference PLL to make its noise contribution negligible, c) using of DDS to provide high-frequency input to the main PLL and d) using of high-frequency Digital Phase Frequency Detector in the main PLL.

In an additional embodiment of present disclosure, the system includes at least one ultra-low phase-noise frequency synthesizer configured to determine phase-noise and quality of the transmitted and the received at least one radio signal. The ultra-low phase-noise frequency synthesizer comprises one main PLL (Phase Lock Loop) and one reference sampling PLL. The main PLL further comprises one Fractional-N Synthesizer chip, one primary VCO (Voltage Controlled Oscillator) and one down convert mixer. The Fractional-N Synthesizer chip includes one Digital Phase Detector and one software controllable variable frequency divider. The reference sampling PLL comprises one reference clock, one sampling phase detector, one digital phase/frequency detector and one reference VCO. This embodiment provides multiple improvements in system output which are based on the following technical approaches—a) using of dual loop approach to reducing frequency multiplication number, b) using of sampling PLL to make its noise contribution negligible, and c) using of a high-frequency Fractional-N Synthesizer chip in the main PLL.

In an additional embodiment of present disclosure, the system includes at least one ultra-low phase-noise frequency synthesizer configured to determine phase-noise and quality of the transmitted and the received at least one radio signal. The ultra-low phase-noise frequency synthesizer comprises one sampling PLL. The sampling PLL comprises one reference clock, one sampling phase detector, one digital phase/frequency detector and one VCO.

According to an embodiment of the present disclosure, a detection system comprising a RADAR unit and an ultra-low phase-noise frequency synthesizer is provided. The system is made up of System on Chip (SoC) module. The RADAR unit configured for detecting the presence or imaging of one or more objects in one or more directions. The RADAR unit comprising: a transmitter for transmitting at least one radio signal; and a receiver for receiving the at least one radio signal returned from the one or more objects/targets. In an embodiment, the Transmit and receive signal frequencies might be equal. For example, if there is no Doppler effect, the signal frequencies may be equal. In an embodiment, the transmit and receive frequencies might also be different, for example in cases where the Doppler effect is present. The ultra-low phase-noise frequency synthesizer comprises one main PLL (Phase Lock Loop) and one reference sampling PLL. The main PLL further comprises one Fractional-N Synthesizer chip, one primary VCO (Voltage Controlled Oscillator) and one down convert mixer. The Fractional-N Synthesizer chip includes one Digital Phase Detector and one software controllable variable frequency divider. The reference sampling PLL comprises one sampling PLL, and one reference VCO. This embodiment provides multiple improvements in system output which are based on the following technical approaches—a) using of dual loop approach to reducing frequency multiplication number, b) using of sampling PLL to make its noise contribution negligible, and c) using of a high-frequency Fractional-N Synthesizer chip in the main PLL.

In an additional embodiment of the present disclosure, a vehicle having a detection system is disclosed. The detection system may be implemented for detecting information corresponding to one or more objects, the detection unit comprising: a RADAR unit for transmitting radio signals and further for receiving the returned radio signal(s) from one or more objects/targets; and at least one ultra-low phase-noise frequency synthesizer for refining the returned signals to reduce the effect of phase-noise in the returned radio signals. Further, the detection unit comprises a processor for processing the refined signals to determine one or more characteristics corresponding to the one or more objects, the processor determining one or more actions based on one or more factors and the one or more characteristics corresponding to the one or more objects. The processor further may determine one or more actions being adaptable by the vehicle based on one or more characteristics that may originate from the RADAR system and/or in conjunction with information originated from another sensor. The vehicle further includes one or more components communicably coupled to the processor for performing the determined one or more actions.

The detection system may further include a memory for storing information and characteristics corresponding to the one or more objects, and actions performed by the vehicle.

Hereinabove, the at least one ultra-low phase-noise frequency synthesizer may be implemented in a manner as described further in the detailed description of this disclosure. Further, the RADAR unit comprises at least one of: traditional single antenna RADAR, dual or multi-antenna RADAR, synthetic aperture RADAR, and one or more other RADARs. Further, in an embodiment, the processor may determine phase shift in frequencies of the transmitted radio signals and the returned radio signals. Such phase shift (difference in phase-noise frequency) may further be analyzed in light of a frequency of the refined radio signal to self-evaluate overall performance of the detection system (or specific performance of the ultra-low phase-noise frequency synthesizer).

The preceding is a simplified summary to provide an understanding of some aspects of embodiments of the present disclosure. This summary is neither an extensive nor exhaustive overview of the present disclosure and its various embodiments. The summary presents selected concepts of the embodiments of the present disclosure in a simplified form as an introduction to the more detailed description presented below. As will be appreciated, other embodiments of the present disclosure are possible utilizing, alone or in combination, one or more of the features set forth above or described in detail below.

Current Radar sensors that reside in existing vehicles provide coarse information about the vehicles surroundings. This invention discloses a system that utilizes a new and innovative frequency generation mechanism (Synthesizer) to improve the Radar sensor performance significantly. The spectral purity (Phase Noise) of a local oscillator (LO) of a radar system is usually perceived as a parameter that cannot be manipulated or improved. In addition, many radar systems in use today implement a single LO that serves the transmit and receive paths so that the phase noise close to the carrier frequency is assumed to be cancelled by self-correlation. This assumption originates because near field echoes, that have a very short travel time, will find the LO approximately in the same state as it was during transmission. As a result, the phase noise is partially cancelled out for low frequency deltas around the LO.

Doppler Shift:

Single LO Radar systems are common in Assisted driving systems and autonomous vehicles which turns the emphasis on the statement above to the phrase "the phase noise is partially cancelled". The fact that the phase noise partially cancelled while the signal processing of the Radar systems practically assumes that the phase noise is completely canceled creates a few disadvantages since these Radars rely heavily on the doppler principle, i.e.: based on frequency shifts. When utilizing the Doppler principal every stationary object theoretically creates a reflected signal that lands exactly on DC after down-conversion. In the presence of phase noise, stationary objects have some velocity around DC due to that phase noise. For the purpose of this document we will call that "Doppler Jitter" which generally causes clutter. In order to reduce the effect of clutter the DC portion of the signal is disregarded for signal processing purposes. This in turn causes one of 2 issues:
  1. 1st Option—Some clutter still remains because of the doppler jitter, and then slow-moving objects like walking human beings are obscured by the clutter
  2. 2nd Option—The Signal processing removes some bandwidth around DC, and then slow-moving objects are completely disregarded.

Both of the options above bare disadvantages which are further exacerbated as follows:
  1. The Radar Cross section of a human is approximately 0 dBsm while a small car can be between 10 to 20 dBsm, depending on the side the Radar hits the car.
  2. The slower the vehicle that carries the radar sensor moves the smaller the doppler shift for slow moving objects—a scenario that is common in Urban areas where cars and humans coexist
  3. In addition to 2 above, the urban environment is also challenging because the distance between vehicle and other surrounding objects may be very short→the return signal will suffer from one of the 2 issues mentioned above.
  4. Micro Doppler—the movement of limbs creates very small frequency shifts with very small return signal amplitudes and often times in the opposite direction of the generic movement of the human, this again brings us back to the 2 unwanted options mentioned above.

To summarize the disadvantages mentioned above with respect to the Doppler frequency shift and phase noise: Objects that move slow and have a small Radar Cross Section (RCS), such as walking humans, are much simpler to identify and classify with ultra-low phase noise and so is processing their velocity and location even if the distance is small. Further, Ultra-Low phase noise opens an entire domain of micro-Doppler signal processing.

Phase Noise Amplification:

Radar System uses amplifiers in the transmit, receive and LO distribution paths. All of these amplifiers suffer from a non-linear deficiency usually referred to as "1/f Noise". Meaning that the amplifier adds more noise closer to the signal it amplifies that further away from it. Vehicle mounted Radar systems usually use a form of Frequency Modulated Continuous Wave (FMCW) which originate from the LO and already carry noise with them in the form of Phase Noise. When these signals travel through an amplifier, the phase noise is essentially amplified according to 1/f distance from the CW frequency. When implementing the disclosed radar with ultra-low phase noise synthesizer this kind of spectral contamination is reduced by 100-1000 times.

Pulse Compression

The last item to discuss in this paper would be pulse compression, which is a signal processing method very often utilized together with FMCW. DURING the pulse compression signal creation, the phase noise of the signal shows as side lobes or elevated noise around the processed radar echo which essentially triggers 2 ripple effects:
  1. Reduced Signal to Noise Ratio→diminishes the capability of object classification (especially objects with a small RCS)
  2. Reduced Signal to Noise Ratio→worse Radar sensitivity→less range Additional Advantages of Ultra-Low Phase Noise Many Radar systems implement beam forming mechanisms. Whether these mechanisms rely on phase shifting or electronic beam forming, the phase noise in the system will always add an error in the actual direction of the beam, therefore it is intuitively understandable that with lower phase noise better angular accuracy of the beam can be achieved.

Although not very advanced in the automotive world, another item that should be mentioned is Synthetic Aperture Radar (SAR) imaging. SAR imaging is in use by aircrafts and satellites for many years and the importance of phase noise is well understood for the different methods of SAR imaging.

The last item to mention here is that every object is made out of materials that have different electromagnetic characteristics, and therefore will have a return signal that is not only specific to the objects velocity, size and location, but also specific to its electromagnetic characteristics.

Some Benefits:

The implementation of ultra-low phase noise synthesizers in Radar systems has been discussed in detail for the Doppler phenomenon, 1/f noise and pulse compression. Further, beam forming, SAR imaging and material recognition have been mentioned at a high level. Following primary and secondary conclusions can be derived:
1. Primary Conclusion for the implementation of ultra-low phase noise synthesizers in Radar systems:
   a. Much better accuracy in the Doppler and micro-Doppler domains
   b. Signal processing improvements that have an impact on the accuracy and the range of the Radar sensor
   c. Improved SAR imaging and more accurate usage of beamforming mechanisms
2. Secondary Conclusion for the implementation of ultra-low phase noise synthesizers in Radar systems:
   a. The sensory fusion mechanisms will have more accurate Radar sensor data at their disposal and new information vectors that were previously non-existing.
   b. Since Radar is not a "visual sensor" per se, true sensory fusion is made possible.
   c. A single radar sensor can create multiple information vectors about a single object→satisfies the most important objective of identifying living objects.

BRIEF DESCRIPTION OF THE DRAWINGS

The above and still further features and advantages of embodiments of the present invention will become apparent upon consideration of the following detailed description of embodiments thereof, especially when taken in conjunction with the accompanying drawings, and wherein:

FIG. 8 illustrates a phase-noise plot of an example free running Voltage Control Oscillator (VCO) in the frequency domain (spectrum analyzer), without being locked in a PLL;

FIG. 9 illustrates a phase-noise plot of an example Voltage Control Oscillator (VCO) in the frequency domain (spectrum analyzer), compensated by being locked in a PLL;

FIG. 10 illustrates two plots: (a) a simulation of phase-noise of an example PLL, and (b) is an actual measurement;

FIG. 11 illustrates a phase-noise plot of a closed loop PLL, showing clearly the effect of the phase detector multiplication number 20*LOG(N) within loop bandwidth;

FIG. 12 illustrates a plot of measurement in terms of phase-noise in 1 Hz bandwidth at a Δf offset frequency from the carrier.

FIG. 13 illustrates a general block diagram of an example dual loop PLL;

FIG. 14 illustrates a general block diagram of an example dual sampling PLL;

FIG. 15 illustrates how impulse or "comb" generator changes a wave shape of a signal from a sine wave to pulses;

FIG. 16 illustrates an example output of a comb generator in the frequency domain;

FIG. 17 illustrates a block diagram of an ultra-low phase-noise frequency synthesizer as suggested in a first embodiment;

FIG. 18 illustrates a block diagram of an ultra-low phase-noise frequency synthesizer as suggested in a second embodiment;

FIG. 19 illustrates a block diagram of the sampling PLL system;

FIG. 20 illustrates a phase-noise simulation plot contributed by a DDS chip in accordance with the first embodiment of the present disclosure;

FIG. 21 illustrates a phase-noise simulation plot contributed by the main PLL in accordance with the first embodiment of the present disclosure;

FIG. 22 illustrates a phase-noise simulation plot contributed by a reference sampling PLL having the TCXO clock (or other reference Clock) generating input frequencies of 100 MHz in accordance with the first embodiment of the present disclosure;

FIG. 23 illustrates a phase-noise simulation plot contributed by a reference sampling PLL having the TCXO clock (or other reference Clock) generating input frequencies of 250 MHz in accordance with the first embodiment of the present disclosure;

FIG. 24 illustrates a phase-noise simulation plot contributed by the main PLL in accordance with the second embodiment of the present disclosure;

FIG. 25 illustrates a phase-noise simulation plot contributed by a reference sampling PLL having the TCXO clock (or other reference Clock) generating input frequencies of 100 MHz in accordance with the second embodiment of the present disclosure;

FIGS. 30A, 30B, 31, 32A, 32B, 32C, 33-36 correspond to prior arts and existing technologies;

FIG. 37 illustrates a detection system, in accordance with various embodiments of the present invention;

FIG. 38 illustrates an exemplary vehicle implementing detection system, in accordance with an embodiment of the present invention;

FIG. 39 illustrates a block diagram of an exemplary RADAR, in accordance with an embodiment of the invention;

FIG. 40A illustrates an exemplary 3-dimensional map generation using the RADAR, in accordance with an embodiment of the invention;

FIG. 40B illustrates another exemplary 3-dimensional map generation using the RADAR, in accordance with an embodiment of the invention;

FIG. 41 illustrates another example of 3-dimensional mapping using the RADAR, in accordance with an embodiment of the invention;

FIG. 42 illustrates a flowchart depicting an overall method, in accordance with an embodiment of the invention;

FIG. 43 illustrates a flowchart depicting the operational method steps of the first embodiment, in accordance with another embodiment of the invention;

FIG. 44 illustrates a line diagram depicting an improvement in RADAR signals, in accordance with the present invention;

FIG. 45 illustrates a line diagram depicting object identification, in accordance with an embodiment of the present invention;

FIG. 49 illustrates a flowchart of a method for identifying live objects using the detection system, in accordance with an embodiment of the invention;

FIG. 50 illustrates a block diagram of a detection system, in accordance with an embodiment of the invention;

FIG. 51 illustrates a method for detecting and imaging objects for a vehicle, in accordance with an embodiment of the invention;

FIG. 54, illustrates a block diagram displaying advantages of using selective use of the at least second sensor, in accordance with an embodiment of the invention.

FIG. 55, illustrates a block diagram displaying advantages of using selective use of the at least second sensor, in accordance with an embodiment of the invention.

FIG. 56 illustrates a flowchart for recognition of a living body, in accordance with an embodiment of the invention.

FIG. 57, illustrates an exemplary flowchart for detecting and imaging objects for a vehicle, in accordance with an embodiment of the invention.

To facilitate understanding, like reference numerals have been used, where possible, to designate like elements common to the figures.

DETAILED DESCRIPTION

Figure 3:
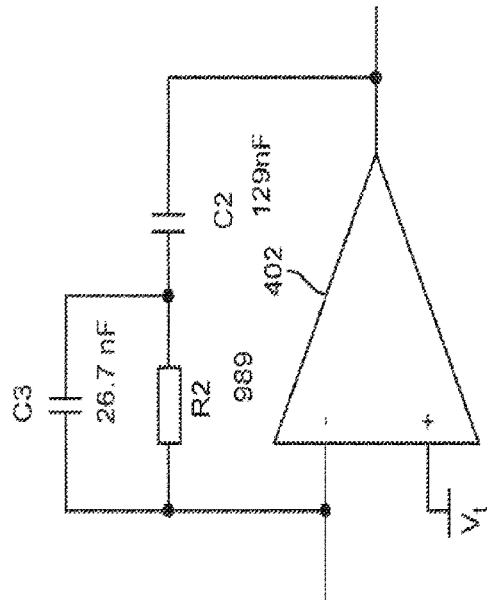
FIG. 3 illustrates a simplified drawing of a digital phase/frequency detector.

As used throughout this application, the word "may" be used in a permissive sense (i.e., meaning having the potential to), rather than the mandatory sense (i.e., meaning must). Similarly, the words "include", "including", and "includes" mean including but not limited to.

The phrases "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

The term "a" or "an" entity refers to one or more of that entity. As such, the terms "a" (or "an"), "one or more" and "at least one" can be used interchangeably herein. It is also to be noted that the terms "comprising", "including", and "having" can be used interchangeably.

The term "automatic" and variations thereof, as used herein, refers to a process or operation done without material human input when the process or operation is performed. However, a processor an operation can be automatic, even though the performance of the processor operation uses the material or immaterial human input if the input is received before performance of the processor operation. Human input is deemed to be material if such input influences how the process or operation will be performed. Human input that consents to the performance of the processor operation is not deemed to be "material".

The present disclosure includes implementation of an upgraded RADAR unit by incorporating an ultra-low phase-noise frequency synthesizer to make the RADAR functioning effectively by transmitting radio signals with much lower phase-noise than what is found in traditional RADAR systems on the transmit side. On the receive side of the RADAR system, the ultra-low phase-noise synthesizer adds only a very small amount of phase-noise to the signal. More specifically, in an embodiment, the upgraded RADAR unit generates a very low amount of phase-noise and thus minimizing the impact of phase-noise on the transmitted and the received signal. The RADAR unit may include a Synthetic Aperture RADAR (SAR), or another kind of RADAR, for determining information corresponding to targets. Further, the present disclosure may utilize modulated signal such as Frequency Modulated Continuous Wave (FMCW) of a type or other modulated signal for the RADAR Unit. As mentioned above FMCW based RADAR is advantageous in terms of power saving Further, in FMCW based RADAR unit, various factors such as distance and velocities may be determined based on frequency differences from the instantaneous transmitted signal rather than travel time. In most cases, FMCW RADAR signals are processed with the help of FFT utilizing signal processing windows and pulse compression algorithms. While these methods are good, the phase-noise of the system still remains important since it is a statistical phenomenon that may be measured and calculated as an average, but instantaneous value thereof cannot be determined, thus it cannot be mitigated easily with existing algorithms. However, its influence on system performance will drastically be reduced with the collaboration of ultra-low phase-noise frequency synthesizer. As a result, the overall system capability of accuracy and target detection will be vastly improved. Further, once distances, return phases and velocities can be determined with high accuracy, the data can be used to put together an accurate 3-dimensional image of the surroundings.

RADAR sensors are generally placed in the middle of the front bumper of a vehicle. There can be several RADAR units on the front and back bumper of a vehicle. Some of them are operable in the 24 Ghz band and some of them are in the 77 GHz band. Each of them may have different characteristics. Together these multi-frequency RADARs can provide more information. In addition, multiple RADARs can also work as SAR, that helps in getting a better image.

The placement of the RADARs on the vehicle enables features like forward-collision, collision-warning etc. As described earlier, the RADAR sensors utilize a transmitter to send short pulses of electromagnetic radiation. In some models, the transmitter is turned off after transmission and receiver listens for reflected pulses bouncing off from objects. However, if the transmitter and the receiver are separate then there is no need to switch off the transmitter between pulses. Integration of the RADAR sensors into the bumper needs to be performed carefully. Otherwise, there might be interference and accuracy problems. Therefore, the signals from the RADAR sensor should be of high quality and relatively constant across azimuth of the sensor while minimizing the wasted energy and delivering to undesired directions or being bounced back from bumper itself.

For perfect working of the RADAR sensor, while being placed in the bumper, electrical properties of the bracket where it is to be fitted and the fascia materials are taken to simulate RADAR working. The simulations may be done utilizing waveguide or quasi-optical properties. The measured electrical properties may include dielectric constant and loss of tangent of the fascia, bracket of the RADAR sensor and the paint layer.

RADAR simulations can be employed for designing of single RADAR components or develop complete systems including all RADAR installations and the vehicle. Complete RADAR simulation is a huge task. This task involves the RADAR to cover millions of electrical wavelengths. This is further increased by the number of times the RADAR updates central processing, number of antennas used, range and velocity of the RADAR system, and comparative velocity of environmental factors.

Figure 1:
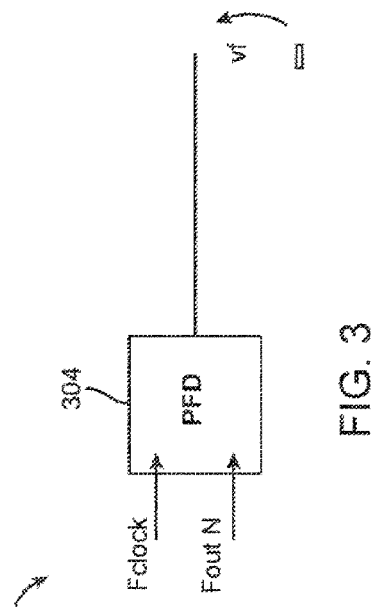
FIG. 1 illustrates a general block diagram of a negative feedback system.

FIG. 1 illustrates a general block diagram of a negative feedback system 100. The negative feedback system 100 has an input R and an output C, a summer/comparator 102, a forward path function G 104 and a feedback path function H 106. The summer/comparator 102 compares the input R with a sample B of the output C fed back through function H 106, to produce an error signal E that is relative to the difference between the input R and the feedback sample B. This error signal E is fed to the main element G function 104 in the forward path. If the output signal C tends to drift upwards, the error signal E pushes it back downwards and vice versa. Thus, the negative feedback system 100 stabilizes the output signal C. The negative feedback system 100 finds applications in many systems for stabilizing frequency, output power, and many other functions.

Figure 2:
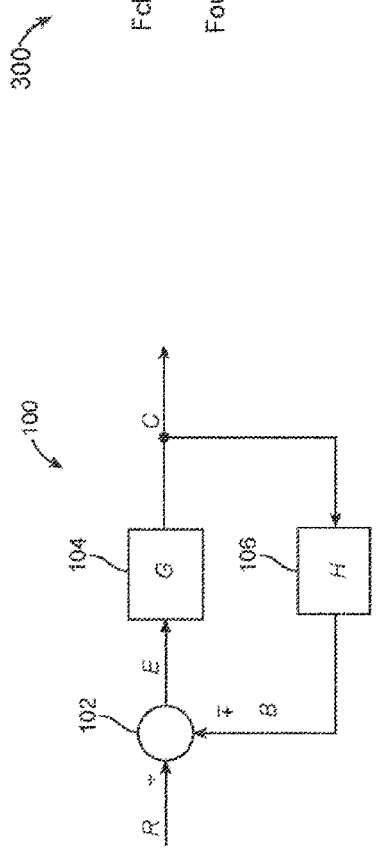
FIG. 2 illustrates a general block diagram of a standard Phase Lock Loop (PLL)

FIG. 2 illustrates a general block diagram of a standard Phase Lock Loop (PLL) 200. The PLL 200 is a frequency feedback system comprising a reference clock 202, a digital phase/frequency detector (PFD) 204, a loop filter 206, a Voltage Controlled Oscillator (VCO) 208, and a frequency divider 210.

The VCO 208 is the main output block in the forward path and is tuned to produce a frequency as set by a tuned circuit. The VCO 208 has a frequency output Fout that can be changed by a control voltage Vt over a pre-set range of frequencies.

The phase detector 204 is a comparator for both the clock input Fclock and the feedback sample from the output Fout divided by divider N 210. The phase detector 204 compares the two input frequencies Fclock and Fout/N. When the two input frequencies are not equal, the device 204 acts as a frequency discriminator and produces either a negative or positive voltage, depending on the polarity of the frequency difference between the two inputs. When the two input frequencies are the device produces an error voltage Vt relative to the phase difference between the two equal frequencies.

The loop-filter 206, filters and integrates the error signal produced by the phase detector 204 and feeds it to the VCO 208. The loop filter 206 is usually based on passive components like resistors and capacitors, but also in some cases it is a combination of active devices like an operational amplifier and passive components.

The reference clock 202 is, in general, a low-frequency crystal oscillator signal source that feeds Fclock to the phase detector 204, and to which the output signal Fout is "locked". The reference clock 202 is set at some frequency, for example, a standard frequency 10 MHz. The locking "mechanism" transfers some of the qualities of the reference clock 202 to the main output signal Fout. Its main features usually are: a) frequency stability over temperature—generally in the range of 0.1-5 ppm (parts per million), b) accuracy—Can be tuned to very high accuracy, c) very low phase-noise—Its phase-noise is transferred to the output signal multiplied by the ratio of 20*LOG(N) where N is the ratio between the output frequency and the clock frequency applied to the phase detector 204.

The frequency divider 210 is based on digital devices like gates and flip-flops, through which the input frequency Fout is divided by a number N to produce Fout/N which is fed to the other input of the phase detector 204. This number N is software controllable. The control signal comes usually from a microcontroller or from a PC or from anywhere that basically will send software control to the frequency divider 210 to change the division number N. The target of the division number N is to enable the output frequency of the frequency divider 210 to be equal to the clock frequency of the reference clock 202.

The entire operational procedures of a standard Phase Lock Loop (PLL) 200 is as follows: If an input clock signal Fclock is applied, usually by a reference clock 202, the phase detector 204 compares the phase and frequency of the input signal Fclock with that of the VCO 208 divided by N and generates an error voltage Vt that is related to the difference in the two signals. The error voltage Vt is then filtered and applied to the control of the VCO 208, thereby varying the VCO 208 frequency in a direction that reduces the frequency difference between the two signals. When the frequencies of the two signals become sufficiently close, the feedback nature of the system causes the system to lock with the incoming signal. Once in lock, the VCO 208 frequency divided by N is identical with the input signal Fclock, except for a finite phase difference which is necessary to generate the corrective error voltage Vt to shift the VCO 208 frequency to the input signal frequency Fclock, thus keeping the system in the lock.

When the division number N is changed, say for example by 1, the output frequency Fout jumps exactly by a step. In an example, if the reference clock 202 generates a frequency 1 MHz, then every time the division number N changes by steps of 1, the output frequency Fout changes by equal steps of 1 MHz.

Like all negative feedback systems, the PLL 200 has a loop bandwidth set by the component parameters and the loop filter 206. In other words, the PLL 200 is a sophisticated frequency multiplier with a built-in narrowband, automatically tuned band-pass filter as the output frequency Fout is basically Fclock multiplied by the number N. The loop bandwidth is also responsible directly for how fast the output frequency of PLL 200 may change between different frequencies. The PLL 200 is a device where the VCO 208 is locked to a single clock reference signal which is very low but also very clean and very stable and the output frequency can be changed by equivalent steps by controlling the frequency divider 210 in the feedback loop.

FIG. 3 illustrates a simplified drawing of a digital phase/frequency detector 204. A phase detector or phase comparator is a frequency mixer, analog multiplier or logic circuit that generates a voltage signal which represents the difference in phase between two signal inputs. It is an essential element of the phase-locked loop (PLL). A specialized variant that additionally detects frequency is referred to as Phase Frequency Detector (PFD). A phase-frequency detector is an asynchronous sequential logic circuit which determines which of the two signals has a zero-crossing earlier or more often. When used in a PLL application, the lock can be achieved even when it is off frequency. Such a detector has the advantage of producing an output even when the two signals being compared differ not only in phase but in frequency.

The phase/frequency detector 204 compares two input frequencies Fclock and Fout/N. When the two input frequencies are not equal, it acts as a frequency detector and produces one or zeros to produce a voltage control Vt that pushes corresponding VCO 208 in the direction of the reference. In other words, if the VCO 208 is above the reference then the voltage control Vt is high to push the VCO 208 down and vice versa. When the two input frequencies are the same and a frequency lock is achieved, the phase detector 204 acts as a phase detector and compares the two phases and continues to produce an error voltage to control the frequency and phase of the output device.

Figure 4:
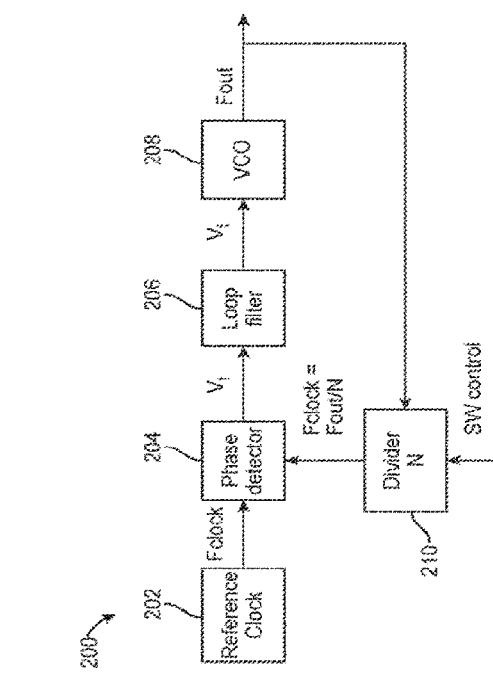
FIG. 4 illustrates an example of an active filter as applied to a general PLL.

FIG. 4 illustrates an example of an active filter as applied to a general PLL 400. The kind of loop filter i.e. passive filter or active filter can be chosen on the basis of specific requirement. A passive loop filter is based on resistors and capacitors only, while an active loop filter is based on an amplifier and a capacitor-resistor network in the feedback system. A passive filter is preferred in cases where, a reference PLL is of a single frequency and will need only a single voltage in order to stay in that single frequency. The other reasons being simplicity, cost and most advantageously no addition of noise, as active devices tend to add additional noise to the system. However, active filters find more acceptance because of the possibility of amplification of the input signal. Amplification is made possible by an operational amplifier employed in the active filter.

The loop filter 206, of FIG. 2, is an active filter that includes an operational amplifier 402 and a capacitor-resistor network 404 in the feedback loop. In some instances, the phase detector 204 of the PLL 200 may produce voltage up to 5 volts but the corresponding VCO 208 may need a voltage of above 5 volts, say, for example, up to 18 volts in order to reach its complete range, so the active filter 206 facilitates not only filtering but also provides the capability to go to higher voltages.

Figure 5:
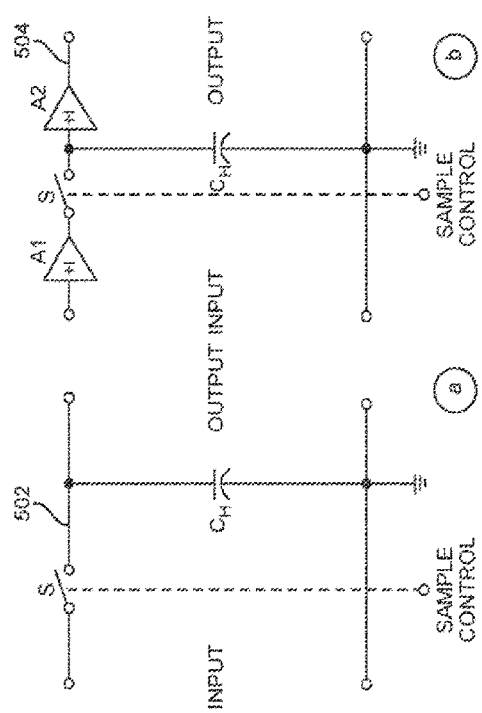
FIG. 5 illustrates the principle of the sample-and-hold mechanism.

FIG. 5 illustrates the principle of sample-and-hold mechanism 500. The first sample and hold circuit 502 includes a switch S and a hold capacitor CH. The operation of the switch S is controlled by the sample control. When the switch S is closed, a voltage sample of the input frequency is sampled and when the switch is opened, the voltage sample is held on the hold capacitor CH.

The second sample and hold circuit 504 includes two buffers A1 and A2 with unity gain for isolation purposes, in addition to the switch S and the hold capacitor CH. The buffer A2 is preferably an electronic buffer, so that the hold capacitor CH does not discharge parasitically between consecutive samples. In other words, the hold capacitor CH holds the voltage between samples.

Figure 6:
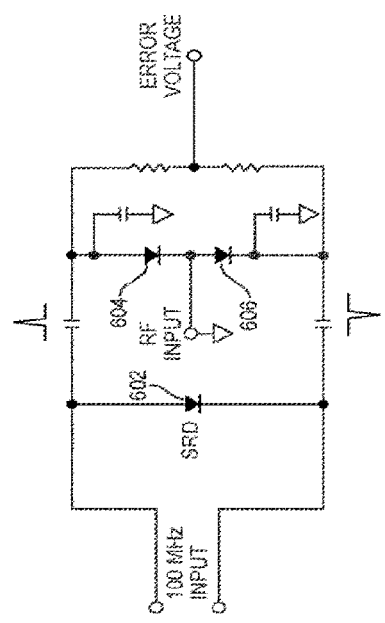
FIG. 6 illustrates a schematic of the step recovery diode as comb generator feeding the dual Schottky diode that acts as phase detector.

FIG. 6 illustrates an example of practical implementation of a comb generator and sampling phase detector. The schematic shows a Step Recovery Diode (SRD) as comb generator feeding the dual Schottky diode that acts as a phase detector. The implementation of circuit 600 including a Step Recovery Diode (SRD) 602 as a comb generator and the dual Schottky diodes 604 and 606 as a phase detector.

The input to the circuit 600 in this example is a clock input of 100 MHz sine wave. The SRD 602 is a special device that turns the 100 MHz sine wave input into a very narrow pulse train of the same frequency, so it acts as a comb generator. The two Schottky diodes 604, 606 acts as switches and act as sampling switches. The RF voltage (output from the corresponding VCO) to be sampled is connected to a point between the two diodes 604 and 606. The SRD 602 creates an output of positive and negative pulses. The positive and negative pulses act as control signals to the diodes 604 and 606 that act like switches. The sampled voltage output is an error DC voltage which is created by sampling the RF input through the dual Schottky diodes 604 and 606. The output of the RF signal is sampled whenever the diodes 604 and 606 are opened by the narrow pulses coming from the SRD 602. The voltage sample is held on the capacitors C following the diodes 604 and 606.

Figure 7:
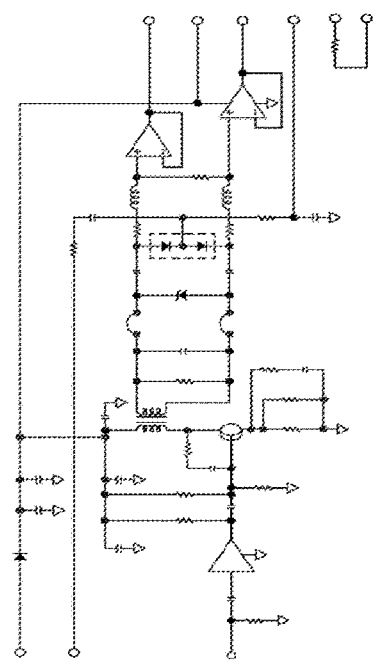
FIG. 7 illustrates a complete example schematic of the comb generator and sampling phase detector with RF preamplifier and two DC buffers following the phase detector.

FIG. 7 illustrates a schematic of the comb generator and sampling phase detector with a clock pre-amplifier and two DC buffers following the phase detector. The voltage samples are held on two very small capacitors (which are basically the input capacitance of the voltage buffers, no need for external capacitors) on both sides of the dual diode pair, so as not to enable the whole capacitor to discharge parasitically between the samples. These capacitors are buffered by a couple of ultra-low input bias current buffers to prevent discharge between samples. The two voltages are summed, fed to a loop filter, whereby the clean Vt is fed to the VCO to control the frequency.

This implementation of sampling phase detector creates an analog phase detector, very similar to a mixer. The analog sampling phase detector has a certain defined locking space or locking distance, and it does not lock from a frequency difference like the phase/frequency digital detector. It has some locking range and only within that locking range, the VCO locks by itself on the reference. In a sampling PLL, the VCO does not lock on the reference, but on the Nth harmonic of the reference. In other words, one can lock a 9

GHz on the 90th harmonic of the 100 Megahertz clock. This is done as the input frequency is sampled every 100 cycles, not every cycle.

This type of product may contain some "search mechanism" to help lock the PLL. The most common one involves a positive feedback on the loop filter itself. While the loop is not locked, the loop filter acts as a very low-frequency oscillator that drives the VCO back and forth across the frequency range. When it passes close enough to the harmonic of the clock, it will lock and stay locked. A nice feature of this mechanism is that it turns off automatically when the loop locks. This happens because of the nature of the loop as a negative feedback system.

However, this type of search mechanism suffers from many problems, its operation is subject to temperature changes and it makes this product difficult to produce, tune and sell successfully.

FIG. 8 illustrates a phase-noise plot 800 of an example free running Voltage Control Oscillator (VCO) in the frequency domain (spectrum analyzer), without being locked in a PLL. As said before, Phase-noise is a key element in many RF and radio communications systems as it can significantly affect the performance of systems. Phase-noise is the frequency domain representation of rapid, short-term, random fluctuations in the phase of a waveform, caused by time domain instabilities also referred to as "jitter".

For example, in the frequency domain, where the scales are amplitude vs. frequency, ideally, a frequency of 100 MHz may look like a single line staying at exactly 100 MHz However, practically with modern equipment in the laboratory, amplitude vs frequency may not look like a single line but it will look like a single line with a "skirt" 802 which goes wider and wider as we go down. The phase-noise plot 800 looks like the skirt 802 on the left and the right of the exactly desired frequency $f_o$. The quality, height, width of the skirt 802 determines how the phase-noise may affect the system or the performance of the system. So, it is desirable to minimize phase-noise as much as possible is to improve the system performance.

Phase-noise is another term to describe short-term frequency stability. The signal generated by a frequency source is never practically "clean". Its frequency is never absolutely stable at the desired value. It has "Phase-noise" which is frequency shifting, i.e. small frequency shifts at different rates and different amplitudes of the main frequency. It changes around the center set frequency fo at different rates and amplitudes. In the time domain, the phase-noise may be referred to as jitter. Long-term frequency stability is the drift of the center frequency over time or over temperature.

FIG. 9 illustrates a phase-noise plot 900 of an example Voltage Control Oscillator (VCO) in the frequency domain (spectrum analyzer), compensated by being locked in a PLL.

The upper line 904 is the free running VCO phase-noise, before it is locked in a PLL, and the lower line 902 is the shaped VCO phase-noise. In the PLL, the principle of locking the VCO to a reference frequency attenuates the phase-noise of the VCO, in an amount related to the loop bandwidth. Outside the loop bandwidth, the VCO noise remains almost same as the phase-noise without the PLL, while inside loop bandwidth it is attenuated more and more as offset frequency from the main carrier is reduced. At very high frequency, i.e. above the loop bandwidth, the locking almost has no effect, as the phase detector correction signal is not fast enough to reach the VCO for very fast changes or very fast disturbances. However, inside the loop bandwidth or at low frequencies, the compensated phase-noise of the VCO is much lower than that of the free running VCO. All the frequencies that are close to the center of the frequency fo are easy to detect and compensate.

FIG. 10 illustrates two plots 1000: (a) a simulation of phase-noise of an example PLL, and (b) an actual measurement. FIG. 10 (a) illustrates a simulation graph of phase-noise of an example PLL. The simulation graph shows the overall phase-noise of the example PLL and includes the contribution of all the components that contribute to the phase-noise. The simulation graph illustrates first, second and third regions 1002, 1004 and 1006 of the phase-noise. The first region 1002 which is very close to the carrier depicts a steep line which basically comes from the reference clock such as the Temperature Controlled Crystal Oscillator (TCXO, or other reference clock device). The first region depicts the noise of the TCXO, multiplied by 20 log N, where N is the ratio of output frequency to the clock frequency. The second region 1004 depicts a flat phase-noise which is basically the noise floor of the digital phase detector multiplied by the same ratio of 20 log N. The third region 1006 depicts a steep line which is the inherent VCO phase-noise not affected by the loop bandwidth and locking phenomenon. The dashed line 1008 depicts the VCO "corrected" phase-noise inside loop bandwidth. Below the flat area, the compensated VCO phase-noise does not affect the overall result because it is way below the noise floor of the phase detector multiplied by that ratio. The actual measurement of phase-noise of an example PLL is illustrated in FIG. 10 (b). One can see clearly the similarity between the two curves.

FIG. 10 illustrates a phase-noise plot 1100 of a closed loop PLL, showing clearly the effect of the phase detector multiplication number 20*LOG(N) within loop bandwidth. The phase-noise plot 800 illustrates phase-noises on both sides of the carrier frequency fo, where the left side is a mirrored image of the right side. The phase-noises on both sides of the carrier fo look like it is passing through a band-pass filter.

As illustrated, on both sides, the in-band phase-noise inside the loop bandwidth is flat in shape and is equal to the phase detector and/or the reference clock noise multiplied by 20 log N. At the point of the loop bandwidth, the phase-noise goes up before going down again. This is due to the addition of 3 dB due to a combination of phase-noise of the free running VCO and the phase detector. The upper straight line 1102 depicts a phase-noise contributed by the phase detector at N1 and the lower straight line 1104 depicts a phase-noise contributed by the phase detector at N2. It can be seen that there is the difference in phase-noise in the flat area, due to two different "N" numbers. The phase detector contributes a higher in-band phase-noise at a higher value of N.

Thus, in order to achieve low phase-noise, it is essential to: a) choose components such as phase detector and reference clock with the lowest inherent phase-noise possible, and b) lower the ratio number N as much as possible.

FIG. 11 illustrates plot 12902200 of measurement in terms of phase-noise in 1 Hz bandwidth at a Δf offset frequency from the carrier. The phase-noise expression is usually in dBc, i.e. dB relative to the carrier c power level Ps, in other words how low it is compared to the carrier per Hz, in a bandwidth of 1 Hz. That is basically the term that is used for phase-noise, dBc per Hertz (dBc/Hz) at a certain Δf from the carrier.

As an example for the measurement method, suppose ΔF is 10 KHz, the phase-noise power level Pss is measured at the level of −70 dBm on the spectrum analyzer, and the carrier power level Ps is measured at the level of 10 dBm, the ratio between the Ps 10 dBm and the PssB −70 dBm at 10 KHz from the carrier is therefore 80 dB, so the phase-noise at 10 KHz offset from carrier and is −80 dBc/Hz.

For many systems, the important parameter to evaluate performance is not the phase-noise measured at a single frequency offset from the carrier, but the integrated phase-noise from one offset frequency to another one. Following are four different equations and terms to define integrated phase-noise:

$$\int L(f)df$$

$$S_{phi}(f) = \left(\frac{180}{\pi}\right) \cdot \sqrt{2 \cdot \int L(f)df}$$

$$S_{nu}(f) = \sqrt{2 \cdot \int L(f) \cdot f^2 df}$$

$$S_y(f) = \left(\frac{S_{nu}(f)}{f_{osc}}\right)$$

Where the first equation describes single sideband phase-noise [dBc]

The $2^{nd}$ equation describes the spectral density of phase modulation, also known as RMS phase error (degrees)

The $3^{rd}$ equation describes the spectral density of frequency fluctuations, also known as RMS frequency error or residual FM (Hz)

The $4^{th}$ equation describes the spectral density of fractional frequency fluctuations For example, the first equation defines the Phase-noise in dBc. It can be translated by the 2nd equation to degrees (relevant in respect of learning modulation schemes). As per further equations, the phase-noise can also be translated in terms of Hz and time domain phase jitter seconds.

FIG. 13 illustrates a general block diagram 1300 of an example dual loop PLL. The main target of the dual loop design is to reduce the multiplication number N in the main PLL.

The dual loop PLL 1300 includes an upper PLL 1302, referred to as a main PLL 1302, and a lower PLL 1304, referred to as a reference PLL 1304, a TCXO 1306 operating as a master clock, feeding a clock signal Fc to both the primary PLL 1302 and the reference PLL 1304.

The reference PLL 1304 includes a first phase detector 1314, and a single frequency first VCO 1316 that operates at a reference frequency Fr. The reference frequency Fr is fed to the first input of a down convert mixer 1312.

The main PLL 1302 includes a second phase detector 1308 and a second VCO 1310 that generates an output frequency range from F1 to F2. A sample of the output frequency range F1 to F2 is fed to the second input of the down-convert mixer 1312 and mixed with a single reference frequency Fr. The output from the down-convert mixer 1312 is at a much lower frequency (F1 to F2)−Fr. This lowered frequency is fed back to the second phase detector 1308 through a frequency divider 1318 of value N1.

Therefore: a) Without the down-convert mixer 1412: F1 to F2=N×Fc, b) With the down-convert mixer 1312: (F1 to F2)−Fr=N1×Fc. As a result, there is a reduction in the number N: N1N=((F1 to F2)−Fr)/(F1 to F2).

The N1 number is basically the division number that the frequency divider 1318 will use to divide the output of the mixer 1312 and feed to the second phase detector 1308. The value of N1 is set as minimal, as the output from the mixer 1312 is at a much lower frequency than original frequency range F1 to F2.

To give an example: a) Suppose Fc=1 MHz, b) Suppose F1 to F2=10,000 to 11,000 MHz Then N=10,000 to 11,000. Now If Fr=9000 MHz, then ((F1−F2) Fr)=1000 to 1900 MHz Then N1=1000 to 1900. Thus, the value of N is reduced from 11,000 to 1900. In dB, it is a ratio of 15 dB. This means, that the phase-noise is reduced by a factor of 15 dB.

The disadvantage of the example dual loop design is that while nicely reducing the number N in the main PLL, the reference PLL, containing a digital phase/frequency detector becomes the main factor contributing to the overall output phase-noise.

FIG. 14 illustrates a general block diagram 1400 of an example sampling PLL. The sampling PLL 1400 includes a TCXO 1402, a comb generator 1404, a sampling phase detector 1406, a loop filter 1408, and a VCO 1410. The sampling PLL 1400 does not include digital phase/frequency detector and a frequency divider. Thus, no digital noise floor is generated that can be multiplied and affect the performance of the system.

The TCXO 1402 feeds the clock signal Fclock to the comb generator 1404. The comb generator 1404 is a device that changes the input sine wave signal at frequency Fclock to an output signal of very narrow pulses at the same frequency as the input sine wave signal.

The pulse output from the comb generator 1404 is used as a control signal to the sampling phase detector 1406. The sampling phase detector 1406 receives an RF signal of frequency Fout from the VCO 1410 and includes two diodes acting as switches to sample the RF signal by opening and closing the diodes based on the narrow pulses from the comb generator 1404. The sampled voltage Vt produced is "held" on capacitors and buffered until the next sample period. The voltage samples are always at the same level; thus, a DC voltage Vt is generated by the sampling phase detector 1406. The loop filter 1408 cleans and filters the DC voltage Vt and provides it to the VCO 1410 to control the VCO frequency Fout. Fout=Fclock*N, where N is the Nth spectral harmonic line in the "comb" spectrum.

FIG. 15 illustrates block diagram 1500 depicts how the impulse or "comb" generator 1404 changes a wave shape of a signal from sine wave 1502 to narrow pulses in 1504. A frequency source 1506 generates the input sine wave 1502 of frequency F1 and time period T1.

The comb generator 1404 turns the input sine wave 1502 to a series of very narrow pulses 1504 with same time period T1, and a pulse bandwidth as tp in the time domain. For example, if the frequency of input sine wave 1502 is 100 MHz, then the impulse train generator 1508 generates a series of very sharp narrow pulses 1504 of the same frequency.

FIG. 16 illustrates an example output 1600 of a comb generator 1404 in the frequency domain. In the frequency domain (spectrum analyzer screen), the output 1600 of the comb generator 1404 looks like a "comb", i.e. a row of lines extending up to very high frequency. In theory, if the bandwidth of the clock pulse is infinitesimal, the row of lines appears with equal amplitude to infinity. The output 1600 looks like a series of lines, with the spacing between the lines same as the initial frequency. In an example, if the initial frequency is 1 GHz, the spectrum of lines is 1 GHz apart.

FIG. 17 illustrates a block diagram 1700 of an ultra-low phase-noise frequency synthesizer as suggested in a first embodiment. The ultra-low phase-noise frequency synthesizer 1700 includes two Phase Lock Loops (PLLs). One is a main PLL 1710 and the other one is a reference PLL 1718.

The main PLL 1710 comprises a high-frequency low noise Direct Digital Synthesizer (DDS) 1702 to generate at least one clock signal Fc2 of the variable frequency range. The high-high-high-frequency low noise DDS 1702 generates the at least one clock signal Fc2 of variable frequency range by taking input from at least one software controllable instructions and at least one DDS clock signal. The frequency of the at least one clock signal Fc2 is always lower than the frequency of the at least one DDS clock signal. The at least one DDS clock signal is generated by a first fixed frequency divider 1714. The high-frequency low noise DDS 1702 forwards the generated at least one clock signal Fc2 of variable frequency range towards a Digital Phase Frequency Detector 1704.

The Digital Phase Frequency Detector 1704 compares two signals coming from two directions and generates at least one signal. One signal is the at least one clock signal Fc2 of variable frequency range generated by the high-high-high-frequency low noise DDS 1702. The second signal is at least one signal of frequency Fif/N1 generated by a second fixed frequency divider 1712. The Digital Phase Frequency Detector 1704 compares these two signals and generates at least one first control voltage Vt1 and forwards it towards a primary Voltage Control Oscillator (VCO) 1706. The primary Voltage Control Oscillator (VCO) 1706 generates at least one output signal of frequency Fout from the received at least one first control voltage Vt1. The main PLL 1710 further comprises a down convert mixer 1716.

The primary role of the reference PLL 1718 is to help the main PLL 1710 in reducing the phase-noise present in the at least one output signal Fout. The reference PLL 1718 comprises a reference clock (for example a Temperature Compensated Crystal Oscillator (TCXO)) 1724 to generate at least one first clock signal of a fixed single frequency Fc1. Further, the reference PPL comprises a sampling phase detector 1722 (that includes the comb generator and the sampling phase detector) to generate at least one-second control voltage Vt2 and a reference Voltage Control Oscillator (VCO) 1720.

One important thing to notice here is that unlike other dual loop designs, the reference PLL 1718 uses the sampling phase detector 1722. The reference PLL 1718 does not use kind digital devices like the Digital Phase Frequency Detector 1704, or the first fixed frequency divider N1 1714. Simultaneously the reference clock 1724 present in the sampling PLL 1718 is also a very low noise generating device. Due to these reasons, the contribution of phase-noise from the reference PLL 1718 to the main PLL 1710 becomes close to negligible. The reference Voltage Control Oscillator (VCO) 1720 generates at least one reference signal Fr and forwards it towards the down-convert mixer 1716. The reference PLL 1718 plays a major part in all relevant communications and similar systems by being part of various frequency synthesizers, and also as a standalone frequency source for all the systems of up and down conversion processes in the same equipment.

The down-convert mixer 1716 receives at least one reference signal of frequencies Fr and at least one output signal of frequency Fout and generates at least one intermediate signal of frequency Fif and forwards it towards a second fixed frequency divider 1712. The second fixed frequency divider 1712 generates at least one signal of frequencies Fif/N1 by dividing the incoming at least one signal of frequency Fif by a predefined factor. The second fixed frequency divider 1712 forwards the generated at least one signal of frequencies Fif/N1 towards the Digital Phase Frequency Detector 1704. The primary VCO 1706 forwards the at least one output signal Fout towards a fixed frequency multiplier 1708 to generate at least one final output signal Fout final.

It is important to notice that frequency divider 1712 is optional and the main PLL can operate without division of Fif.

To explain the above-disclosed disclosures with an example let's say the reference clock 1724 generates the at least one first clock signal of a fixed single frequency Fc1 100 MHz. The sampling phase detector 1722 generates the second control voltage Vt2 by sampling the at least one first clock signal of a fixed single frequency Fc1 100 MHz and forwards the sampled values of the at least one first clock signal of a fixed single frequency Fc1 100 MHz towards the reference Voltage Control Oscillator (VCO) 1720. The reference Voltage Control Oscillator (VCO) 1720 generates the at least one reference signal Fr and forwards it towards the down-convert mixer 1716. In an example, the reference VCO 1720 generates a frequency of 9.4 GHz.

In the example, the first frequency divider 1714 divides the generated reference signal of frequency 9.4 GHz by a predefined factor of 3 to generate the at least one DDS clock signal. The high-high-frequency low noise DDS 1702 receives the at least one DDS clock signal, and based on the at least one software controllable instructions, generates the at least one clock signal Fc2 of the variable frequency range from 0.1 GHz to 0.225 GHz.

In the example, the primary VCO 1706 generates the at least one output signal of frequency Fout ranging from 9.5 GHz to 9.625 GHz. The down-convert mixer 1716 mixes the at least one output signal of frequency Fout ranging from 9.5 to 9.625 GHz with the reference signal Fr at frequency 9.4 GHz to generate the at least one intermediate signal Fif having frequency ranges from 0.1 GHz to 0.225 GHz. Since the at least one clock signal Fc2 ranges from 0.0.1 GHz to 0.225 GHz, the second fixed frequency divider 1712 is set to divide the at least one intermediate signal Fif by a predefined factor of 1, (which means practically no divider needed in this case) to generate the at least one signal of frequencies Fif/2 ranging from 0.1 GHz to 0.225 GHz.

The fixed frequency multiplier 1708 multiplies the at least one output signal Fout ranging from 9.4 GHz to 9.625 GHz by a predefined factor of 8 to generate the at least one final output signal Fout final ranging from 76 GHz to 77 GHz. It is easier and relatively inexpensive to implement the chip design of the frequency synthesizer 1700 for output frequencies 9.4 GHz to 9.625 GHz, and then multiply the at least one output signal Fout by 8 to generate the at least one final output signal Fout final in the range of 76 GHz-77 GHz.

The down-convert mixer 1716 lowers the frequency of the at least one output signal Fout, to reduce the ratio of the frequencies of the second clock signal and the feedback signal. Instead of feeding the at least one output signal Fout directly to the Digital Phase Frequency Detector 1704, it is mixed down to create at least one signal with a much lower frequency and obtain a much lower value of the second fixed frequency divider 1712 or it is not needed as in this example.

As the primary phase-noise present in the ultra-low phase-noise frequency synthesizer 1700 is due to the product of the noise present in the high-frequency DDS 1702 and the second fixed frequency divider 1712, the less the value of the second fixed frequency divider 1712 will be, the less will be the generated phase-noise in the ultra-low phase-noise frequency synthesizer 1700. Therefore, when the second fixed frequency divider 1712 is equal to 1, the DDS signal noise is multiplied by the number 1 which means it is transferred as is to the output and this achieves a very ultra-low noise.

The reduction in the ratio of the frequencies leads to a reduction in a phase-noise of the final output signal Fout final. The comparison frequency is much lower, so that the number N by which the noise is multiplied inside the main PLL 1710 is much lower. In an example, the even if the ratio of second fixed frequency divider=2 reduces the phase-noise of the final output signal Fout final by a factor of 20-40 dB compared to a single PLL design. For example, phase-noise at 100 KHz Δf from the carrier with standard PLL synthesizers is approximately −106 dBc/Hz. With the proposed frequency synthesizer 1700, the phase-noise at 100 KHz Δf from the carrier could be in the range of −130-135 dBc/Hz, causing a significant improvement of 24-29 dBs To summarize, the drastic improvements achieved in reducing phase-noise in the ultra-low phase-noise frequency synthesizer 1700 is based on the following: a) use of Dual PLL approach to reduce the multiplication number N2, b) use of sampling PLL 1718 as the reference PLL, to make its noise contribution and reference PLL phase-noise negligible, c) use of DDS 1702 to provide low noise, high frequency input to the main PLL 1710, and d) use of high-frequency Digital Phase Frequency Detector 1704 in the main PLL 1710.

In this embodiment, the ultra-low phase-noise frequency synthesizer 1700 is implemented in form of a module. In another form of this embodiment, this design of the ultra-low phase-noise frequency synthesizer 1700 can be implemented not only as a part of the big module, but also as an independent, separate chip, which can become a part of the front-end module of a RADAR transceiver. The synthesizer can be implemented in an advanced technology for example but not limited to, like SiGe or GaAs.

FIG. 18 illustrates a block diagram 1800 of an ultra-low phase-noise frequency synthesizer as suggested in a second embodiment. The low phase-noise frequency synthesizer 1800 includes two Phase Lock Loops (PLLs). One is a main PLL 1812 and the other one is a reference PLL 1818. In this embodiment, the ultra-low phase-noise frequency synthesizer 1800 comprises one single reference clock (for example a Temperature Compensated Crystal Oscillator) 1802 which provides input clock signals to both the main PLL 1812 and the reference PLL 1818.

The main PLL 1812 comprises of a Fractional-N synthesizer chip 1804, a primary Voltage Controlled Oscillator (VCO) 1810 and a down convert mixer 1816. The Fractional-N synthesizer chip 1804 includes a high-frequency Digital Phase Detector 1806 and a software controllable variable frequency divider N1 1808.

The reference clock 1802 forwards the generated at least one clock signal of fixed frequency Fc towards the high-frequency Digital Phase Detector 1806 which is located inside the Fractional-N synthesizer chip 1804. On one hand, the high-frequency Digital Phase Detector 1806 receives the at least one clock signal of fixed frequency Fc. On the other hand, the high-frequency Digital Phase Detector 1806 receives at least one signal of frequency Fif/N1 generated by the software controllable variable frequency divider N1 1808. The high-frequency Digital Phase Detector 1806 compares these two signals, generates at least one first control voltage Vt1 and then forwards the generated at least one first control voltage Vt1 towards the primary VCO 1810. The primary VCO 1810 generates at least one output signal of frequency Fout from the received at least one first control voltage Va.

The primary role of the reference PLL 1818 is to help the main PLL 1812 to reduce the phase-noise present in the at least one output signal Fout. The reference PLL 1818 comprises a sampling phase detector 1822 and a reference Voltage Control Oscillator (VCO) 191820.

One important thing to notice here is the application of the sampling phase detector 1822. The sampling PLL 1818 does not use kind digital devices like the Digital Phase Detector 1806, or the software controllable variable frequency divider N 1808. Due to these reasons, the contribution of phase-noise from the sampling PLL 1818 to the main PLL 1812 becomes close to negligible.

The sampling phase detector 1822 receives the same at least one clock signal of fixed frequency Fc generated by the reference clock 1802, generates at least one-second control voltage Vt2 and forwards it towards the reference VCO 191820. The reference VCO 191820 generates at least one reference signal Fr and forwards it towards the down-convert mixer 1816.

The down-convert mixer 1816 based on the received at least one reference signal of frequency Fr and the at least one output signal of frequency Fout generates at least one intermediate signal of frequency Fif and forwards it towards the software controllable variable frequency divider N1 1808 located inside the Fractional-N synthesizer chip 1804. The software controllable variable frequency divider N1 1808 generates at least one signal of frequencies Fif/N1 by dividing the incoming at least one intermediate signal of frequency Fif by at least one variable value of N1. The Fractional-N synthesizer chip 1804 varies the value of N1 by executing appropriate software instructions. The software controllable variable frequency divider N1 1808 then forwards the generated at least one signal of frequency Fif/N1 towards the Digital Phase Detector 1806.

The primary VCO 1810 forwards the at least one output signal Fout towards a first fixed frequency multiplier 1814 and generate at least one final output signal Fout final by multiplying the at least one output signal Fout by a predefined factor.

To explain the second embodiment with an example let's say the reference 1802 generates the at least one clock signal of fixed frequency Fc 100 MHz to Both the main PLL 1812 and the reference PLL 1818. The phase-noise of the reference PLL 1818 is generally very low due to the principle of sampling and also to the presence of the input reference clock 1802 which is itself a very low noise generating device.

The sampling phase detector 1822 generates the second control voltage Vt2 based on the at least one clock signal of fixed frequency Fc 100 MHz and forwards the second control voltage Vt2 towards the reference VCO 191820. The reference VCO 191820 generates at least one reference signal Fr and forwards it towards the down-convert mixer 1816. In an example, the reference VCO 191820 generates reference signals of frequency 9.4 GHz.

In the example, the primary VCO 1810 generates the at least one output signal of a frequency Fout ranging from 9.5 GHz to 9.6257 GHz. The down-convert mixer 1816 mixes the at least one output signal of frequency Fout ranging from 9.5 GHz to 9.625 GHz with the reference signal of frequency 9.4 GHz to generate the at least at least one intermediate signal of frequency Fif ranging from 0.1 GHz to 0.225 GHz.

Based on the at least one clock signal of fixed frequency Fc, the Fractional-N synthesizer chip 1704 determines the value of the software controllable variable frequency divider N 1708, so as to generate at least one feedback signal of frequency Ff=Fif/N1.

The frequency range 9.5 GHz to 9.625 GHz easier and relatively inexpensive to implement the chip design of the low phase-noise frequency synthesizer 1800, and then multiply the output frequencies by 8 in frequency multiplier 1814 to obtain the final output frequencies in the range of 76 GHz-77 GHz.

The down-convert mixer 1816 lowers the frequency of the output signal Fout, to reduce a ratio of frequencies of the second clock signal and the feedback signal. Instead of feeding the output frequency Fout directly to the Digital Phase Detector 1806, it is mixed down to create a much lower frequency, and thus a much lower value of N1. A reduction in the ratio of the at least one clock signal of frequency Fc and the at least one feedback signal of frequency Ff leads to a reduction in a phase-noise of the final output signal Fout final. The feedback frequency is lowered down, so that the number N1 by which the noise is multiplied inside the main PLL 1812 is also lowered down. If the output frequency Fout is in the range of 9.5 GHz, and it has to be compared with a clock of 100 MHz, the ratio N of 9.5 GHz and 100 MHz is around 95, but if the output frequency Fout is mixed down to about 0.2 GHz by the down-convert mixer 1816, then the ratio NT of 0.2 GHz and 100 MHz maybe only 2 instead of 95 thereby significantly reducing the phase-noise of the low phase-noise frequency synthesizer 1800.

The improvement in the phase-noise of the low phase-noise frequency synthesizer 1800 is based on following: a) use of dual PLL to reduce the multiplication number N, b) use of sampling PLL 1818 as the reference PLL to make its noise contribution negligible, c) use of high frequency low noise reference clock 1802 to provide high frequency input to the main PLL 1812, d) use of high frequency Fractional-N synthesizer 1814 in the primary PLL 1806.

In this second embodiment, the ultra-low phase-noise frequency synthesizer 1800 is implemented in form of a module. In another form of this embodiment, this design of the ultra-low phase-noise frequency synthesizer 1800 can be implemented not only as a part of the big module, but also as an independent, separate chip, which can become a part of the front-end module of a transceiver. The ultra-low phase-noise frequency synthesizer 1800 can also be implemented in advanced technology for example like SiGe or GaAs.

FIG. 19 illustrates a block diagram 1900 of the sampling Phase Lock Loop (PLL) system as suggested in a third embodiment. The sampling PLL system 1900 includes a Temperature Compensated Crystal Oscillator (TCXO) 1902 as an example of the reference clock, a comb generator 1904, a sampling phase detector 1906, a two-way DC switch 1908, a loop filter 1910, a Voltage Controlled Oscillator (VCO) 1912, and a Digital Phase Frequency Detector 1914. The TCXO 1902 is configured to generate at least one clock signal of frequency Fc z, which is applied to both of the comb generator 1904 and the Digital Phase Frequency Detector 1914. The sampling PLL system 1900 contains two PLL loops. One is a Sampling PLL loop 1916 and the other is a Digital PLL loop 1918.

The principle of operation in this embodiment is this: Initially, the two-way DC switch 1908 remaining closed with the Digital Phase Frequency Detector 1914. Due to this only the Digital PLL loop 1918 is remains operational and the VCO 1912 gets locked to the at least one clock signal of frequency Fc generated by the reference clock TCXO 1902. The Digital Phase Frequency Detector 1914 also generates at least one lock detect signal Vld.

Once VCO 1912 gets locked to the at least one clock signal of frequency Fc generated by the reference clock TCXO 1902, the at least one lock detect signal Vld generated by the Digital Phase Frequency Detector 1914 changes the two-way DC switch 1908 to the Sampling PLL loop 1916. Due to this the Sampling PLL loop 1916 gets closed and the Digital PLL loop 1918 gets opened. Since the VCO 1912 is already locked at the correct frequency, the Sampling PLL loop 1916 will remain closed. One important thing to notice here is that the loop filter 1910 is common to both the Sampling PLL loop 1916 and the Digital PLL loop 1918. As the loop filter, 1910 is made up of a plurality of resistors and capacitors which are charged to the right tuning voltage Vt which is applied to the VCO 1912. When the Sampling PLL loop 1916 gets closed and the Digital PLL loop 1918 gets opened, the plurality of resistors and capacitors present in the loop filter 1910 do not change their tuning voltages in that step. In other words, the Digital PLL loop 1918 is used to lock the VCO 1912 with the exact right frequency generated by the TCXO 1902 and the Sampling PLL loop 1916 is used to achieve low phase-noise.

The two-way DC switch 1908 is configured to be switched between the sampling phase detector 1906 and the Digital Phase Frequency Detector 1914 based on a status of the lock detect signal Vld generated by the Digital Phase Frequency Detector 1914. For example, the two-way DC switch 1908 is configured to be connected to the Digital Phase Frequency Detector 1914 when the lock detect signal Vld is low and configured to be connected to the sampling phase detector 1906 when the lock detect signal Vld is high.

In the third embodiment, when the lock detect signal Vld is low, the two-way DC switch 1908, the loop filter 1910, the VCO 1912 and the Digital Phase Frequency Detector 1914, form a Digital PLL loop 1918. Whereas, when the lock detect signal Vld is high, the comb generator 1904, the sampling phase detector 1906, the two-way DC switch 1908, the loop filter 1910, and the VCO 1912 forms a sampling PLL loop 1916.

As said, initially, the two-way DC switch 1908 is connected to the Digital Phase Frequency Detector 1914, as the lock detect signal Vld is low due unlock state. In the Digital PLL loop 1918, the Digital Phase Frequency Detector 1914 generates a first DC output signal Vtd based on a comparison of the at least one clock signal of frequency Fc, and at least one output signal of frequency Fr, the loop filter 1910 filters the first DC output signal Vtd and generates the control voltage Vt, and the VCO 1912 generates the output signal frequency based on the control voltage Vt. In an example, the VCO 1912 is configured to generate either an output signal of frequency Fr of 11.75 GHz or 12.75 GHz chosen by software control to the Digital PLL loop 1918.

As soon as the Digital PLL loop 1918 is locked at the output frequency Fr, the lock detects signal Vld turns high, the two-way DC switch 1908 disconnects from the Digital Phase Frequency Detector 1914 and connects to the sampling phase detector 1906, forming the sampling PLL loop 1916.

So once locked, the lock detector signal Vld from the Digital Phase Frequency Detector 1914 controls the two-way DC switch 1908 to switch to the sampling PLL 1916. The loop filter 1910 contains plurality of capacitors and resistors that are already charged to the correct tuning voltage Vt of the VCO 1912, and since voltage on the plurality of capacitors and resistors cannot change in a "jump", there would not be a transient, and the VCO 1912 may continue receiving the same control voltage Vtd. The sampling PLL system 1900 remains locked at the same frequency but now through the sampling phase mechanism.

In the Sampling PLL loop 1916, the comb generator 1904 receives the at least one clock signal of frequency Fc and generates at least one comb signal Fcomb. The at least one comb signal Fcomb is basically a plurality of narrow pulses, which are repeating at the same frequency Fc which is the frequency of the at least one clock signal generated by the TCXO 1902. The sampling phase detector 1906 after receiving the at least one comb signal Fcomb generates a second DC output signal Vts based on the at least one comb signal Fcomb. The loop filter 1910 generates the control voltage Vt based on the second DC output signal Vts and the VCO 1912 remains locked at the output frequency Fr based on the control voltage Vt.

At the execution of lock by the Digital Phase Frequency Detector 1914, the first DC output signal Vtd becomes equal to the second DC output signal Vts. Further, the loop filter 1910 is common to the sampling PLL loop 1916 and the Digital PLL loop 1918 so as to maintain a similar control voltage Vts while switching from the Digital PLL loop 1918 to the sampling PLL loop 1916 and vice versa.

Another feature is that if by a chance, the sampling PLL loop 1910 loses a lock with the phase of the clock signal, the lock detects signal Vld, which is still active, turns low to re-connect the two-way DC switch 1908 to the Digital Phase Frequency Detector 1914 to enable re-locking of the Digital PLL loop 1918 to the clock signal.

In this embodiment, the sampling PLL system 1900 is implemented in an independent chip form, with digital circuits replacing analog functions. The sampling PLL system 1900 may also be implemented as a block on a system on chip (SoC) or as a part of a module. The sampling PLL system 1900 may also be used in the ultra-low phase noise frequency synthesizers 1700 and 1900.

In this embodiment, the Digital PLL loop 1918 always locks at the correct frequency as the Digital PLL loop 1918 is software controlled to lock at a right frequency. The Digital Phase Frequency Detector 1914 is always able to lock from a distance regardless of how far away initially the VCO 1912 is from the reference clock Fc. Thus, use of the Digital PLL loop 1918 in the sampling PLL system 1900 overcomes the problem of the sampling PLL loop 1916 not being able to lock outside the lock range. The Digital PLL loop 1918 is used to lock the VCO 1912 on the right frequency and then switch to the sampling PLL loop 1916 to achieve the low noise. It also enables the system to operate with a wideband RF VCO 1912 with the assurance that it will lock at the correct frequency. It eliminates the unreliable search mechanism and assures lock under all conditions and temperature conditions by providing true lock detect indication. The presence of Digital Phase Frequency Detector 1914 enables the use of wideband VCO 1912 in the sampling PLL loop 1916, as the Digital Phase Frequency Detector 1914 is able to lock the VCO 1912 at the desired frequency. The sampling PLL system 1900 offers a significant improvement over other product and is highly useful as one of the most important building blocks for ultra-low noise synthesizers.

In the sampling PLL loop 1916, there is no digital noise floor and the reference clock Fc determines the overall phase-noise, as this is the only factor that is translated to the output frequency by 20 log N.

Advantages of the sampling PLL system 1900: a) It enables the sampling PLL 1916 to operate with a wideband RF VCO with assurance that it will lock at the correct frequency, b) It eliminates the unreliable search mechanism and assures lock under all offset and temperature conditions, c) It provides true lock detect indication, d) Reliable improved operation and performance of the sampling PLL 1916, e) Ultra-low noise, f) Highly reliable, g) Having vastly improved performance, h) Easy to manufacture and use, i) Operational in a broadband RF range, and j) Implementable in a chip form.

FIG. 20 illustrates an example of a phase-noise simulation plot 2000 contributed by a DDS chip in accordance with the first embodiment of the present invention. The two-dimensional phase-noise simulation plot 2000 comprises of an ordinate (vertical axis) disclosing Phase-noise (dBc/Hz) 2002 and one abscissa (horizontal axis) disclosing Frequency (Hz) 2004. The phase-noise simulation plot 2000 discloses four phase-noise plots corresponding to four input frequencies which are 1396 MHz 2006, 696 MHz 2008, 427 MHz 2010 and 171 MHz 2012 generated by the single DDS chip.

In the first embodiment of the present disclosure as disclosed above in FIG. 17, the DDS 1702 element generates at least one clock signal Fc2 of a variable frequency range of 0.1 GHz to 0.225 GHz. Correlating this variable frequency range of 0.1 GHz to 0.225 GHz applicable in the first embodiment of the present disclosure with the DDS phase-noise simulation plot 2000, it becomes evidently clear that even in worst case scenario the DDS phase-noise contribution in the first embodiment of the present disclosure stays in between the 427 MHz 2010 and the 171 MHz 2012 which is in between −125 dBc/Hz and −120 dBc/Hz which is really very low.

FIG. 21 illustrates a phase-noise simulation plot 2100 contributed by the main PLL 1710 in accordance with the first embodiment of the present disclosure. The two-dimensional phase-noise simulation plot 2100 comprises of an ordinate (vertical axis) disclosing Phase-noise (dBc/Hz) 2102 and one abscissae (horizontal axis) disclosing Frequency (Hz) 2104. The phase-noise simulation plot 2100 discloses the phase-noise contributed by the main PLL 1710 as disclosed in the first embodiment of the present disclosure in FIG. 17. It is evidently visible that the phase-noise simulation plot 2100 has multiple contributors. The two most important contributors of phase-noise in the phase-noise simulation plot 2100 are the primary VCO 1706 and the DDS 1702 as discussed in FIG. 17.

A phase-noise plot 2108 is the contribution of the primary VCO 1706 in the phase-noise simulation plot 2100. As the primary VCO 1706 belongs to the main PLL 1710, the main PLL 1710 attenuates the phase-noise 2108 coming from the primary VCO 1706 to quite an extent. This attenuation is clearly visible in the phase-noise simulation plot 2100.

The other primary contributor in the phase-noise simulation plot 2100 is the phase-noise coming from the DDS 1702 present in the first embodiment of the present disclosure. A phase-noise plot 2112 is the contribution of the DDS 1702 into the main PLL 1710. The phase-noise plot 2112 is titled as XTAL in the phase-noise simulation plot 2100. This phase-noise plot 2112 is the contribution of the DDS 1702 in the main PLL 1710 at the worst point of an output frequency of 1000 MHz The main PLL 1710 forwards the primary VCO 1706 generated output frequencies of 9.5 GHz-9.625 GHz towards the down-convert mixer 1716. The down-convert mixer 1716 mixes incoming the primary VCO 1706 generated output frequencies of 9.5 GHz-9.6257 GHz with the sampling reference frequency of 9.4 GHz and generates attenuated intermediate frequencies of 0.1 GHz to 0.225 GHz. This attenuation procedure itself reduces the phase noise contributions coming from the primary VCO 1706 and the DDS 1702. It can be further note that a phase detector noise floor plot 2114 is negligible.

FIG. 22 illustrates a phase-noise simulation plot 2200 contributed by a reference sampling PLL when a TCXO clock (or another reference clock) generates input frequencies of 100 MHz in accordance with the first embodiment of the present disclosure.

The two-dimensional phase-noise simulation plot 2200 comprises of an ordinate (vertical axis) disclosing Phase-noise (dBc/Hz) 2202 and one abscissae (horizontal axis) disclosing Frequency (Hz) 2204. The phase-noise simulation plot 2200 discloses the phase-noise contributed by the reference sampling PLL 1718 as disclosed in the first embodiment of the present disclosure in FIG. 17. It is evidently visible that the phase-noise simulation plot 2200 has multiple contributors. The two most important contributors to phase-noise in the phase-noise simulation plot 2200 are the reference VCO 1720 and the reference clock TCXO 1724 as discussed in FIG. 17.

A phase-noise plot 2208 is the contribution of the reference VCO 1720 in the phase-noise simulation plot 2200. The reference sampling PLL 1718 attenuates the phase-noise plot 2208 coming from the primary VCO 1706 to quite an extent. This attenuation is clearly visible in the phase-noise simulation plot 2200.

The other primary contributor in the phase-noise simulation plot 2200 is the phase-noise coming from the reference clock TCXO 1724 present in the first embodiment of the present disclosure. A phase-noise plot 2210 is the contribution of the TCXO 1724 into the reference sampling PLL 1718. The phase-noise plot 2210 is titled as XTAL in the phase-noise simulation plot 2200. This phase-noise plot 2210 is the contribution of the TCXO 1724 in the reference sampling PLL 1718, when the TCXO 1724 is generating input frequencies of 100 MHz The reference sampling PLL 1718 forwards the generated sampling reference frequency of 9.4 GHz towards the down-convert mixer 1716. The down-convert mixer 1716 mixes this generated sampling reference frequency of 9.4 GHz with the incoming frequencies of 9.5 GHz-9.625 GHz to generate an attenuated intermediate frequency of 0.1 GHz to 0.225 GHz. This attenuation procedure itself reduces the phase-noise contributions coming from the reference VCO 1720 and the TCXO 1724.

FIG. 23 illustrates a phase-noise simulation plot 2300 contributed by a reference sampling PLL when a TCXO clock (or another reference clock) generates input frequencies of 250 MHz in accordance with the first embodiment of the present disclosure.

The two-dimensional phase-noise simulation plot 2300 comprises of an ordinate (vertical axis) disclosing Phase-noise (dBc/Hz) 2302 and one abscissae (horizontal axis) disclosing Frequency (Hz) 2304. The phase-noise simulation plot 2300 discloses the phase-noise contributed by the reference sampling PLL 1718 as disclosed in the first embodiment of the present disclosure in FIG. 17. It is evidently visible that the phase-noise simulation plot 2300 has multiple contributors. The two most important contributors to phase-noise in the phase-noise simulation plot 2300 are the reference VCO 1720 and the TCXO 1724 as discussed in FIG. 17.

A phase-noise plot 2308 is the contribution of the reference VCO 1720 in the phase-noise simulation plot 2300. The reference sampling PLL 1718 attenuates the phase-noise plot 2308 coming from the primary VCO 1706 to quite an extent. This attenuation is clearly visible in the phase-noise simulation plot 2300.

The other primary contributor in the phase-noise simulation plot 2300 is the phase-noise coming from the TCXO 1724 present in the first embodiment of the present invention. A phase-noise plot 2310 is the contribution of the TCXO 1724 into the reference sampling PLL 1718. The phase-noise plot 2310 is titled as XTAL in the phase-noise simulation plot 2300. This phase-noise plot 2310 is the contribution of the TCXO 1724 in the reference sampling PLL 1718, when the TCXO 1724 is generating input frequencies of 250 MHz The reference sampling PLL 1718 forwards the generated sampling reference frequency of 9.4 GHz towards the down-convert mixer 1716. The down-convert mixer 1716 mixes this generated sampling reference frequency of 9.4 GHz with the incoming frequencies of 9.5 GHz-9.625 GHz to generate attenuated intermediate frequencies of 0.1 GHz to 0.225 GHz. This attenuation procedure itself reduces the phase-noise contributions coming from the reference VCO 1720 and the TCXO 1724.

FIG. 24 illustrates a phase-noise simulation plot 2400 contributed by the main PLL in accordance with the second embodiment of the present disclosure. The two-dimensional phase-noise simulation plot 2400 comprises of an ordinate (vertical axis) disclosing Phase-noise (dBc/Hz) 2402 and one abscissae (horizontal axis) disclosing Frequency (Hz) 2404. The phase-noise simulation plot 2400 discloses the phase-noise contributed by the main PLL 1812 as disclosed in the second embodiment of the present disclosure in FIG. 18. The primary difference between the phase-noise simulation plot 2400 and the above plots of FIGS. 21, 22 and 23 is that there is no DDS present in the second embodiment of the present disclosure. The most important contributor of phase-noise in the phase-noise simulation plot 2400 is the TCXO 1802 as discussed in FIG. 18.

A phase-noise plot 2412 is the contribution of the TCXO 1802 into the main PLL 1810. The phase-noise plot 2412 is titled as XTAL in the phase-noise simulation plot 2400. Due to the absence of a DDS in the second embodiment of the present invention, a phase detector plot 2410 becomes a major factor.

The main PLL 1812 forwards the primary VCO 1810 generated output frequencies of 9.5 GHz-9.625 GHz towards the down-convert mixer 1816. The down-convert mixer 1816 mixes incoming the primary VCO 1810 generated output frequencies of 9.5 GHz-9.625 GHz with the sampling reference frequency of 9.4 GHz and generates attenuated intermediate frequencies of 0.1 GHz to 0.225 GHz. This attenuation procedure itself reduces the phase-noise contributions coming from the TCXO 1802.

FIG. 25 illustrates a phase-noise simulation plot 2500 contributed by a reference sampling PLL having the TCXO clock generating input frequencies of 100 MHz in accordance with the second embodiment of the present disclosure. The two-dimensional phase-noise simulation plot 2500 comprises of an ordinate (vertical axis) disclosing Phase-noise (dBc/Hz) 2502 and one abscissae (horizontal axis) disclosing Frequency (Hz) 2504. The phase-noise simulation plot 2500 discloses the phase-noise contributed by the reference sampling PLL 1818 as disclosed in the second embodiment of the present disclosure in FIG. 18.

The primary contributor to the phase-noise simulation plot 2500 is the phase-noise coming from the TCXO 1802 present in the second embodiment of the present disclosure. A phase-noise plot 2510 is the contribution of the TCXO 1802 into the reference sampling PLL 1818. The phase-noise plot 2510 is titled as XTAL in the phase-noise simulation plot 2500. This phase-noise plot 2510 is the contribution of the TCXO 1802 in the reference sampling PLL 1818, when the TCXO 1802 is generating input frequencies of 100 MHz The reference sampling PLL 1818 forwards the generated sampling reference frequency of 9.4 GHz towards the down-convert mixer 1716. The down-convert mixer 1816 mixes this generated sampling reference frequency of 9.4 GHz with the incoming frequencies of 9.5 GHz-9.625 GHz to generate a attenuated intermediate frequencies of 0.1 GHz to 0.225 GHz.

Figures 26, 27, 28:
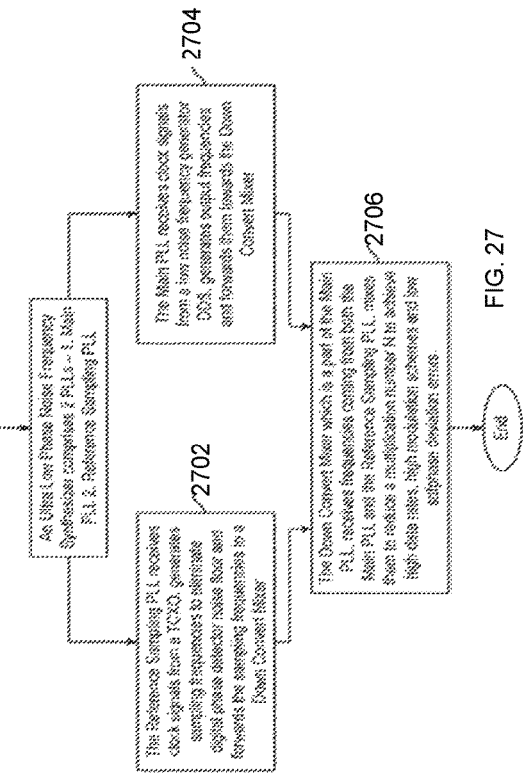
FIG. 26 illustrates a phase-noise simulation plot contributed by a reference sampling PLL having the TCXO clock (or other reference Clock) generating input frequencies of 250 MHz in accordance with the second embodiment of the present disclosure.
FIG. 27 illustrates a flowchart depicting the operational method steps of the first embodiment.
FIG. 28 illustrates a flowchart depicting the operational method steps of the second embodiment.

FIG. 26 illustrates a phase-noise simulation plot 2600 contributed by a reference sampling PLL having the TCXO clock (or another reference clock) generating input frequencies of 250 MHz in accordance with the second embodiment of the present disclosure.

The two-dimensional phase-noise simulation plot 2600 comprises of an ordinate (vertical axis) disclosing Phase-noise (dBc/Hz) 2502 and one abscissae (horizontal axis) disclosing Frequency (Hz) 2504. The phase-noise simulation plot 2600 discloses the phase-noise contributed by the reference sampling PLL 1818 as disclosed in the second embodiment of the present disclosure in FIG. 18.

The primary contributor to the phase-noise simulation plot 2600 is the phase-noise coming from the TCXO 1802 present in the second embodiment of the present disclosure. A phase-noise plot 2610 is the contribution of the TCXO 1802 into the reference sampling PLL 1818. The phase-noise plot 2610 is titled as XTAL in the phase-noise simulation plot 2600. This phase-noise plot 2610 is the contribution of the TCXO 1802 in the reference sampling PLL 1818, when the TCXO 1802 is generating input frequencies of 250 MHz.

The reference sampling PLL 1818 forwards the generated sampling reference frequency of 9.4 GHz towards the down-convert mixer 1716. The down-convert mixer 1816 mixes this generated sampling reference frequency of 9.4 GHz with the incoming frequencies of 9.5 GHz-9.625 GHz to generate a attenuated intermediate frequencies of 0.1 GHz to 0.225 GHz.

FIG. 27 illustrates a flow chart 2700 depicting the operational methods of the first embodiment in accordance with the present disclosure. At step 2702, the Reference Sampling PLL receives clock signals from a TCXO, generates sampling frequencies to eliminate digital noise floor and forwards the sampling frequencies towards a Down Convert Mixer.

At step 2704, the Main PLL receives clock signals from a low noise frequency generator DDS, generates the output frequencies and forwards them towards the Down Convert Mixer.

At step 2706, the Down Convert Mixer which is a part of the Main PLL receives frequencies coming from both the Main PLL and the Reference Sampling PLL, mixes them to reduce a multiplication number N to achieve high data rate, high modulation schemes and low phase deviation errors.

FIG. 28 illustrates a flow chart 2800 depicting the operational methods of the second embodiment in accordance with the present disclosure. At step 2802, the Reference Sampling PLL receives clock signals from a TCXO (or another reference clock), generates sampling frequencies to eliminate digital noise floor and forwards the sampling frequencies towards a Down Convert Mixer.

At step 2804, the Main PLL receives clock signals from the same TCXO, generates the output frequencies and forwards them towards the Down Convert Mixer.

At step 2806, the Down Convert Mixer which is a part of the Main PLL receives frequencies coming from both the Main PLL and the Reference Sampling PLL, mixes them to reduce a multiplication number N to achieve high data rate, high modulation schemes and low phase deviation errors.

Figure 29:
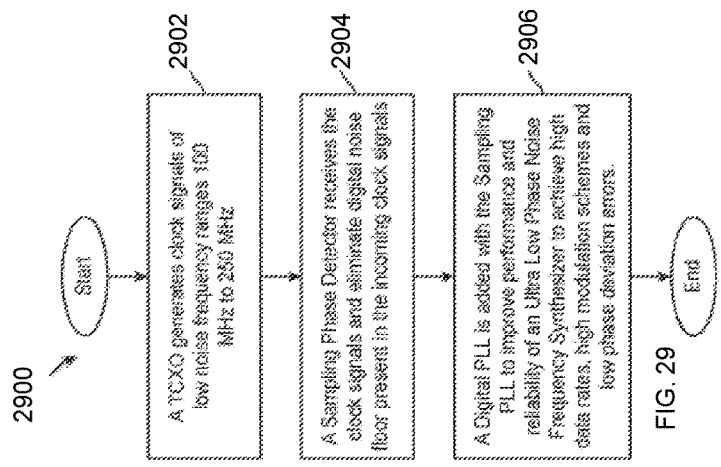
FIG. 29 illustrates a flowchart depicting the operational method steps of the sampling PLL.

FIG. 29 illustrates a flow chart 2900 depicting the operational methods of the third embodiment in accordance with the present disclosure. At step 2902, a TCXO generates a clock signal of the low noise of one frequency that can be anywhere between 100 MHz to 250 MHz At step 2904, a Sampling Phase Detector receives the clock signals and eliminates digital noise floor.

At step 2906, a Digital PLL is added with the Sampling PLL to improve performance and reliability of an Ultra-Low Phase-noise Frequency Synthesizer to achieve high data rates, high modulation schemes and low phase deviation errors.

Figure 30A:
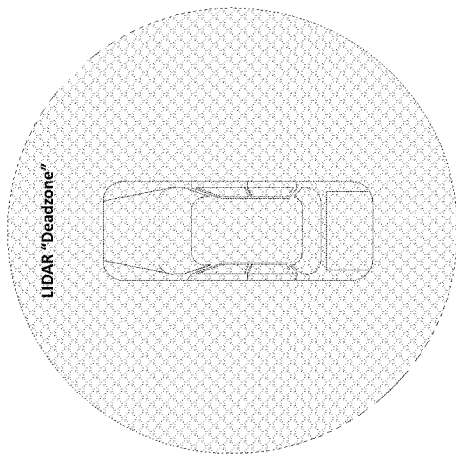

FIG. 30A illustrates a "dead zone" within immediate surroundings of a LiDAR.

Figure 30B:
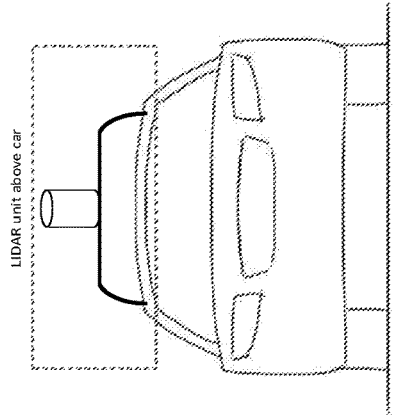

FIG. 30B illustrates a LiDAR mounted over the top of a vehicle, in order to eliminate the "dead zone" as much as possible. These limits the options of using parking garages, causes difficulty in the use of rooftop accessories and finally also makes the vehicle less marketable since such a tower does not blend in well with the design of a vehicle.

FIG. 31 illustrates non-reliability of a LiDAR in adverse weather such as rain, fog, and snow. LIDAR systems use mechanical rotation mechanisms that are prone to failure.

Typical LIDAR systems rely on a rotation speed of around 5-15 Hz. This means that if a vehicle moves at a speed of 65 mph, the distance the vehicle travels between "looks" is about 10 ft. RADAR sensor systems are able to continuously scan their surroundings especially when these systems use one transmitting and one receiving antenna (Bistatic system) (as depicted in FIG. 32A). Further, LIDAR systems are not accurate in determining the speed and autonomous vehicles rely on RADAR for accurate speed detection.

FIG. 32B illustrates the effect of phase-noise in the distance and angular resolution of the RADAR. The clutter to noise ratio (CNR) in a standard RADAR, as shown in the figure, restricts the longer distance resolution and the angular resolution. This results in non-identification of smaller objects present on the road. Also, the CNR restricts the range of the RADAR that may be distance or angular range.

FIG. 32C illustrates resolution problem with RADAR signals. The RADAR signals, due to high phase-noise are not able to distinguish between closely placed objects and slow-moving objects nor can the object be imaged correctly, or its electrical characteristics determined with sufficient reliability. Due to the high phase-noise, vehicles may not have a clear picture of what is in-front or surrounding them. RADAR systems may give wrong and/or error-prone readings. This happens due to the lesser resolution characteristics. Phase-noise plays a crucial role in the resolution which has been determined clearly in the prior art. Due to this low-resolution characteristic, the objects close to the vehicle and slowly moving are not properly distinguished. As seen, in the figure, the correct position of the vehicle in-front may not be accurately ascertained and may give blurry or multiple appearances. Also, as shown in the figure, very closely placed objects like two people close by may be read as a single object. Hence, for close objects, there is no differentiation.

Figure 33:
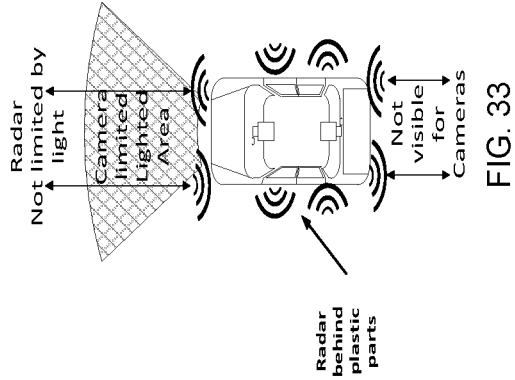

FIG. 33 depicts usage of available light to determine the surroundings of an autonomous vehicle.

Figure 34:
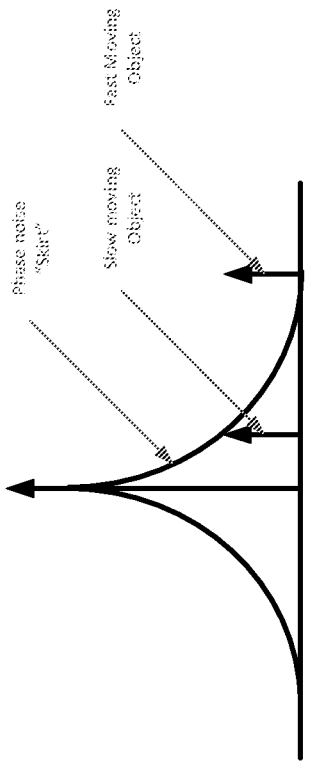

Further, in old-fashioned Radars, the Doppler effect gets a little more complicated since a Radar is sending out a signal and expects to a received signal that is lower in power but at the same frequency when it hits an object. If this object is moving, then this received signal will be subject to the Doppler effect and in reality, the received signal will not be received at the same frequency as the frequency of the transmit signal. The challenge here is that these frequency errors can be very subtle and could be obscured by the phase-noise of the system (as shown in FIG. 34). The obvious drawback is that vital information about the velocity of an object gets lost only because of phase-noise (see figure below). The above is especially right when dealing with objects that move slower than airplanes and missiles, such as cars, bicycles, pedestrians, etc.

Figure 36:
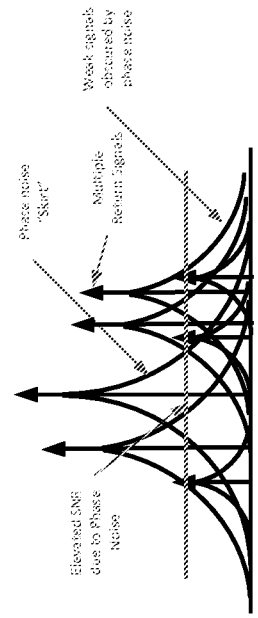
Figure 35:
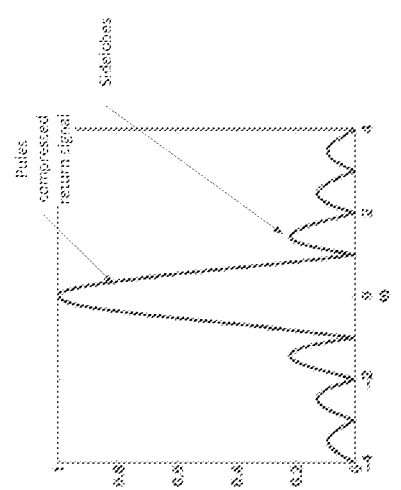

Further, the spectral picture of a processed signal looks like the FIG. 35. As one can see the spectral picture contains also unwanted side lobes. One major contributor to the side lobes is the phase-noise of the Radar system. This spectral re growth of side lobes can cause errors in the determination of the actual distance of a target and can obscure a small target that is close to a larger target. It can also cause errors in target velocity estimation. As shown in FIG. 36, weaker return signals can get obscured in the side lobes of a stronger signal.

FIG. 37 illustrates a detection system 3700, in accordance with various embodiments of the present invention. The detection system includes, but not limited to, a RADAR unit 3702, an ultra-low phase-noise frequency synthesizer 3704, a memory 3706 and a specialized processor 3708. The RADAR unit 3702 may be configured for detecting the presence of one or more objects/targets in one or more directions by transmitting radio signals in the one or more directions. In an embodiment, the RADAR unit 3702 may be comprised of at least one of or combination of: a traditional RADAR system, a synthetic aperture RADAR, or a type of RADAR with a number of RADAR subsystems and antennas. Further, the RADAR unit may include a transmitter for transmitting at least one radio signal with the goal of receiving a received signal; from one or more objects.

The ultra-low phase-noise frequency synthesizer 3704 (hereinafter may interchangeably be referred to as 'frequency synthesizer 3704') may be providing the needed carrier frequency, or a multiple or a fraction of the needed carrier (or up-conversion) frequency for the RADAR transmitter section. The ultra-low noise frequency synthesizer 3704 may also be providing the needed carrier (or down-conversion) frequency, or a multiple or a fraction of the needed carrier frequency for the RADAR receiver section. For some RADARs the transmit signal is used as the carrier frequency for the receive section, this does not alter the principle of this invention and is merely another form of implementation. The term "carrier" may be used interchangeably referring to an up-conversion or down-conversion signal.

The output of the frequency synthesizer 3704 may include a continuous wave signal with ultra-low phase-noise. The received radio signal may be down-converted with the help of frequency synthesizer 3704 and analyzed to determine information and/or characteristics corresponding to the one or more objects. Such information may include (but not limited to) velocity, distance, frequency and type(s) of the object(s). The distance may be determined between the object and the RADAR unit 3702. Accordingly, an action may be adopted by the system 3700 based on the information received from the analysis of the synthesized radio signal. For example, if the detection system 3700 is implemented in a vehicle, the RADAR unit 3702 may transmit the radio signals, that in this case will carry ultra-low or negligible phase-noise and following that the received return signal will carry ultra-low or negligible phase-noise as well. The return signal will be analyzed to determine the presence of the objects and their locations with respect to the vehicle. The fact that an ultra-low phase-noise synthesizer is used practically guarantees that the information corresponding to the one or more objects may be determined in a more accurate fashion than for traditional RADAR systems and thus, accordingly, a correct decision may be taken based on execution of the instructions set by the processor 3708.

Further, in case of a RADAR unit, the received signal (i.e., received from hitting an object and returning as echo) will be subject to the Doppler effect. A system implemented in autonomous vehicles that utilize the characteristics of the Doppler effect, potential slow-moving targets will create a very small Doppler frequency shift that is very hard to impossible to identify with traditional RADAR systems that do not implement an ultra-low noise synthesizer. As a result of the much-improved phase-noise at low-offset frequencies from the carrier, such signals have a significantly better chance to be detected and analyzed correctly. Further, the traditional method of analysis does not need to change and should also not change the amount of data produced by the analysis, it will, however, improve the accuracy of the information created by the RADAR system.

The memory 3706 may include instructions set 3710 having one or more specialized instructions and a database 3712. The specialized instructions may be executable by the specialized processor 3708. The detection system 3700 may receive an input from an external source (not shown). Such input may be provided to activate the detection system 3700. The input may be a command that may be provided through an input source such as a keyboard or a switch. Further, the input may be provided remotely to the detection system 3700 that may be processed by the processor 3708 in accordance with the instructions set 3710. In an embodiment, once the input is received by the system 3700, the transmitter of the RADAR unit 3702 may initiate transmitting the radio waves in multiple directions. For example, the radio waves may be transmitted everywhere in 360 degrees to determine the presence of one or more objects.

In an embodiment, the RADAR unit 3702 of the detection system 3700 may be placed above the vehicle, or anywhere else in or on the vehicle, to transmit the radio signals in various directions and further to receive the returned radio signals as returned from the object(s) (after hitting the object(s)).

Further, the specialized instruction on execution by the specialized processor gathers information corresponding to the one or more objects and surroundings corresponding thereto, the information being gathered based on the returned radio signal. Specifically, the information corresponding to the object may be gathered from the radio signal that is returned from the object(s). The information gathered may include, but is not limited to, surrounding information of the object(s) such as road structure, traffic in front of those objects, traffic behavior, the response of the one or more objects based on the traffic behavior. Further, based on analysis of these, the system may determine probable next move corresponding to the one or more objects and perform pre-planning corresponding to probable moves that may be required in near future. Such intelligent planning of the detection system may determine probable events on the road. This further ensures safety on the road. Further, the information corresponding to the objects and surrounding may be stored in the database 3712 for future reference and planning. Furthermore, the information may be provided to an output device (not shown) such as a display. The information may also be transferred to a Database outside of the autonomous vehicle such as, but not limited to, a cloud-based database.

With the implementation of the ultra-low phase-noise frequency synthesizers 3704, the improved phase noise translated to degrees is better than 0.04 degrees. The detection system is further explained with an illustration in conjunction with the following figure(s) (i.e., FIG. 38).

FIG. 38 illustrates an exemplary vehicle 3800 implementing a detection system (such as the detection system 3700), in accordance with an embodiment of the present invention. The RADAR unit 3802 of the detection system may be configured anywhere inside or outside the vehicle 3800. For example, as depicted, the RADAR unit 3802 is placed on the top of the vehicle to detect the presence of one or more objects in one or more directions. Such objects may include, but is not limited to, other vehicles, human, animal, flying objects or other types of objects in the surroundings. Further, the objects may be of varying size and type and may have different characteristics that may be determined by the RADAR unit. Herein, the characteristics of objects may include, but not limited to, shape, size, running speed, maximum possible speed (for example, based on the type of the vehicle) and so on. In an embodiment, the RADAR unit 3802 may be positioned at another place such as outside or inside the vehicle.

Further, the RADAR unit 3802 may include a transmitter for transmitting radio signals created in conjunction with an implementation of an ultra-low phase-noise synthesizer. This signal is transmitted with the goal to be echoed back (returned radio signal) from one or more objects (that may be available in the surrounding or other near areas). Further, the RADAR unit 3802 may include a receiver for receiving the returned radio signal generated by its paired transmitter or another transmitter from the one or more objects. As depicted, signals 3804 may be transmitted and received by the RADAR unit 3802.

In an embodiment, the ultra-low phase-noise frequency synthesizer (hereinafter may interchangeably be referred to as 'frequency synthesizer 3704') may be configured inside the vehicle 3800 that may be coupled to the radio unit 3802 positioned on outside surface of the vehicle. In an alternate embodiment, the frequency synthesizer 3704 may be configured on outside surface of the vehicle along with the RADAR unit.

Further, the detection system may include a processor for processing of the refined radio signals that may further be analyzed to determine information corresponding to the one or more objects. Further, the processor may determine additional information corresponding to the one or more objects based on the determined information and one or more factors. Such information and additional information may include (but is not limited to) velocity, distance, angular position, frequency and type(s) of the object(s). The distance may be determined between the object and the RADAR unit 3702 and accordingly the expected time by which the object may reach near the vehicle and vice versa may also be determined. Herein, the one or more factors may include (but not limited to) at least one of one or more input instructions, analysis of past history, and current situation.

Further, a suitable action may be determined by the detection system 3700 (for example, by the processor thereof) based on analysis of the refined radio signal. Such determined suitable action may then be performed by the vehicle 3800. For example, the processor (as shown in FIG. 37) may provide signals for actuation of one or more components of the vehicle to perform one or more actions based on the one or more input instructions. In an embodiment, the detection system 3700 may include an input unit for receiving one or more input instructions from an external source (such as a user or device). Such instructions may be stored in a memory (as shown in FIG. 37) of the detection system.

In an embodiment, the objects, such as other vehicles, may also implement the detection system. Further, through the RADAR unit, each object (such as, but not limited to the vehicle) may be able to interact/interact/communicate with other objects through RADAR signals either by utilizing RADAR signals generated by other objects or another form of interaction. Furthermore, the detection system may enable determining location and more characteristics of other objects (such as a vehicle) having the detection system therein.

In an embodiment, the detection system may further be equipped with one or more components and/or sensors to enable additional functioning corresponding thereto. For example, LIDAR, cameras, image processing, and additional sensors may be utilized to create a 3D mapping of the surroundings Further, the object such as a vehicle (having the detection system) may receive instructions from an external source that may be processed effectively by implementing the detection system. For example, if the vehicle (having the detection system) receives instructions to reach a particular place at a remote location. The detection system in combination with GPS may enable the vehicle to reach to such particular place. In an embodiment, the detection system may further utilize one or more cameras that may provide additional information regarding the environment (and the objects therein) to the detection system. Advantageously, this enables self-driving of the vehicle without external guidance from a person (such as a driver).

In another embodiment of the invention, the vehicle 3800 may have more than one RADAR units placed on it. Each RADAR unit may have a separate transmitting and receiving antenna. Inputs from various RADAR units may be accumulated and processed by the processor (to be explained later in the detailed description) to generate a 3-dimensional map of the road traversed by the vehicle 3800. Inputs may also be taken from various other sensors to determine the correctness of data received.

To facilitate object detection, RADAR 3702 may provide information about the vehicle's (3800) environment by generating and transmitting to the environment RADAR signals and measuring the returned signals. A computing device like processor 3708 or system associated may then determine the distances and relative locations of objects using the data provided by the RADAR unit 3702.

More specifically, to detect an object based on range data received from a RADAR unit 3702 and/or other sensors, a vehicle's computing system may generate a 3D point cloud based on information captured by the sensors. The RADAR unit 3702 and/or another sensor may capture information about objects in the form of data points, which may make up the 3D point cloud. The information associated with the various data points may also be referred to as range data and may provide information related to the position and orientation of objects in the environment relative to the vehicle (e.g., a 3D mapping of the environment). The data points may also enable a computing system to determine materials and other information about objects in the environment.

A point cloud is a set of data points in some coordinate system. Data points within a point cloud may be organized within a 3D coordinate system, which may be defined by an X, Y, and Z coordinates, for example. In addition to providing information relating to distances between objects and the RADAR unit 3702, the data points may also represent the external surface of an object or multiple objects. Within a point cloud, a computing system may cluster similar points together and fill in the appropriate patterns according to the data points to detect objects within the environment. The computing system may use various techniques to convert a point cloud to a 3D surface. Some approaches, like Delaunay triangulation, alpha shapes, and ball pivoting, build a network of triangles over the existing vertices of the point cloud, while other approaches convert the point cloud into a volumetric distance field and reconstruct the implicit surface so defined through a marching cubes algorithm.

Furthermore, the processor 3708 may analyze the data points within the 3D point cloud (as data points or as determined 3D surfaces) to determine the sizes, positions, and/or orientations of objects in the environment. Likewise, the computing device recognizes objects within a point cloud by clustering data points that correspond to the same object and may also determine the materials of the object based on the reflections of the data points on the various objects.

However, using clustering techniques to identify specific objects within information formatted into a 3D point cloud may require substantial amounts of time and/or processing power. Further, an object of interest may not be identified using clustering techniques due to the layout and/or positioning of the object within the environment. For example, a computing system may not be able to detect a pedestrian standing in front of a tree or vehicle within a 3D point cloud because point clustering may cluster and identify the pedestrian and the other object as a single object, which thus has an unknown shape. The processor 3708 may need to perform multiple iterations of analysis to separate and identify the pedestrian from the other object during the 3D point cloud analysis. Thus, while formatting RADAR data in a 3D point cloud may allow a computing device to identify objects in some instances, the computing device may need to devote more resources (e.g., time/power) to accurately scan and identify objects within the cloud. The example implementations discussed may help to overcome some of the deficiencies that can arise during the execution of traditional clustering techniques.

For instance, in an example embodiment, a vehicle's computing system may generate a spherical data set based on the range data gathered from the RADAR unit 3702 or other vehicle sensors. Generating the spherical data set may involve the processor projecting the RADAR return signal into spherical coordinates or some other useful format. A spherical coordinate system may be represented as a coordinate system for three-dimensional space, where the position of a point is specified by three numbers: the radial distance of the point from a fixed origin, its polar angle measured from a fixed zenith direction, and the azimuth angle of its orthogonal projection on a reference plane that passes through the origin and is orthogonal to the zenith, measured from a fixed reference direction on that plane. Other coordinate-based systems may be used as well.

FIG. 39 illustrates RADAR 3702 and its various components, in accordance with an embodiment of the invention. The RADAR 3702 includes a synchronizer 37022, a power supply 37024, a transmitter 37026, a receiver 37030, an RF Power divider 37028, and an antenna 37032.

The synchronizer 37022, synchronizes signal generation for the RADAR 3702. The synchronizer 37022, may include a clock to perform this functionality. This helps the RADAR 3702 to generate signals pulses at equal intervals of time maintaining the intervals of the time constant. The specific function of the synchronizer is to produce TRIGGER PULSES that start the transmitter, indicator sweep circuits, and ranging circuits.

Power supply 37024, provides power to various components within the RADAR unit 3702.

The RF Power Divider 37028, provides the TX signal to the receiver, where it may be used as Local Oscillator for down-conversion to a baseband signal. When a single antenna is used for both transmission and reception, as in most monostatic radar systems, the Power divider 37028 must be used. In high power Radar systems, the Power divider may be implemented as an Isolator or RF coupler to protect the receiver from the high power output of the transmitter. In low power RADAR systems, a Power divider may be sufficient.

The transmitter 37026, performs various important functions. The functions include the creation of radio waves to be transmitted, conditions the wave to form the pulse train, and amplifies the signal to a high-power level to provide adequate range.

The receiver 37030, receives the signals when returned by hitting the objects. The receiver 37028 detect wanted echoes in the received signal in the presence of noise, clutter, and interference; and amplifies the desired signals for subsequent processing.

The generated signals are generated and returned signals are received using the antenna 37032. The transmitter 37026 and the receiver 37030 may use a single antenna. Such a construction is known as mono static RADAR unit. However, in other embodiment, the transmitter 37026 and the receiver 37030 may utilize different antennae. In such RADAR units, Power divider 37028 may be eliminated. Such a construction is known as bi-static RADAR unit. This concept is not limited to only one transmitter and one receiver, multiple transmitters and multiple receivers may be utilized to create a multi-static Radar unit. The number of transmitters and receivers do not have to be necessary equal.

FIG. 40A is a line diagram depicting an exemplary 3-dimensional map generation using mono static RADARs, in accordance with an embodiment of the invention. In this, the vehicle 3800 may be provided with multiple mono static RADAR units 4002. In a preferred embodiment, at least one mono static RADAR unit may be placed on the front part, a rear part, left the side, right side, and top of the vehicle 3800. There may also be other places like A and B pillars of the vehicle 3800 on which these mono static RADAR units may be placed. Signals transmitted from one of these mono static RADAR units, when reflected by bouncing off from objects may be received by rest of the other mono static RADAR units and vice versa. Information so obtained by all the RADAR units may be combined to form a 3-dimensional mapping of the surrounding. The 3-dimensional map may be generated by a processor (not shown in the figure) communicably connected to the multiple RADAR units.

FIG. 40B is a line diagram depicting an exemplary 3-dimensional map generation using bi static RADARs, in accordance with an embodiment of the invention. In this embodiment, there may be a single bi-static RADAR unit 4004 placed on the vehicle 3800. The bi-static RADAR unit may have a transmitting unit 40044 and receiver unit 40042 placed at different locations of the vehicle 3800. For example, the transmitting unit 40044 may be placed in front of the vehicle 3800 whereas the corresponding receiving unit 40042 may be placed at the rear-end of the vehicle 3800. This configuration may allow an increase in aperture size and provide a higher resolution of data. Data acquired using the bi-static RADAR unit may be processed to generate a 3-dimensional mapping of the surrounding. Hence, generating a clearer view of all the objects in the near vicinity of the vehicle 3800.

In yet another embodiment there may be multiple bi-static RADAR units placed all over the vehicle with the corresponding transmitting and receiving unit placed at different locations. Transmitted signals from transmitting unit of one bi-static or multi-static RADAR unit when bounces off objects and get returned may be received by receiving units of all bi-static or multi-static RADAR units present on the vehicle 3800. Data thus captured may be then utilized to create a high-resolution 3-dimensional mapping of the surrounding region.

FIG. 41 is a line diagram illustrating an exemplary 3-dimensional map generation using RADAR units present on different vehicles, in accordance with an embodiment of the invention. In this configuration, there may be present multiple vehicles 4102, 4104, and 4106 having their corresponding RADAR units 4108, 4110, and 4112. Each of the RADAR units 4108, 4110, and 4112 may include their own corresponding processor (not shown in the figure). All these processors may be connected to each other wirelessly through cloud computing, mobile communication networks or connected car technology. As per the embodiment, the RADAR unit 4108 when transmits signals to identify object 4114, the RADAR signals returned due to bouncing off from the object 4114, are received not only by the RADAR unit 4108 but, by all the close vicinity RADAR units like 4110 and 4112 as well and vice versa. The processors of all the RADAR units 4108, 4110, and 4112 identify which all RADAR units are nearby or within a close proximity. The proximity may be defined or automatically adapted by the processor. When close proximal RADAR units are identified, each processor communicates with another processor to join and form an identification mode in which the returned RADAR signals from every object are received from every vehicle. The data received may then be combined in real time to generate a 3-dimensional mapping of the surroundings.

FIG. 42 illustrates an exemplary method 4200 flow diagram for an autonomous vehicle, in accordance with an embodiment of the present invention. The method 3900 corresponds to functional steps for implementation of an object detection system, such as the detection system 3700. The order in which method is performed is not construed as limiting for the present invention. Further, various additional steps may be added in light of the scope of the present invention.

The method 4200 may include various steps such as (but are not limited to): at step 4202, the method may detect a presence of one or more objects in one or more directions by a RADAR unit. Herein, the RADAR unit comprising: a transmitter for transmitting at least one radio signal to the one or more objects; and a receiver for receiving the at least one radio signal returned from the one or more objects. Further, the method may include, utilizing (step 4204) at least one ultra-low phase-noise frequency synthesizer for refining the transmitted and the received signals of the RADAR unit, and thereby determining a phase-noise and maintaining the quality of the transmitted and the received radio signals.

Herein, the method may further include various steps such as receiving and multiplying, by the ultra-low phase-noise frequency synthesizer, the at least one output signal by a predefined factor to generate at least one final output signal of at least one final output frequency. Further, the method may generate the up converting or down converting the signal of the RADAR unit, by utilizing the ultra-low phase-noise frequency synthesizer.

The method 4200 (at step 4206) may process the returned (received) signals that are refined (such as down converted) by the ultra-low phase-noise frequency synthesizer to determine one or more characteristics of the one or more objects (from where the RADAR signals are returned). For example, the method may determine the presence of a slow-moving target despite the very small Doppler frequency shift. Further, the method may include determining the presence of a close-range target despite the very short signal travel time. Furthermore, the method may determine a distance and a direction of each of the one or more objects. Again further, the method may determine a type of material an object is made up of, its geometric structure, orientation, surface characteristics and electrical characteristics. Additionally, the method may include a step of creating a RADAR image and/or activating one or more additional sensors for operation thereof in conjunction and synergy with the RADAR unit. The method may determine characteristics of two close objects irrespective of the size of the objects. Further, the method may differentiate between two or more types of the objects when one object is visually obscuring another object.

Based on the gathered information (such as the characteristics) corresponding to the objects, the method (at step 4208) may enable an autonomous vehicle to adopt one or more actions based on the determined characteristics of the objects. In an embodiment, such actions may be suggested by the specialized processor to the autonomous vehicle (or components thereof).

Advantageously, the present invention emphasizes that by incorporating the ultra-low phase-noise synthesizer in an existing RADAR system, the performance of the RADAR system will be improved substantially in terms of target detection accuracy and resolution and because of this it can become the dominant sensor for the handling of autonomous cars. Herein, the Synthesizer drastically reduces the phase-noise of RADAR signals so that such RADAR sensor will be able to replace current sensor systems at very low cost and with reliability at all lighting and adverse weather conditions.

Further, the RADAR unit may utilize modulated or un modulated waveforms to determine the electromagnetic characteristics such as, but not limited to, dielectric constants of targets with significantly better accuracy. Furthermore, for the RADAR unit (as disclosed herein this disclosure) that may utilize modulated or un modulated waveforms, the processing speed of the main decision-making unit is significantly improved because the much lower phase-noise enables the RADAR to provide more accurate data with less data than a LIDAR sensor for example. Accordingly, the detection system (such as the detection system 3700) may determine the type of material of a target object with high accuracy. Furthermore, the detection system may utilize one or more of: a camera, image processing and additional low-cost sensors for replacing the need for LADAR/LiDAR. Moreover, in an embodiment of the present disclosure, the RADAR unit (that may use modulated or unmodulated waveforms) may be utilized in conjunction with LIDAR, Camera, image processing used to create a 3D mapping of the surroundings. Additionally, the RADAR unit (that may use modulated or unmodulated waveforms) may be used in SAR applications or other RADAR application. Herein, when used in bi-static or multistatic scenarios the phase correlation between the separate transmitters and receivers may be kept between 10 to 1000 times better than with traditional RADAR systems. Further, the detection unit may determine probable events of objects (such as other vehicles in traffic area) through RADAR unit and by reducing the phase-noise through the phase-noise frequency synthesizer. Accordingly, the detection unit may pre-plan event based on the determination of probable events and may ensure safety on the road, especially during traffic time.

In an embodiment, the vehicle 3800 may include a detection system (such as the detection system 3700) having a RADAR unit (such as the RADAR unit 3802) that may utilize a non-modulated pulse to determine the presence of a slow-moving target despite the very small Doppler frequency shift. Further, the RADAR unit utilizes a non-modulated pulse to determine the presence of a close-range target despite the very short travel time of the signal. Further, in an embodiment, the RADAR unit utilizes at least one of: a modulated waveform and/or a non-modulated waveform to determine at least one of: the distance and more characteristics of a target, one or more characteristics of two close targets when both are the same size or one target is smaller than the other target. Further, the detection system determines a type of material a target is made up of.

Further, in an embodiment, the RADAR unit utilizes modulated or unmodulated waveforms wherein when used in conjunction with targets that utilize RADAR signal modulators can identify the modulation. Further, the detection system may utilize modulated or unmodulated waveforms in RADAR unit in conjunction with at least one of: Cameras, image processing and additional low-cost sensors to create a 3D mapping of the surroundings. Furthermore, a RADAR system that utilizes an ultra-low phase-noise synthesizer may be used as an imaging RADAR that can discover silhouettes and create a true 3-dimensional map of the surroundings of the vehicle including the mapping of the object that is not visible with light FIG. 43 illustrates a flowchart depicting 3-dimensional map generation method 4300, in accordance with an embodiment of the invention. The order in which method is performed is not construed as limiting for the present invention. Further, various additional steps may be added in light of the scope of the present invention.

Method 4300 may include various steps such as (but are not limited to); at step 4302, the method may identify the presence of one or more RADAR units present nearby. The identification of the RADAR units may be based on a continuous ID signal being emitted by each of the RADAR units and proximity distance is within a threshold limit or automatically fixed by a processor of the RADAR unit 3700. The method 4300 (at step 4304) may then initiate a communication through a wireless network, with corresponding processors all of the RADAR units identified. The wireless networks may be mobile networks like 4G, 3G, CDMA, etc. or cloud network, or even connected car's network.

Further (at step 4306), the processor may then initiate an identification mode switching that configures the nearby RADAR units to receive the signals returned after being bounced off from different objects. All such data is then collected by each of the processors of the RADAR units and then shared with each other as well through the wireless network. The data is then combined to generate a 3-dimensional mapping of the surrounding of the vehicle 3800 and also other proximal vehicles.

Further in an embodiment, the combined data may be uploaded by each of the proximal vehicles to a central database. The combined data may be geo tagged by combining GPS information. This data is then stored in the central database with an exact model of the street of up to a distance of 1 cm. The central database may contain a repository of such street information and may keep updating it in real time whenever, new information from data collected may be identified. Hence, whenever, a new vehicle, that has never traversed the street is scheduled to cross the street, this information may be sent to the new vehicle for autonomous driving purposes. Hence, the new vehicle may forecast expected road situations, traffic, stop signs, traffic lights etc.

FIG. 44 illustrates a line diagram depicting RADAR signals from the RADAR system as presented in accordance with the present invention. There is an increase in RADAR resolution, in contrast to the resolution as depicted in FIG. 32B, due to the usage of the Ultra-Low Phase-noise Frequency Synthesizer. The Ultra-Low Phase-noise Frequency Synthesizer is responsible for an improved CNR. The improvement in CNR results in improved angular resolution accuracy of the RADAR and hence, RADAR is able to identify a small object present on the road and also within a close vicinity as well.

FIG. 45 is a line diagram illustrating object identification, in accordance with an embodiment of the present invention. As opposed to the earlier identification problems, due to the increased resolution of RADAR signals, the RADAR signals are able to accurately identify the position of slow moving objects. With the improved CNR, the RADAR signals are also able to identify closely placed objects. In this, as can be seen, the RADAR signals, due to ultra-low phase caused due to the presence of the ultra-low phase-noise frequency synthesizer provides clear data and distinction between various objects whether obscured by other objects, slowly moving or having very close distance between each other.

Therefore, according to the present invention, the RADAR system, including the Ultra-Low Phase-noise Frequency Synthesizer, may be able to work even in adverse weather conditions. High accuracy is achieved using such RADAR system. High phase-noise that leads to high CNR is decreased to provide an accurate reading. Due to the decreased phase-noise, cluttered, blurred or multiple appearances of slow-moving objects or closely placed objects may be eliminated. The decreased CNR ratio also improves the angular resolution of the RADAR to identify closely present small objects. The RADAR system of the present invention may also be able to identify material composition of objects present within its vicinity. Hence, effectively distinguishing between humans and wooden poles. The Ultra-Low Phase-noise Frequency Synthesizer present within the RADAR may improve phase-noise by more than 20 dBc/Hz.

Figure 46:
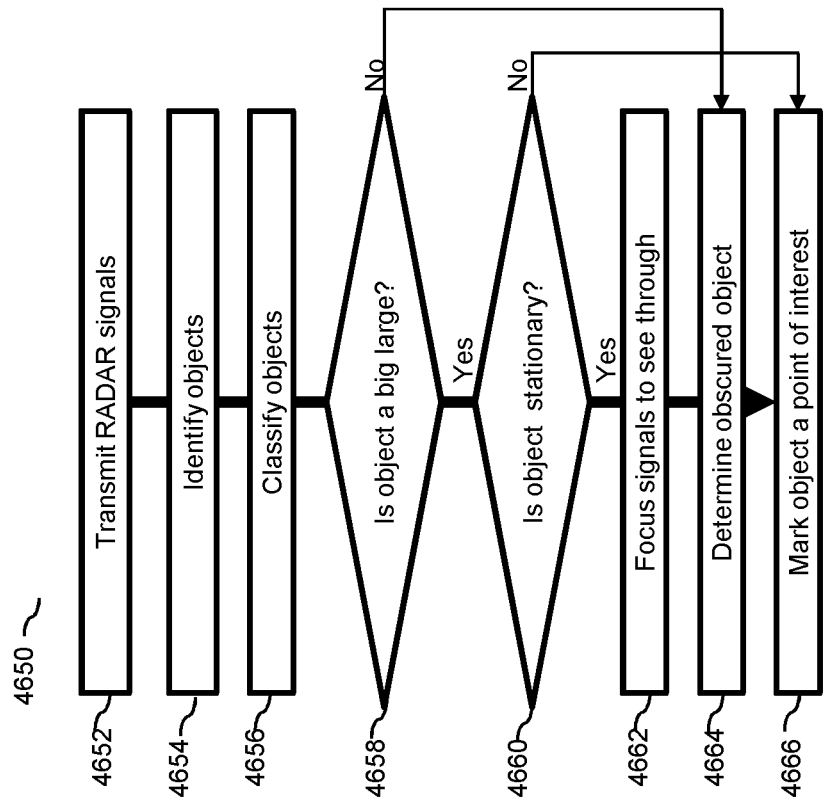
FIG. 46A illustrates a line diagram depicting identification of obscured objects, in accordance with an embodiment of the present invention.
FIG. 46B, illustrates a flowchart to identify visually obscured objects, in accordance with an embodiment of the invention.
Figure 46:
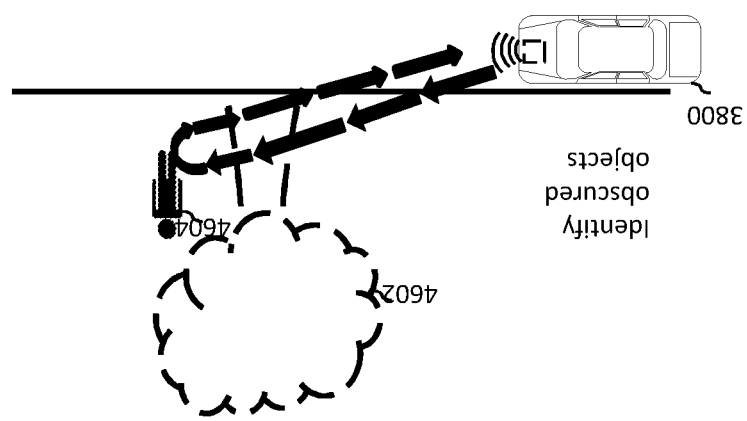

FIG. 46A illustrates a line diagram depicting identification of obscured objects by the RADAR unit 3702, in accordance with an embodiment of the invention. The vehicle 3800 includes the RADAR unit 3702. The RADAR unit 3702 is able to generate RADAR signals that may identify visually obscured objects. Hence, the RADAR unit 3702, with the help of the ultra-low phase-noise synthesizer 3704, may be able to identify a human 4604, behind a tree 4602. The ultra-low phase-noise synthesizer 3704 helps by providing better resolution of the data. The amplitude of the transmitted and returned RADAR signals may be calculated to identify the objects that may be visually obscured. Further, electromagnetic characteristics may include permittivity, permeability, relative permeability, diamagnetism, para magnetism among others. Electromagnetic characteristic levels of the surface of objects may be utilized to identify the type of objects in correlation with the density of the objects. In another exemplary environment, the detection system 3700, may be able to identify a human sitting in a bus stop obscured by a poster on the bus stop. The electromagnetic characteristics principle may be utilized to identify such obscured objects.

FIG. 46B, illustrates a method 4650 to identify visually obscured objects, in accordance with an embodiment of the invention. The method 4650 is initiated at step 4652, wherein the detection system 3700 initiates transmission of RADAR signals to identify objects surrounding and gain knowledge of the environmental surroundings. Further at step 4654, the returned signals that are bounced of the objects on which RADAR signals transmitted fall upon.

The method 4650 further at step 4656, classifies the objects identified at step 4654. Objects may be classified based on the dimensions of the objects. The object may be small, medium or large. If the object is not large the method 4650 jumps to step 4664 that will be explained later in the description. If the object identifier is classified as a large object, at step 4658, then further at step 4660, the method 4650 determines whether the object is a stationary object or not. such classification of objects may be performed utilizing comparison of subsequent images pixel-wise. Images may be partitioned into a multiple of pixel blocks that may be compared with pixel blocks of subsequent images in short time intervals. A difference observed may be used to classify the object as mobile and not stationary. If the object is classified as not stationary, the method 4650 jumps to step 4666 details of which will be explained later. If the object is classified as stationary, the method 4650 jumps to step 4662.

The method 4650, at step 4662, focuses the RADAR signals to the object identified. This is done as the object may be a potential threat to the vehicle 3800. This may be because there may be some obscured object behind the object determined that may pose a threat to the vehicle 3800. Further, the method 4650 (at step 4664) determines whether there is an obscured object behind the object and the status of the obscured objects (stationary or mobile). This may be done by a variety of method. In one method, electromagnetic characteristics of the objects may be identified by studying the returned RADAR signals. In another method, the density of the material of the objects may be utilized and matched to templates, stored, to classify the obscured objects. Also, the status of the obscured objects is identified whether they are stationary or mobile. This may be performed using the pixel-wise comparison of the returned radar signals.

At step 4666, the method 4650, marks the obscured object identified as a point of interest. The point of interest is an object classified to keep a track of. The priority of keeping the track of such an object is high as it may be a potential threat. Hence, the detection system 3700, continuously monitors all such point of interest objects.

By way of example, the detection and imaging unit 3700 identifies whether there is a bus box in near vicinity or not. Further, in case there is a bus box identified, the detection and imaging unit 3700 further determines an obscured object and whether the obscured object is a potential threat or not. Like there may be an object in a poster and it might have a human figure. The RADAR 3702 is capable enough to identify whether it's a poster or a human figure. The RADAR thus may also identify what is behind the trunk of a tree. It is able to determine a deer or other animal that may cause a potential threat to the driver within the vehicle 3800.

Figure 47:
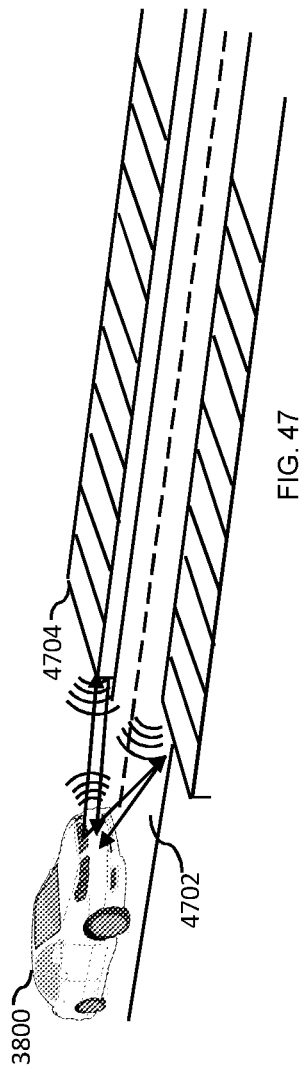
FIG. 47 illustrates a line diagram depicting identification of road and pavement, in accordance with an embodiment of the present invention.

FIG. 47, illustrates a line diagram depicting identification of pavement and road, in accordance with an embodiment of the invention. The vehicle 3800 while traveling the road 4702 has to identify where exactly road ends and where exactly pavement starts.

Roadway materials, especially asphalt, are heterogeneous mixtures of air, rocks, and binder. Each of the roadway materials have particular electromagnetic characteristics associated with its ability to be polarized by an electric field. The electromagnetic characteristics may be linearly related to the polarizability and may be a complex quantity. The electromagnetic characteristics may be complex having real, and imaginary components, representing energy storage and energy loss respectively to a propagating electromagnetic wave. Typically, when speaking of the dielectric constant one is referring to the real part of the electromagnetic characteristics which can be frequency dependent depending on the frequencies of interest.

The detection system 3700, is capable of identifying clearly the blacktop road surface based on the dielectric constant of the roadway material. The density of the roadway material may be recognized with accuracy using the detection system 3700. Due to this property, an exact image of the blacktop of the road may be recognized. It may be easy to distinguish the recognized road with dirt mud etc.

Further, it may be easy to recognize the pavement 4704. The detection system 3700 is capable of identification of pavements as pavements are elevated at about 15 cm from the road 4702. The detection system 3700 is capable of identifying the continued elevated pavement edge. The detection system 3700 is configured to accurately measure the elevated edge of the pavement 4704 with high-resolution signal reception.

Further the detection system 3700 is able to collect information about the surroundings for mapping purposes. Every item made out of a metal can be mapped accurately. Also, electromagnetic information about buildings, electrical poles, traffic lights, traffic sign, vegetation, below ground features and other environmental feature can be collected to create an "electromagnetic-map". Such an electromagnetic map will provide an additional layer of mapping to LiDAR and visual mapping. Electromagnetic maps will provide another layer of mapping that has not existed before and looks the same under all conditions.

In one embodiment, mapping the static metal object in the city and the specific signature of each object provide additional information on the electromagnetic-map of the city. For example, traffic lights metal poles may have different electromagnetic information and signature, that can be mapped into an electromagnetic-map of the city. In a similar way, metal, glass, concrete or wooden buildings may have different electromagnetic information and signature that can be mapped into electromagnetic-map of the city. Different buildings and objects may have different sizes, shapes, structure and build from combinations of different material. The different buildings may have different electromagnetic information and signatures that can be mapped into electromagnetic-maps. Multiple layers of these maps can be correlated to geographical maps, physical maps, visual maps, GIS maps and another type of maps.

An electronic signature of an object can be correlated to the electromagnetic-map, in a similar way that a visual image can be correlated to a "visual map" or a Lidar-image can be correlated to a LiDar-map. Different layers provide a different type of information for the electromagnetic information, visual information, and LiDar information that can be synthesized into the relevant may layer. Fusion of these information layers and the relevant map layers provide additional information about the objects.

Further, in another exemplary usage, the detection of human beings is possible by using the different reflection of the RADAR signals. Since the reflected signal is of high resolution from the RADAR 3702, due to the ultra-low phase-noise therefore, it is possible to distinguish easily between various materials including humans, animals, live objects, trees, plants, concrete, glass, wall, etc. Different Radar reflections may also be achieved by utilizing different frequencies and multiple chirp and radar signal modulation types with the goal of determining the electromagnetic characteristics so that the material of and object of interest can be derived.

Further, in another exemplary usage, the detection system 3700, may be able to identify animate and non-animate objects using the same principle of electromagnetic characteristics as discussed above. Such usage helps the detection system 3700 to identify where are humans or live objects are present on the road. Detection of humans is based on the fact that there may be some movement always due to breathing or movement of body parts (as in case of a walking person) etc. This small movement may be used to detect a human being from other objects behind a wall or bus stops. The ultra-low phase-noise synthesizer 3704 is able to reduce the high clutter from the wall and other objects nearby to provide a clear resolution data. Furthermore, the RADAR 3702 is also able to identify and classify humans behind walls made up of different materials from a far-off distance as well.

In another embodiment of the invention, the RADAR 3702 may also be able to identify human being making a minimum of movements like waiving of their hands etc. even when they are blocked behind an opaque object. The ultra-low phase-noise synthesizer 3704 is able to reduce the clutter noise and able to do the identification. Even in conditions when the weather is adverse, like raining, snowing, darkness etc. The RADAR 3702 may detect humans from a considerable amount of distance. This may help to do away with the collision warning systems in the autonomous vehicles as they might not be required. This is so because due to very early warning times, the vehicle may be able to reroute their trajectory without being coming to a state of emergency.

Detection of human beings may be done analyzing the Fourier spectrogram of Doppler frequency. Doppler signatures for a moving object varies and the speed and distance of the movement play a role as well. Also there might be other objects like other animals or cars due to which the Doppler signature may vary. Hence, small sections of the frequency spectrum may be analyzed individually. Since the RADAR 3702 is a high-resolution RADAR, it is capable of providing much clearer data as to slow-moving objects whether near or far with an emphasis on human beings.

Humans may also be detected using a background subtraction technique. This technique helps in detection of obscured human beings behind different kinds of object. In this technique, successive frames of the cross-correlation signals between each received signal and the transmitted signal. This technique can help in identification of moving objects, especially humans clearly in a heavily cluttered environment as well.

The RADAR 3702, uses a micro-Doppler effect to identify humans. The micro-Doppler effect relies on low amplitude signals that make up human's Doppler Signature. These micro-Doppler signals can also be utilized to identify stationary humans by determining heartbeat from the reflected signals. Thus, in an environment full of people, due to the micro-Doppler technique and high-resolution property of the RADAR 3702, the imaging system 3700 is able to identify, based on gait, different mobile humans and stationary humans due to the breathing patterns and the heartbeat patterns.

In addition to the above, the imaging system 3700, using the RADAR 3702 may also be utilized to count the number of human beings after their identification. With the ultra-low noise capability of the RADAR 3702, real-time counting of the human beings can be done. Even in highly cluttered regions, the RADAR 3702 is able to count the number of human beings efficiently.

The high-resolution power of the RADAR 3702, as per the invention, helps the autonomous vehicle to reconstruct its surrounding environment. The reconstruction helps in gathering details just like a human being would and that too in a 3-D environment. The RADAR 3702 may be complemented with an artificial engine that helps in beam forming and beam steering. Use of beam forming techniques helps the artificial engine to identify and classify various types of objects within the surroundings. The artificial engine may also be able to track and recognize all sorts of objects and hence further help the autonomous vehicle in its more autonomous functioning.

This high-resolution ability of the RADAR 3702 provides it superhuman like capabilities like for example seeing through the objects. Combine with a highly efficient and adaptive artificial engine, the autonomous vehicle is not only able to identify and classify objects behind large objects but also able to predict whether they object poses a threat to the autonomous vehicle or not. The pure radio signals help in clear imaging of the objects and the RADAR 3702 misses fewer objects. The RADAR 3702, with a highly directive RF beam, may be able to identify and accurately determine location, and speed of road objects and that too under severe weather conditions and even in disarranged environments.

In another embodiment of the invention, due to the ultra-low phase-noise property of the RADAR 3702, it is also able to identify tiny objects as well. So, an object that may have been undetected with a RADAR having normal phase-noise skirt, may now be detected using the RADAR 3702 due to ultra-low phase-noise skirt.

Such a RADAR 3702, when working in tandem with other sensors like LiDAR, Ultrasound, camera, and other RADAR sensors may prove to be very useful and may be able to contribute more and accurate information for the sensory fusion data. combined with accurate data from RADAR 3702, and LiDAR, camera, and other sensor data, the imaging system 3700 may be able to provide an accurate 3-D map of the objects surrounding the vehicle.

As for the close placed object, generally due to clutter noise, the RADARs are not capable of distinguishing and classify so close placed objects. RADAR 3702, due to the ultra-low phase-noise is able to clearly determine and classify the objects within close proximity of each other.

Figure 48:
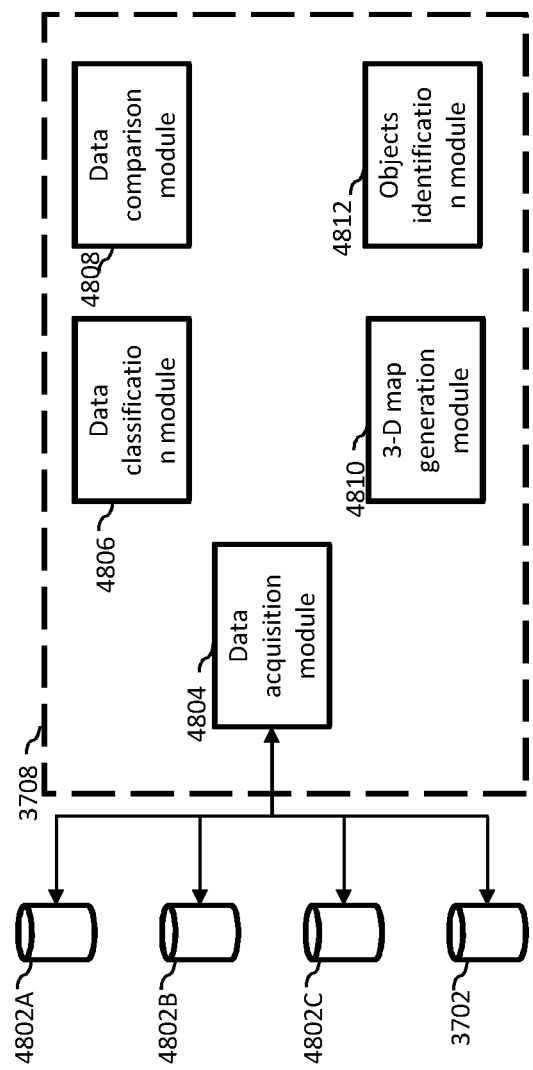
FIG. 48 illustrates a block diagram of a processor, in accordance with an embodiment of the present invention.

FIG. 48, illustrates a block diagram of the processor 3708 of the detection system 3700 and its various internal components. The components of the processor 3708 may be hardware or software based. Further, the processor 3708 may include multiple microprocessors to perform various different functions that may be coordinated with each other to perform a coordinated output.

The processor 3708 may include a data acquisition module 4804, a data classification module 4806, a data comparison module 4808, a 3-dimensional map generation module 4810, and the identification of an object module 4812. The processor 3708 may be configured to collect data from various other sensors like 4802A-4802C (cumulatively referred to as sensors 4802) and also from RADAR 3702. The various other sensors may be LIDAR, camera, ultrasound sensors etc.

The data acquisition module 4804 receives data from every sensor connected to the processor 3708. Data received is forwarded to the data classification module 4806. The data classification module 4806 segregates what data is received from which sensor. This helps in identification of data and its source sensor. The data is then forwarded to a data comparison module 4808. The data comparison module 4808 compares data, similar in information, from all sensors. The comparison is performed to check the data authenticity and helps in ascertaining the correctness of collected data. Further, the compared data is then forwarded to a 3-dimensional map generation module 4810, that correlated the data from all the sensors and generates a 3-dimensional mapping of the surroundings of the vehicle 3800. Further, the objects identification module 4812, identifies the animate and inanimate objects utilizing continuously collecting data and comparing it with the historical data by breaking the data into pixels. Hence, the various modules working in a coordinated manner are able to produce a 3-dimensional mapping and accurately identify the stationary and mobile objects. Hence providing enough information to the vehicle 3800 to take an appropriate action during an event. In an exemplary embodiment, the sensors 4802 may be utilized to gather more information after being identified preliminarily. For e.g. the RADAR 3702 may preliminarily identify that there is a visually obscured object behind a tree etc. Then one of the sensors from the sensors 4802 like the LiDAR sensor may be focused on that specific spot identified by the RADAR 3702. Then the LiDAR may use its high-resolution capability to identify clearly the object. Further, in another exemplary usage, the RADAR 3702 may identify that there is a live object in environment ahead of the vehicle 3800. The imaging and detection system 3702 may then initiate the LiDAR sensor to determine more details about the live object. Hence, instead of focusing the LiDAR all around 360 degrees, it may be efficiently used as a supporting sensor and may be focused to a smaller degree of the area like 2-3 degrees and resolve objects better when preliminarily identified or determined by the RADAR 3702. It may be understood that there might be another sensor that may also be used in place of LiDAR sensor or in conjunction with it like the camera to better understand the specifics of the object.

FIG. 49, illustrates a flowchart of a method 4900 for identifying live objects using the detection system 3700, in accordance with an embodiment of the invention. Live objects have the tendency to move at all times. For e.g. a human being is moving all the time. Even if the human being is stationary, it is still breathing and hence, it may be identified by capturing the chest cavity movement using appropriate frequency RADAR signals.

The method 4900, (a step 4902), transmits RADAR signals to identify objects surrounding and gain knowledge of the environmental surroundings. The detection system 3700 may continuously vary the frequency of transmitted signals. Various frequency signals are transmitted in order to identify and obtain more information about the objects preliminarily identified by the detection system 3700.

Once objects are identified the method, at step 4904, density information of the objects is obtained. The density information of the objects is determined by processing the returned RADAR signals. Further, at step 4906, the method 4900 determines whether the object is live or not. The object, is determined to be not living, the method 4900 is terminated. However, in case the object is identified to be living, the detection system 3700, marks the object as a point of interest object, at step 4908. As described earlier, the point of interest is an object classified to keep a track of. The priority of keeping the track of such an object is high as it may be a potential threat. Hence, the detection system 3700, continuously monitors all such point of interest objects.

By way of an example, the detection system 3700 identifies if there is a live object that may be obscured by some other bigger object. The vehicle 3800, when driven in autonomous mode, needs to have information about every object within its vicinity especially the live objects like humans. Such humans may be potential threats as they may come in front of the vehicle 3800 suddenly and may cause an accident.

Advantageously, the present disclosure discloses usage of Radar with ultra-low phase-noise technology in conjunction with SAR technology or without to be combined with LIDAR as an overall surroundings mapping solution. Further, in an embodiment, the Radar with ultra-low phase-noise technology with or without SAR technology (mono static, bi-static or multi-static) may be utilized in combination with LIDAR where the Radar provides an overall view and directs the LIDAR to points of interest. Furthermore, the Radar with ultra-low phase-noise technology in conjunction with or without SAR technology (mono static, bi-static or multi-static) to be combined with a Camera/thermal camera to identify objects/silhouettes. Also, the Radar with ultra-low phase-noise technology in conjunction with or without SAR technology (mono static, bi-static or multi-static) may be utilized by combining with one or more other sensors.

Additionally, in an embodiment, the present invention discloses creating synergy between Radar and LiDAR by supporting and cross-referencing LiDAR imaging by providing information about an object surface roughness, Geometric structure, Orientation. Further, in an embodiment, SAR, InSAR, and PolSAR may be utilized to achieve the advantages. Furthermore, exchange/completion of data between vehicles—low phase-noise ensures accurate knowledge about the distance between the vehicles which is crucial for such type of information exchange/completion.

Hence, the RADAR unit 3702, according to a present embodiment of the invention is able to identify moving human beings in severe weather conditions may be dark, snow, rain, etc. the RADAR 3702 is able to identify the humans behind stationary objects like a tree and able to identify and classify the various objects. The humans are identified from a safe distance which may eliminate the need for a collision warning system as it will not be required. The RADAR 3702 may also be able to identify materials of the objects on the road like for example bike material etc.

Examples of Sensor Fusion with Better Visual Interpretation
1. Pedestrian approaching a crosswalk:
The RADAR 3702 classifies the pedestrian based on material detection of the human living body. RADAR 3702 further classifies the pedestrian based on micro doppler of the limb movement. After detection and classification, by the RADAR 3702, from a long range, it alerts the LiDAR and the Camera sensors to focus on the specific location and clarify the detection and classification. Pedestrian is further classified by the LiDAR on basis of shape; and further, the cameras as well classify the pedestrian. All the identified information is then fed into the processing unit that forms a decision to stop for the pedestrian to cross.

2. A cyclist on the road

The RADAR 3702 classifies the cyclist based on material detection of the human living body. The RADAR 3702 classifies the cyclist based on material detection of cycle metal from a very long range. RADAR 3702 further classifies the cyclist based on sinusoidal micro doppler of the pedal movement. After detection and classification, by the RADAR 3702, from a long range, it alerts the LiDAR and the Camera sensors to focus on the specific location and clarify the detection and classification. A cyclist is further classified by the LiDAR on basis of shape; and The cyclist, the cameras as well classifies the pedestrian. All the identified information is then fed into the processing unit that forms a decision to increase the distance from the cyclist.

3. A deer or other animal on the side of the road.

The RADAR 3702, due to the high resolution gained from the ultra-low phase-noise signal in the captured information has the ability to detect and determine a deer from a very long range, even in adverse weather conditions such as n fog, rain, snow or even in darkness. The RADAR 3702 is also able to detect the presence of the deer even when the deer is obscured behind another object like a tree, bushes, or a wooden wall.

FIG. 50, illustrates a block diagram of a detection system 5000 for detecting surrounding environment, in accordance with an embodiment of the invention. The system 5000 is similar to the detection system 3700 as discussed in conjunction with FIG. 37.

The system 5000 includes, but not limited to a first sensor or the RADAR unit 3702, as has been described above in conjunction with FIG. 39, the ultra-low phase-noise frequency synthesizer 3704, a processor 5004, at least one-second sensor 5002, and a database 5006.

The RADAR unit 3702 may be configured for detecting the presence of one or more objects/targets in one or more directions by transmitting radio signals in the one or more directions. In an embodiment, the RADAR unit 3702 may be comprised of at least one of or combination of: a traditional RADAR system, a synthetic aperture RADAR, or different types of RADAR with different RADAR subsystems and antennas.

The at least one-second sensor 5002 may be a LiDAR, that emits light periodically to gather data about the surroundings. The function of the LiDAR has been discussed above in detail.

The ultra-low phase-noise frequency synthesizer 3704 (hereinafter may interchangeably be referred to as 'frequency synthesizer 3704') may be providing the needed carrier frequency, or a multiple or a fraction of the needed carrier (or up-conversion) frequency for the RADAR transmitter section. The ultra-low noise frequency synthesizer 3704 may also be providing the needed carrier (or down-conversion) frequency, or a multiple or a fraction of the needed carrier frequency for the RADAR receiver section. For some RADARs the transmit signal is used as the carrier frequency for the receive section, this does not alter the principle of this invention and is merely another form of implementation. The term "carrier" may be used interchangeably referring to an up-conversion or down-conversion signal.

The database 5006 may include instructions set having one or more specialized instructions. The specialized instructions may be executable by the processor 5004.

In an embodiment, the RADAR unit 3702 of the system 5000 may be placed in-front of the vehicle 3800, or anywhere else in or on the vehicle 3800, to transmit the radio signals in various directions and further to receive the returned radio signals as returned from the object(s) (after hitting the object(s)).

Further, the specialized instruction on execution by the processor 5004 gathers information corresponding to the surroundings, the information is gathered based on the returned radio signal. The information gathered may include, but is not limited to, surrounding information of the object(s) such as road structure, traffic in front of those objects, traffic behavior, the response of the one or more objects based on the traffic behavior. Further, based on analysis of these, the system 5000 may mark the one or more objects identified as an object of interest. The object of interest may be a potential threat to the vehicle 3800. The processor 5004 decides and performs pre-planning corresponding to probable moves that may be required in near future. Such intelligent planning of the system 5000 may determine probable events on the road. This further ensures safety on the road. Further, the information corresponding to the objects and surrounding may be stored in the database 5006 for future reference and planning. Furthermore, the information may be provided to an output device (not shown) such as a display. The information may also be transferred to a Database outside of the autonomous vehicle such as, but not limited to, a cloud-based database.

FIG. 51, illustrates an exemplary method 5100 flow diagram for detecting and imaging objects for a vehicle, in accordance with an embodiment of the invention. The method 5100 corresponds to functional steps for implementation of an object detection system, such as the detection system 5000. The order in which method is performed is not construed as limiting for the present invention. Further, various additional steps may be added in light of the scope of the present invention.

The method 5100 may include various steps such as mentioned below, but, not limited to the ones as described. The method 5100, starts at step 5102 wherein the method 5102 scans the surrounding environment. Herein, the RADAR unit 3702 comprising: a transmitter for transmitting at least one radio signal to one or more objects in the surrounding; and a receiver for receiving the at least one radio signal returned from the one or more objects in the surrounding. The method 5102 may include, generating (at step 5104) a preliminary data of the surrounding environment. The preliminary data may include various small and large, stationary and mobile object information. Preliminary data may identify preliminary details about surrounding environment for example, where exactly are the objects present at what approximate direction and distance. Further, the method 5100 determines (at step 5106), if there is an object that may be marked as an object of interest. The object of interest may be an object that may pose a potential threat to the vehicle 3800. This object may be an animal behind a tree, a child behind a vehicle a vehicle that has been put to ignition at the very moment of scanning, a person sitting in a bus station, etc. Further, the method 5100 initiates (at step 5108) the at least second sensor 5002. The at least second sensor may be, as described earlier, a LiDAR, a thermal camera, or an ultrasound sensor. Such initiation helps in targeting the more resolution power of the second sensor 5002 to be targeted selectively to such part of the surrounding environment that may present a potential threat to the vehicle 3800. The at least second sensor 5002, obtain (at step 5110) supporting information about the object of interest. The supporting information may be information about size, edges, outline, actual classification of the object etc. Once the supporting information has been gathered, the method 5100 combines (at step 5112) preliminary and supporting information about the surrounding environment. The method 5100 generates (at step 5114) a 3-dimensional image of the surrounding image in order to provide a holistic and near natural image to the vehicle 3800.

The first sensor 3702 that is the RADAR unit 3702 and the at least one-second sensor may obtain data using different techniques. The second sensor may be equipped to obtain or provide data with more resolution and up to a very close distance to the vehicle 3800.

Figures 52, 53:
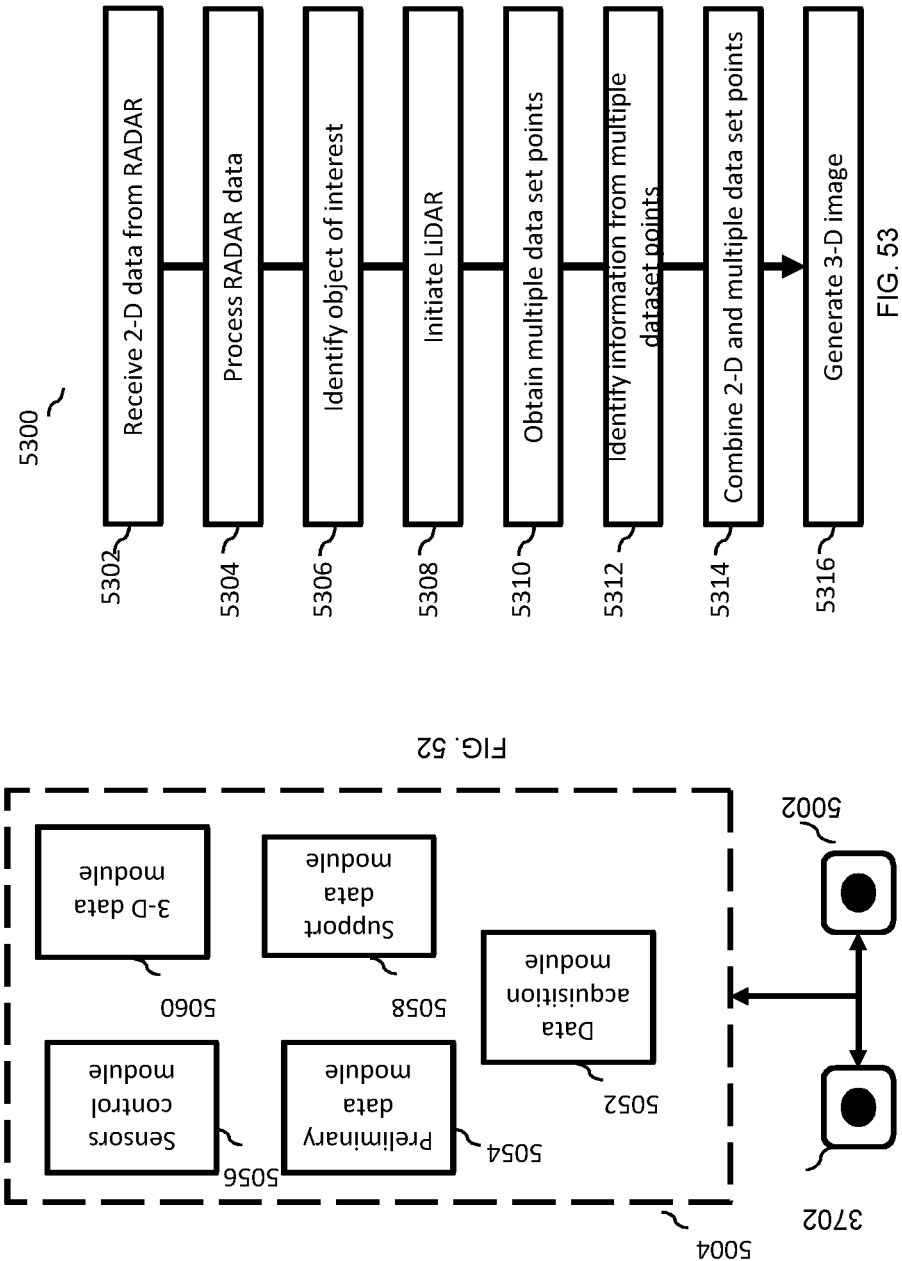
FIG. 52 illustrates a block diagram of a processor and its various internal components to perform detection of objects, in accordance with an embodiment of the invention.
FIG. 53 illustrates a flowchart for a method of identification of a potential threat object, in accordance with an embodiment of the invention.

FIG. 52, illustrates a block diagram of the processor 5004 and its various internal components to perform detection of objects, according to an embodiment of the invention. The processor 5004 includes (but not limited to) various modules as listed. The processor 5004 may include a data acquisition module 5052, a preliminary data module 5054, a sensor control module 5056, a support data module 5058 and a 3-d data module 5060.

The components of the processor 5004 may be hardware or software based. Further, the processor 5004 may include multiple microprocessors (as components) to perform different functions that may be coordinated with each other to perform a coordinated output.

The data acquisition module 5052 is configured to accept data from the first sensor 3702 and the at least one-second sensor 5002. The data acquisition module 5052 translates the data from sensors 3702 and 5002 to a format readable to the other parts of the processor 5004.

The sensor control module 5056 is configured to control the initiation, speed and data acquisition from the sensors 3702 and 5002.

The preliminary data from the first sensor or the RADAR unit 3702 is received by the preliminary data module 5054. The preliminary data module 5054 identifies if there is an object of interest that is present in the data. in a situation, an object of interest is determined, the preliminary data module 5054 forwards this information to the sensor control module 5056. The sensor control module 5056, initiates the at least one-second sensor 5002 to capture more data about the object of interest. By initiation, the sensor is basically activated that may be in off state before initiation or in a state wherein it may not be collecting data. However, in other embodiment of the invention, the sensor may be generally collecting information without focusing on a specific area of surrounding or a specific object. Data acquired by the at least one-second sensor 5002 is then translated in a format that may be appropriate to read by the support data module 5058. The support data module reads and generates more information about the object of interest. Both the preliminary data and the support data is also forwarded to the 3-dimensional data module to combine the two types of data and generate a holistic picture of the surrounding including all objects, road, pavement, etc.

FIG. 53, illustrates a method 5300 flowchart for identification of a potential threat object to the vehicle 3800 using the detection system 5000, in accordance with an embodiment of the invention. The method 5300 may include additional or lesser steps. The steps presented here need not be considered limiting to the invention.

The method 5300, at step 5302, receives 2-dimensional data captured using the RADAR unit 3702. Further, at step 5304, the RADAR data is processed for identifying the surrounding environment information and various objects in it. Further, at step 5306, the object of interest is identified by the method 5300. In an embodiment, there may be multiple objects of interests identified by the RADAR unit 3702. This information is used by the method 5300 to initiate, at step 5308, LiDAR sensor 5002 (the at least one-second sensor is interchangeably referred to as LiDAR sensor 5002). The LiDAR sensor 5002 obtains, at step 5310, multiple data set pints of the object of interest. At step 5312, the method identifies information from the multiple dataset points like edges, curves, etc. Further, at step 5314, the 2-dimensional data and the multiple data set points are combined and at step 5316, a 3-dimensional image of the object or objects of interest is generated.

FIG. 54, illustrates a block diagram displaying advantages of using selective use of the at least second sensor, in accordance with an embodiment of the invention. As mentioned, the at least one second sensor 5002. The RADAR unit 3702 may look all around the vehicle 3800 as represented by azimuth area 5402. So, the RADAR unit 3702 will sweep the entire azimuth area. Then in a scenario that the object of interest is identified, the LiDAR 5002 may be directed to that particular area 5404. Such selective scanning helps to reduce the computing cycle of azimuth area 5402 by approximately $\frac{1}{100}^{th}$ of a general scenario when LiDAR is sweeping the full azimuth itself. This happens because of the amounts of data reduced by the selective scanning use of the LiDAR 5002.

FIG. 55, illustrates a block diagram displaying advantages of using selective use of the at least second sensor, in accordance with an embodiment of the invention. The RADAR 3702 may sweep an entire elevation region 5406 initially for preliminary data. In a scenario that object of interest is determined to be within the preliminary data, the LiDAR sensor 5002 is then directed to obtain more information about the same area 5408 as shown in the figure. The selective scanning helps to reduce the computing cycle of azimuth area by approximately $\frac{1}{10}$ of a general scenario when LiDAR is sweeping the full elevation 5406 itself. This happens because of the amounts of data reduced by the selective scanning use of the LiDAR 5002.

Combining the azimuth area computing cycle saving and the elevation area computing cycle saving, the detection system 5000, as per the invention, is able to save $\frac{1}{1000}$ computing cycles. Hence the amount of data to be processed is lowered by a minimum of $\frac{1}{1000}$ of the data than from a situation when the full computation is performed by LiDAR itself.

Further, the redundant data also helps in providing a better data representation and surety of the data obtained. It may also decrease the amount of computing power required as large amounts of data generated by a full servicing LiDAR is also reduced significantly.

FIG. 56 illustrates a method 5600, for recognition of a living body by the RADAR 3702. The method 5600, (a step 5602), transmits RADAR signals to identify objects surrounding and gain knowledge of the environmental surroundings. The detection system 3700 may continuously vary the frequency of transmitted signals. Various frequency signals are transmitted in order to identify and obtain more information about the objects preliminarily identified by the detection system 3700.

Once objects are identified by the method, at step 5604, information about the electromagnetic characteristics of the material of the object is obtained. The information of the type of the material of the objects is determined by processing the returned RADAR signals. At step 5605, additional Radar information of objects is obtained. This additional Radar information may include information such as Doppler, micro-Doppler, velocity, size, shape, placement among other radar information types.

Further, at step 5606, the method 5600 determines whether the object is live or not. If the object, is determined to be not human or living body, the method 5600 is terminated. However, in case the object is identified to be living, the detection system 3700, marks the object as a point of interest object, at step 5608. As described earlier, the point of interest is an object classified to keep a track of. The priority of keeping the track of such an object is high as it may be a potential threat. Hence, the detection system 3700, continuously monitors all such point of interest objects.

FIG. 57, illustrates an exemplary method 5700 flow diagram for detecting and imaging objects for a vehicle, in accordance with an embodiment of the invention. The method 5700 corresponds to functional steps for implementation of an object detection system, such as the detection system 3700. The order in which method is performed is not construed as limiting for the present invention. Further, various additional steps may be added in light of the scope of the present invention.

The method 5700 may include various steps such as mentioned below, but, not limited to the ones as described. The method 5700, starts at step 5702 wherein the method 5702 scans the surrounding environment. Herein, the RADAR unit 3702 comprising: a transmitter for transmitting at least one radio signal to one or more objects in the surrounding; and a receiver for receiving the at least one radio signal returned from the one or more objects in the surrounding. The method 5702 may include, generating (at step 5704) a preliminary data of the surrounding environment. The preliminary data may include various small and large, stationary and mobile object information. Preliminary data may identify preliminary details about surrounding environment for example, where exactly are the objects present at what approximate direction and distance. Further, the method 5700 determines (at step 5706), if there is an object that may be marked as an object of interest. The object of interest may be an object that may pose a potential threat to the vehicle 3800. This object may be an animal behind a tree, a child behind a vehicle a vehicle that has been put to ignition at the very moment of scanning, a person sitting in a bus station, etc. Further, the method 5700 initiates (at step 5708) other sensors. The other sensors may be, as described earlier, a LiDAR, a thermal camera, or an ultrasound sensor. Such initiation helps in targeting the more resolution power of other sensors to be targeted selectively to such part of the surrounding environment that may present a potential threat to the vehicle 3800 and obtain more clear and redundant information about the object of interest. The other sensors, obtain (at step 5710) supporting information about the object of interest. The supporting information may be information about size, edges, outline, actual classification of the object etc. Once the supporting information has been gathered, the method 5700 combines (at step 5712) preliminary and supporting information about the surrounding environment. The method 5700 generates (at step 5714) a 3-dimensional image of the surrounding image in order to provide a holistic and near natural image to the vehicle 3800.

Figure 58:
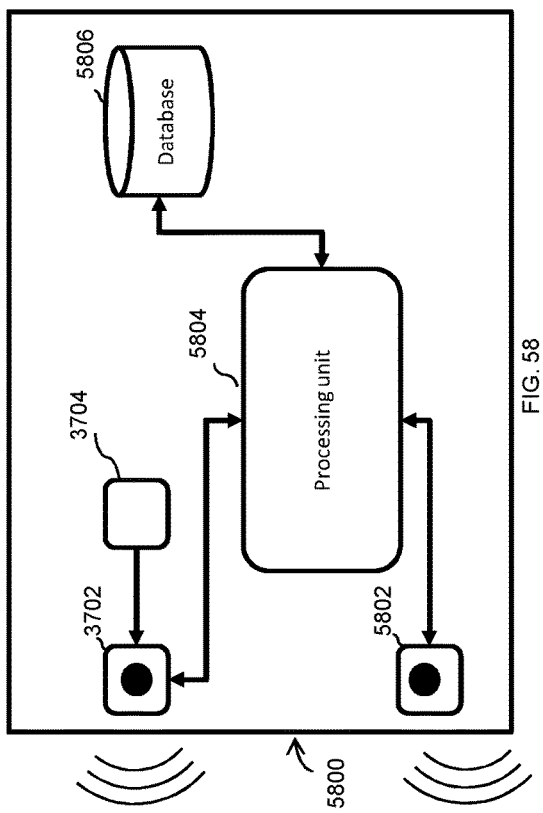
FIG. 58, illustrates a block diagram of a detection system for detecting surrounding environment, in accordance with an embodiment of the invention.

FIG. 58, illustrates a block diagram of a detection system 5800 for detecting surrounding environment, in accordance with an embodiment of the invention. The system 5800 is similar to the detection system 3700 as discussed in conjunction with FIG. 37.

The system 5800 includes, but not limited to a first sensor or the RADAR unit 3702, as has been described above in conjunction with FIG. 39, the ultra-low phase-noise frequency synthesizer 3704, a processor 5804, at least one-second sensor 5802, and a database 5806.

The RADAR unit 3702 may be configured for detecting the presence of one or more objects/targets in one or more directions by transmitting radio signals in the one or more directions. In an embodiment, the RADAR unit 3702 may be comprised of at least one of or combination of: a traditional RADAR system, a synthetic aperture RADAR, or different types of RADAR with different RADAR subsystems and antennas.

The at least one-second sensor 5800 may be a LiDAR, that emits light periodically to gather data about the surroundings. The function of the LiDAR has been discussed above in detail.

The ultra-low phase-noise frequency synthesizer 3704 (hereinafter may interchangeably be referred to as 'frequency synthesizer 3704') may be providing the needed carrier frequency, or a multiple or a fraction of the needed carrier (or up-conversion) frequency for the RADAR transmitter section. The ultra-low noise frequency synthesizer 3704 may also be providing the needed carrier (or down-conversion) frequency, or a multiple or a fraction of the needed carrier frequency for the RADAR receiver section. For some RADARs the transmit signal is used as the carrier frequency for the receive section, this does not alter the principle of this invention and is merely another form of implementation. The term "carrier" may be used interchangeably referring to an up-conversion or down-conversion signal.

The database 3706 may include instructions set having one or more specialized instructions. The specialized instructions may be executable by the processor 5004.

In an embodiment, the RADAR unit 3702 of the system 5800 may be placed in front of the vehicle 3800, or anywhere else in or on the vehicle 3800, to transmit the radio signals in various directions and further to receive the returned radio signals as returned from the object(s) (after hitting the object(s)).

Further, the specialized instruction on execution by the processor 5804 gathers information corresponding to the surroundings, the information is gathered based on the returned radio signal. The information gathered may include, but is not limited to, surrounding information of the object(s) such as road structure, traffic in front of those objects, traffic behavior, the response of the one or more objects based on the traffic behavior. Further, based on analysis of these, the system 5800 may mark the one or more objects identified as an object of interest. The object of interest may be a potential threat to the vehicle 3800. The processor 5804 decides and performs pre-planning corresponding to probable moves that may be required in near future. Such intelligent planning of the system 5800 may determine probable events on the road. This further ensures safety on the road. Further, the information corresponding to the objects and surrounding may be stored in the database 5806 for future reference and planning. Furthermore, the information may be provided to an output device (not shown) such as a display. The information may also be transferred to a Database outside of the autonomous vehicle such as, but not limited to, a cloud-based database.

Figure 59:
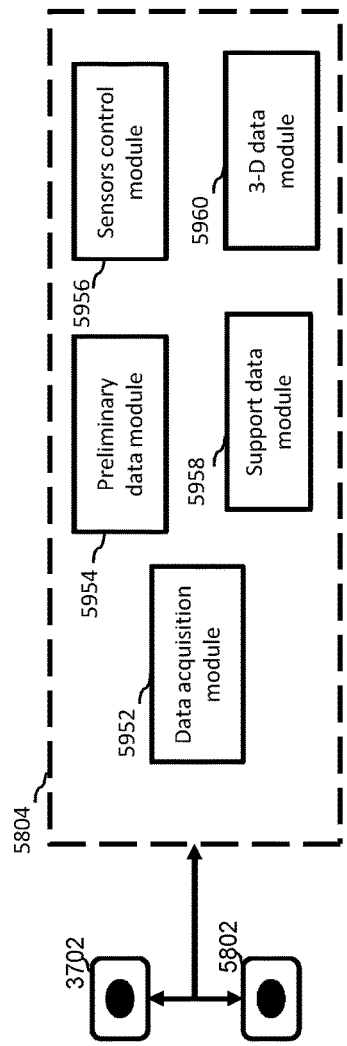
FIG. 59, illustrates a block diagram of the processor and its various internal components to perform detection of objects, according to an embodiment of the invention.

FIG. 59, illustrates a block diagram of the processor 5804 and its various internal components to perform detection of objects, according to an embodiment of the invention. The processor 5804 includes (but not limited to) various modules as listed. The processor 5804 may include a data acquisition module 5952, a preliminary data module 5954, a sensor control module 5956, a support data module 5958 and a 3-d data module 5960.

The components of the processor 5804 may be hardware or software based. Further, the processor 5804 may include multiple microprocessors (as components) to perform different functions that may be coordinated with each other to perform a coordinated output.

The data acquisition module 5952 is configured to accept data from the first sensor 3702 and the at least one-second sensor 5802. The data acquisition module 5052 translates the data from sensors 3702 and 5802 to a format readable to the other parts of the processor 5804.

The sensor control module 5956 is configured to control the initiation, speed and data acquisition from the sensors 3702 and 5802.

The preliminary data from the first sensor or the RADAR unit 3702 is received by the preliminary data module 5954. The preliminary data module 5954 identifies if the identified object is a human body by comparing the electromagnetic characteristics of the surface of the human body present in the returned data. If the object identified is determined to be human, the preliminary data module 5954 marks it as an object of interest and forwards this information to the sensor control module 5956. The sensor control module 5956, initiates the at least one-second sensor 5802 to capture more data about the object of interest and verify the data obtained by preliminary data module 5954. By initiation, the sensor is basically activated that may be in off state before initiation or in a state wherein it may not be collecting data. However, in other embodiment of the invention, the sensor may be generally collecting information without focusing on a specific area of surrounding or a specific object. Data acquired by the at least one-second sensor 5802 is then translated in a format that may be appropriate to read by the support data module 5958. The support data module reads and generates more information about the object of interest. Both the preliminary data and the support data is also forwarded to the 3-dimensional data module to combine, compare and verify the presence of a human body from the two types of data.

While the invention has been described in detail, modifications within the spirit and scope of the invention will be readily apparent to those of skill in the art. Such modifications are also to be considered as part of the present disclosure. In view of the foregoing discussion, relevant knowledge in the art and references or information discussed above in connection with the Background, which are all incorporated herein by reference, further description is deemed unnecessary. In addition, it should be understood that aspects of the invention and portions of various embodiments may be combined or interchanged either in whole or in part. Furthermore, those of ordinary skill in the art will appreciate that the foregoing description is by way of example only and is not intended to limit the invention.

The foregoing discussion of the present disclosure has been presented for purposes of illustration and description. It is not intended to limit the present disclosure to the form or forms disclosed herein. In the foregoing Detailed Description, for example, various features of the present disclosure are grouped together in one or more embodiments, configurations, or aspects for the purpose of streamlining the disclosure. The features of the embodiments, configurations, or aspects may be combined in alternate embodiments, configurations, or aspects other than those discussed above. This method of disclosure is not to be interpreted as reflecting an intention the present disclosure requires more features than are expressly recited in each claim. Rather, as the following claims reflect, inventive aspects lie in less than all features of a single foregoing disclosed embodiment, configuration, or aspect. Thus, the following claims are hereby incorporated into this Detailed Description, with each claim standing on its own as a separate embodiment of the present disclosure.

Moreover, though the description of the present disclosure has included description of one or more embodiments, configurations, or aspects and certain variations and modifications, other variations, combinations, and modifications are within the scope of the present disclosure, e.g., as may be within the skill and knowledge of those in the art, after understanding the present disclosure. It is intended to obtain rights which include alternative embodiments, configurations, or aspects to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate a patentable subject matter.

We claim:

1. A system for detecting the surrounding environment of a vehicle comprising:
   at least first sensor, configured to obtain data, the at least first sensor comprising
   A) a transmitter for transmitting at least one radio signal to the one or more objects within the surrounding environment;
   B) a receiver for receiving the at least one radio signal returned from the one or more objects;
   C) at least one ultra-low phase noise frequency synthesizer configured to determine phase noise and quality of the transmitted and the received at least one radio signal, wherein the at least one ultra-low phase noise frequency synthesizer comprises:
   1) at least one sampling Phase Locked Loop (PLL), wherein the at least one sampling PLL comprises:
      a. at least one reference clock configured to generate at least one first clock signal of at least one first clock frequency;
      b. at least one sampling phase detector configured to receive the at least one first clock signal and a single reference frequency to generate at least one first analog control voltage;
      c. a Digital Phase/Frequency detector configured to receive the at least one first clock signal and a single reference frequency to generate at least a second analog control voltage; and
      d. at least one reference Voltage Controlled Oscillator (VCO) configured to receive the at least one analog control voltage to generate the single reference frequency;
   2) at least one main PLL, wherein the at least one main PLL comprises:
      a. at least one first fixed frequency divider configured to receive the at least one reference frequency and to divide the at least one reference frequency by a first predefined factor to generate at least one Direct Digital Synthesizer (DDS) clock signal;

b. at least one high frequency DDS configured to receive the at least one DDS clock signal and to generate at least one second clock signal of at least one second clock frequency;
c. at least one high frequency Digital Phase/Frequency detector configured to receive and compare the at least one second clock frequency and at least one feedback frequency to generate at least one second analog control voltage and at least one digital control voltage;
d. at least one main VCO configured to receive the at least one first analog control voltage or the at least one second analog control voltage and generate at least one output signal of at least one output frequency, wherein the at least one digital control voltage controls which of the at least one first analog control voltage or the at least one second analog control voltage is received by the at least one main VCO;
e. at least one down convert mixer configured to mix the at least one output frequency and the reference frequency to generate at least one intermediate frequency; and
f. at least one second fixed frequency divider configured to receive and divide the at least one intermediate frequency by a second predefined factor to generate the at least one feedback frequency;
a processing unit, coupled to the at least first sensor configured to;
D) identify an object of interest from the data; and
E) classify or recognize the type of the object of interest by analyzing the data.

2. The system of claim 1, wherein the at least first sensor is a RADAR sensor.

3. The system of claim 1, wherein the data includes information about the electromagnetic properties and characteristics about the object of interest or the surroundings of the vehicle.

4. The system of claim 1, wherein the data includes shape, silhouette, doppler or micro doppler information.

5. The system of claim 1, wherein the data includes depth, dimensions, direction, height, distance and placement of the object of interest with respect to the vehicle.

6. The system of claim 1, wherein the classification type of the object of interest includes living or non-living thing, stationary or moving object, animal or human, standing or mobile human, metal, wood, or concrete.

7. A system for detecting the surrounding environment of a vehicle comprising:
at least first sensor, configured to obtain data, the at least first sensor comprising;
A) a transmitter for transmitting at least one radio signal to the one or more objects within the surrounding environment;
B) a receiver for receiving the at least one radio signal returned from the one or more objects;
C) at least one ultra-low phase noise frequency synthesizer configured to determine phase noise and quality of the transmitted and the received at least one radio signal, wherein the at least one ultra-low phase noise frequency synthesizer comprises:
1) at least one sampling Phase Locked Loop (PLL), wherein the at least one sampling PLL comprises:
a. at least one reference clock configured to generate at least one first clock signal of at least one first clock frequency;
b. at least one sampling phase detector configured to receive the at least one first clock signal and a single reference frequency to generate at least one first analog control voltage;
c. a Digital Phase/Frequency detector configured to receive the at least one first clock signal and a single reference frequency to generate at least a second analog control voltage; and
d. at least one reference Voltage Controlled Oscillator (VCO) configured to receive the at least one analog control voltage to generate the single reference frequency;
2) at least one main PLL, wherein the at least one main PLL comprises:
a. at least one Fractional-N synthesizer, wherein the at least one Fractional-N synthesizer comprises:
i. at least one high frequency Digital Phase/Frequency detector configured to receive and compare the at least one clock frequency and at least one feedback frequency to generate the at least one second analog control voltage and at least one digital control voltage; and
ii. at least one variable frequency divider configured to divide at least one intermediate signal by a predetermined factor N to generate at least one feedback signal of the at least one feedback frequency;
a processing unit, coupled to the at least first sensor configured to;
D) identify an object of interest from the data; and
E) classify and recognize the type of the object of interest by analyzing the data.

8. The system of claim 7, wherein the sensor is a RADAR sensor.

9. The system of claim 7, wherein the data includes information about the electromagnetic properties and characteristics about the object of interest or the surroundings of the vehicle.

10. The system of claim 7, wherein the data includes shape, silhouette, doppler or micro doppler information.

11. The system of claim 7, wherein the data includes depth, dimensions, direction, height, distance and placement of the object of interest with respect to the vehicle.

12. The system of claim 7, wherein the classification type of the object of interest includes living or non-living thing, stationary or moving object, animal or human, standing or mobile human, metal or wood.

13. A system for detecting the surrounding environment of a vehicle comprising:
at least first sensor, configured to obtain data, the at least first sensor comprising
A) a transmitter for transmitting at least one radio signal to the one or more objects within the surrounding environment;
B) a receiver for receiving the at least one radio signal returned from the one or more objects;
C) at least one ultra-low phase noise frequency synthesizer configured to determine phase noise and quality of the transmitted and the received at least one radio signal, wherein the at least one ultra-low phase noise frequency synthesizer comprises:
1) at least one sampling Phase Locked Loop (PLL), wherein the at least one sampling PLL comprises:
a. at least one reference clock configured to generate at least one first clock signal of at least one first clock frequency;

b. at least one sampling phase detector configured to receive the at least one first clock signal and a single reference frequency to generate at least one first analog control voltage;

c. a Digital Phase/Frequency detector configured to receive the at least one first clock signal and a single reference frequency to generate at least a second analog control voltage; and d. at least one reference Voltage Controlled Oscillator (VCO) configured to receive the at least one analog control voltage to generate the single reference frequency;

a processing unit, coupled to the at least first sensor configured to;

D) identify an object of interest from the data; and

E) classify or recognize the type of the object of interest by analyzing the data.

14. The system of claim 13, wherein the sensor is a RADAR sensor.

15. The system of claim 13, wherein the data includes information about the electromagnetic properties and characteristics about the object of interest or the surroundings of the vehicle.

16. The system of claim 13, wherein the data includes shape, silhouette, doppler or micro doppler information.

17. The system of claim 13, wherein the data includes depth, dimensions, direction, height, distance and placement of the object of interest with respect to the vehicle.

18. The system of claim 13, wherein the classification type of the object of interest includes living or non-living thing, stationary or moving object, animal or human, standing or mobile human, metal, wood, or concrete.

19. A method for detecting the surrounding environment of a vehicle comprising:

at least first sensor, configured to obtain a data, the at least first sensor comprising A) a transmitter for transmitting at least one radio signal to the one or more objects within the surrounding environment;

B) a receiver for receiving the at least one radio signal returned from the one or more objects;

C) at least one ultra-low phase noise frequency synthesizer configured to determine phase noise and quality of the transmitted and the received at least one radio signal, wherein the at least one ultra-low phase noise frequency synthesizer comprises:

1) at least one sampling Phase Locked Loop (PLL), wherein the at least one sampling PLL comprises:

a. at least one reference clock configured to generate at least one first clock signal of at least one first clock frequency;

b. at least one sampling phase detector configured to receive the at least one first clock signal and a single reference frequency to generate at least one first analog control voltage;

c. a Digital Phase/Frequency detector configured to receive the at least one first clock signal and a single reference frequency to generate at least a second analog control voltage; and d. at least one reference Voltage Controlled Oscillator (VCO) configured to receive the at least one analog control voltage to generate the single reference frequency;

2) at least one main PLL, wherein the at least one main PLL comprises:

a. at least one first fixed frequency divider configured to receive the at least one reference frequency and to divide the at least one reference frequency by a first predefined factor to generate at least one Direct Digital Synthesizer (DDS) clock signal;

b. at least one high frequency DDS configured to receive the at least one DDS clock signal and to generate at least one second clock signal of at least one second clock frequency;

c. at least one high frequency Digital Phase/Frequency detector configured to receive and compare the at least one second clock frequency and at least one feedback frequency to generate at least one second analog control voltage and at least one digital control voltage;

d. at least one main VCO configured to receive the at least one first analog control voltage or the at least one second analog control voltage and generate at least one output signal of at least one output frequency, wherein the at least one digital control voltage controls which of the at least one first analog control voltage or the at least one second analog control voltage is received by the at least one main VCO;

e. at least one down convert mixer configured to mix the at least one output frequency and the reference frequency to generate at least one intermediate frequency; and f. at least one second fixed frequency divider configured to receive and divide the at least one intermediate frequency by a second predefined factor to generate the at least one feedback frequency;

a processing unit, coupled to the at least first sensor configured to;

D) identifying, by a processing unit coupled to the at least first sensor, an object of interest from the data; and E) classifying, by the processing module, the type of the object of interest type by analyzing the data.

20. The method of claim 19, further comprising recognizing the object on interest after classifying, wherein the classification of the object of interest includes living or non-living thing, stationary or moving object, animal or human, standing or mobile human, metallic, wooden, or concrete objects.

* * * * *